US011056651B2

(12) United States Patent
Kim

(10) Patent No.: US 11,056,651 B2
(45) Date of Patent: Jul. 6, 2021

(54) ORGANIC LIGHT-EMITTING DEVICE

(71) Applicant: Samsung Display Co., Ltd., Yongin-si (KR)

(72) Inventor: Donghyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 478 days.

(21) Appl. No.: 15/055,231

(22) Filed: Feb. 26, 2016

(65) Prior Publication Data

US 2017/0047521 A1 Feb. 16, 2017

(30) Foreign Application Priority Data

Aug. 11, 2015 (KR) ........................ 10-2015-0113369

(51) Int. Cl.
*H01L 51/00* (2006.01)
*C09K 11/02* (2006.01)
*H01L 51/50* (2006.01)

(52) U.S. Cl.
CPC ........ *H01L 51/0058* (2013.01); *C09K 11/025* (2013.01); *H01L 51/0053* (2013.01);
(Continued)

(58) Field of Classification Search
CPC ............. H01L 51/0058; H01L 51/0053; H01L 51/0077; H01L 51/0067; H01L 51/5076;
(Continued)

(56) References Cited

U.S. PATENT DOCUMENTS

2009/0284134 A1 11/2009 Iida et al.
2010/0327270 A1 12/2010 Buesing et al.
(Continued)

FOREIGN PATENT DOCUMENTS

KR 10-2008-0074103 A 8/2008
KR 10-2010-0110895 A 10/2010
(Continued)

*Primary Examiner* — Alexander C Kollias
(74) *Attorney, Agent, or Firm* — Lewis Roca Rothgerber Christie LLP

(57) ABSTRACT

An organic light-emitting device having high efficiency and improved lifespan is provided. The organic light-emitting device of the present disclosure includes: a first electrode; a second electrode facing the first electrode; an emission layer between the first electrode and the second electrode, the emission layer including a first compound; and an electron transport region between the emission layer and the second electrode, the electron transport region including an electron transport layer including a second compound and an electron control layer including a third compound, wherein the electron control layer is between the emission layer and the electron transport layer. The first compound may be represented by Formula 1, the second compound may be represented by Formula 2, and the third compound may be selected from compounds represented by Formula 1 and/or Formula 2:

Formula 1

(Continued)

-continued

Formula 2

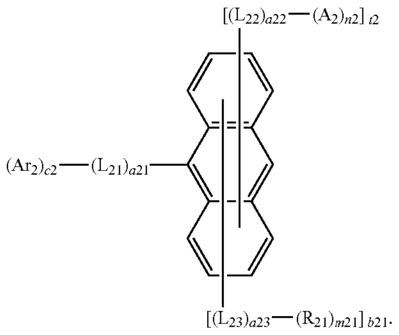

17 Claims, 1 Drawing Sheet

(52) U.S. Cl.
CPC ...... *H01L 51/0067* (2013.01); *H01L 51/0077* (2013.01); *H01L 51/5012* (2013.01); *H01L 51/5072* (2013.01); *H01L 51/5076* (2013.01); *H01L 51/5092* (2013.01)

(58) Field of Classification Search
CPC ............. H01L 51/5092; H01L 51/5072; H01L 51/5012; H01L 51/0072; H01L 51/0052; H01L 51/508; H01L 51/0071; H01L 51/0073; C09K 11/025
See application file for complete search history.

(56) References Cited

U.S. PATENT DOCUMENTS

| | | | | |
|---|---|---|---|---|
| 2011/0068683 | A1 * | 3/2011 | Kawamura | C07C 13/465 313/504 |
| 2013/0032764 | A1 * | 2/2013 | Buesing | C07D 239/26 252/500 |
| 2013/0306955 | A1 | 11/2013 | Mizutani et al. | |
| 2014/0014940 | A1 | 1/2014 | Pflumm et al. | |
| 2014/0103319 | A1 | 4/2014 | Kawamura et al. | |

FOREIGN PATENT DOCUMENTS

| | | | |
|---|---|---|---|
| KR | 10-2014-0015319 | A | 2/2014 |
| KR | 10-2014-0027218 | A | 3/2014 |
| KR | 10-2014-0056245 | A | 5/2014 |

* cited by examiner

10
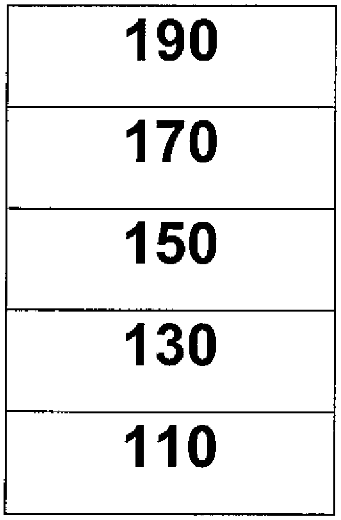

ORGANIC LIGHT-EMITTING DEVICE

CROSS-REFERENCE TO RELATED APPLICATIONS

This application claims priority to and the benefit of Korean Patent Application No. 10-2015-0113369, filed on Aug. 11, 2015, in the Korean Intellectual Property Office, the entire content of which is incorporated herein by reference.

BACKGROUND

1. Field

One or more aspects of example embodiments of the present disclosure relate to organic light-emitting devices.

2. Description of the Related Art

Organic light-emitting devices (OLEDs) are self-emitting devices that have beneficial features such as wide viewing angles, excellent contrast, quick response, high luminance, and excellent driving voltage characteristics, and can provide multicolored images.

An organic light-emitting device may have a structure in which a first electrode, a hole transport region, an emission layer, an electron transport region, and a second electrode are sequentially positioned on a substrate. Holes injected from the first electrode may move to the emission layer via the hole transport region, and electrons injected from the second electrode may move to the emission layer via the electron transport region. Charge carriers (e.g., the holes and the electrons) may then recombine in the emission layer to generate excitons. When the excitons drop (e.g., transition or decay) from an excited state to a ground state, light is emitted.

SUMMARY

One or more aspects of example embodiments are directed toward an organic light-emitting device having high efficiency and a long lifespan.

Additional aspects will be set forth in part in the description which follows and, in part, will be apparent from the description, or may be learned by practice of the presented embodiments.

One or more aspects of example embodiments provide an organic light-emitting device including: a first electrode; a second electrode facing the first electrode;

an emission layer between the first electrode and the second electrode, the emission layer including a first compound; and an electron transport region between the emission layer and the second electrode, the electron transport region including an electron transport layer including a second compound and an electron control layer including a third compound, wherein the electron control layer is between the emission layer and the electron transport layer, the first compound may be selected from compounds represented by Formula 1, the second compound may be selected from compounds represented by Formula 2, and the third compound may be selected from the compounds represented by Formula 1 and the compounds represented by Formula 2:

Formula 1

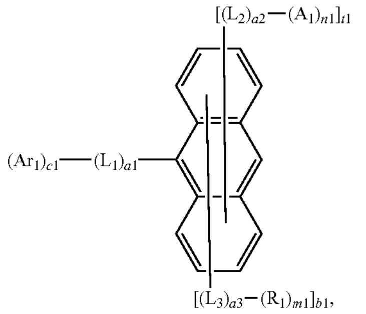

Formula 2

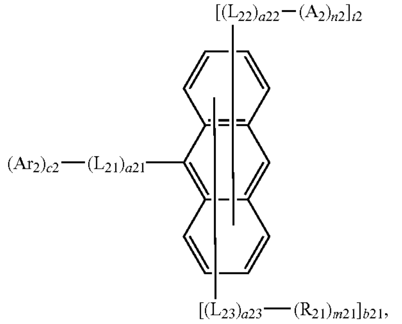

Formula 1-1

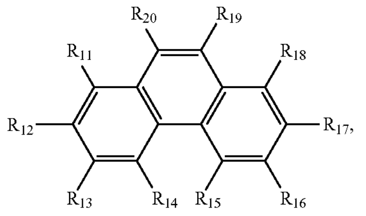

Formula 2-1

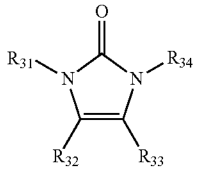

Formula 2-2

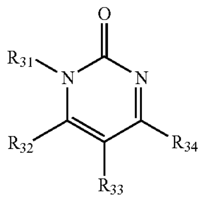

Formula 2-3

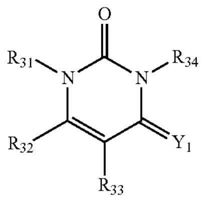

-continued

Formula 2-4

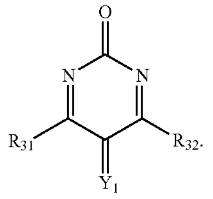

In Formulae 1, 1-1, 2, and 2-1 to 2-4, $A_1$ may be selected from monovalent groups derived from a compound represented by Formula 1-1; n1 may be 1, 2, or 3; and each $A_1$ moiety may be independently selected when n1 is 2 or greater, $A_2$ may be selected from monovalent groups derived from the compounds represented by Formulae 2-1 to 2-4; n2 may be selected from 1, 2 and 3; and each $A_2$ moiety may be independently selected when n2 is 2 or greater, $L_1$ to $L_3$ and $L_{21}$ to $L_{23}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a3 and a21 to a23 may each independently be selected from 0, 1, 2, and 3; each $L_1$ moiety may be independently selected when a1 is 2 or greater; each $L_2$ moiety may be independently selected when a2 is 2 or greater; each $L_3$ moiety may be independently selected when a3 is 2 or greater; each $L_{21}$ moiety may be independently selected when a21 is 2 or greater; each $L_{22}$ moiety may be independently selected when a22 is 2 or greater; and each $L_{23}$ moiety may be independently selected when a23 is 2 or greater, $Ar_1$ and $Ar_2$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, c1 and c2 may each independently be selected from 1, 2, and 3; each $Ar_1$ moiety may be independently selected when c1 is 2 or greater; and each $Ar_2$ moiety may be independently selected when c2 is 2 or greater, $Y_1$ may be selected from $N(R_{41})$ and $C(R_{42})(R_{43})$, and $R_1$, $R_{11}$ to $R_{20}$, $R_{21}$, $R_{31}$ to $R_{34}$, and $R_{41}$ to $R_{43}$ may each independently be selected from hydrogen, deuterium, —F, —Cl, —Br, —I, a hydroxyl group, a cyano group, a nitro group, an amino group, an am idino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —$Si(Q_1)(Q_2)(Q_3)$, in Formula 2-1 and 2-2, at least two selected from $R_{31}$ to $R_{34}$ may be optionally linked (e.g., coupled) to each other to form a substituted or unsubstituted $C_5$-$C_{30}$ carbocyclic group and/or a substituted or unsubstituted $C_2$-$C_{30}$ heterocyclic group, in Formula 2-3, at least two selected from $R_{31}$ to $R_{34}$ and $R_{41}$ to $R_{43}$ may be optionally linked (e.g., coupled) to each other to form a substituted or unsubstituted $C_5$-$C_{30}$ carbocyclic group and/or a substituted or unsubstituted $C_2$-$C_{30}$ heterocyclic group, in Formula 2-4, at least two selected from $R_{31}$, $R_{32}$, and $R_{41}$ to $R_{43}$ may be optionally linked (e.g., coupled) to each other to form a substituted or unsubstituted $C_5$-$C_{30}$ carbocyclic group and/or a substituted or unsubstituted $C_2$-$C_{30}$ heterocyclic group, m1 and m21 may each independently be selected from 0, 1, 2, and 3; each $R_1$ moiety may be independently selected when m1 is 2 or greater; and each $R_{21}$ moiety may be independently selected when m21 is 2 or greater, b1 and b21 may each independently be an integer selected from 0 to 8, t1 and t2 may each independently be selected from 1, 2, and 3, and at least one substituent of the substituted $C_5$-$C_{30}$ carbocyclic group, the substituted $C_2$-$C_{30}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, a substituted divalent non-aromatic condensed polycyclic group, a substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$B(Q_{14})(Q_{16})$, and —$N(Q_{16})(Q_{17})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$B(Q_{24})(Q_{25})$, and —$N(Q_{26})(Q_{27})$, and —$Si(Q_{31})(Q_{32})(Q_{33})$, —$B(Q_{34})(Q_{35})$, and —$N(Q_{36})(Q_{37})$, wherein $Q_1$ to $Q_3$, $Q_{11}$ to $Q_{17}$, $Q_{21}$ to $Q_{27}$ and $Q_{31}$ to $Q_{37}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWINGS

These and/or other aspects will become apparent and more readily appreciated from the following description of the example embodiments, taken in conjunction with the accompanying drawing, which is a schematic view illustrating a structure of an organic light-emitting device according to one or more embodiments of the present disclosure.

DETAILED DESCRIPTION

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the drawings, to explain aspects of the present description. As used herein, the term "and/or" includes any and all combinations of one or more of the associated listed items. Expressions such as "at least one of", "one of", "at least one selected from", and "one selected from", when preceding a list of elements, modify the entire list of elements and do not modify the individual elements of the list.

The thicknesses of layers, films, panels, regions, etc., may be exaggerated in the drawings for clarity. It will be understood that when an element such as a layer, film, region, or substrate is referred to as being "on" another element, it can be directly on the other element or intervening element(s) may also be present. In contrast, when an element is referred to as being "directly on" another element, no intervening elements are present.

According to an embodiment of the present disclosure, an organic light-emitting device includes: a first electrode; a second electrode facing the first electrode; an emission layer between the first electrode and the second electrode; and an electron transport region between the emission layer and the second electrode, the electron transport region including an electron transport layer and an electron control layer that is between the emission layer and the electron transport layer, wherein the first electrode may be an anode, and the second electrode may be a cathode, the emission layer may include a first compound, the electron transport layer may include a second compound, and the electron control layer may include a third compound, the first compound may be selected from compounds represented by Formula 1, the second compound may be selected from compounds represented by Formula 2, and the third compound may be selected from the compounds represented by Formula 1 and the compounds represented by Formula 2:

Formula 1

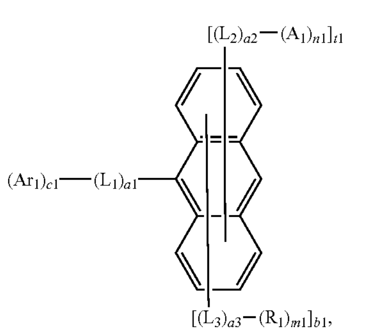

-continued

Formula 2

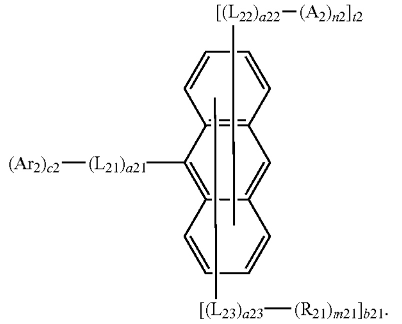

In Formulae 1 and 2, $A_1$ may be selected from monovalent groups derived from compounds represented by Formula 1-1, and $A_2$ may be selected from monovalent groups derived from compounds represented by Formulae 2-1 to 2-4:

Formula 1-1

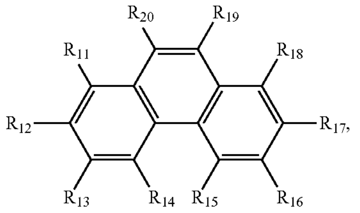

Formula 2-1

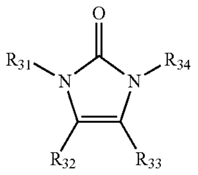

Formula 2-2

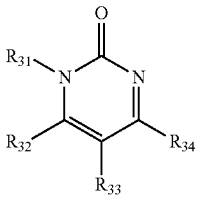

Formula 2-3

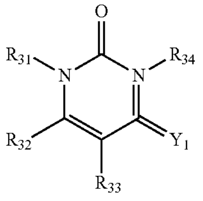

Formula 2-4

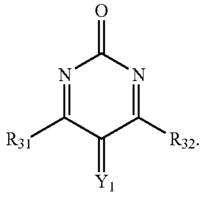

In Formulae 1 and 2, n1 and n2 may each independently be selected from 1, 2, and 3, wherein each $A_1$ moiety may be independently selected when n1 (which indicates the number of $A_1$s) is 2 or greater, and each $A_2$ moiety may be independently selected when n2 (which indicates the number of $A_2$s) is 2 or greater.

In Formulae 1, 1-1, 2, and Formulae 2-1 to 2-4, $Y_1$ may be selected from $N(R_{41})$ and $C(R_{42})(R_{43})$, and $R_1$, $R_{11}$ to $R_{20}$, $R_{21}$, $R_{31}$ to $R_{34}$, and $R_{41}$ to $R_{43}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and $—Si(Q_1)(Q_2)(Q_3)$, wherein $Q_1$ to $Q_3$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In Formulae 2-1 and 2-2, at least two selected from $R_{31}$ to $R_{34}$ may be linked (e.g., coupled) to each other to form a substituted or unsubstituted $C_5$-$C_{30}$ carbocyclic group or a substituted or unsubstituted $C_2$-$C_{30}$ heterocyclic group.

In Formula 2-3, at least two selected from $R_{31}$ to $R_{34}$, and $R_{41}$ to $R_{43}$ may be linked (e.g., coupled) to each other to form a substituted or unsubstituted $C_5$-$C_{30}$ carbocyclic group or a substituted or unsubstituted $C_2$-$C_{30}$ heterocyclic group.

In Formula 2-4, at least two selected from $R_{31}$, $R_{32}$, and $R_{41}$ to $R_{43}$ may be linked (e.g., coupled) to each other to form a substituted or unsubstituted $C_5$-$C_{30}$ carbocyclic group or a substituted or unsubstituted $C_2$-$C_{30}$ heterocyclic group.

In some embodiments, in Formula 1, $A_1$ may be selected from groups represented by Formulae 1-1(1) to 1-1(5), but embodiments of the present disclosure are not limited thereto.

Formula 1-1(1)

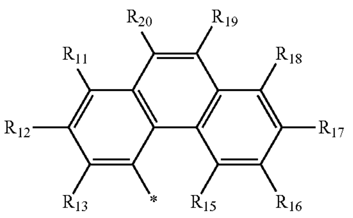

-continued

Formula 1-1(2)

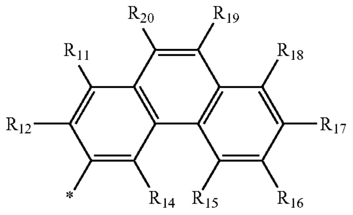

Formula 1-1(3)

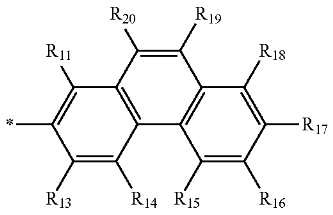

Formula 1-1(4)

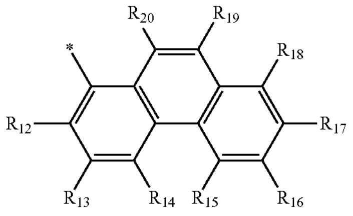

Formula 1-1(5)

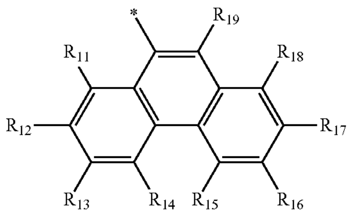

In Formulae 1-1(1) to 1-1(5), $R_{11}$ to $R_{20}$ may be the same as described earlier herein, and * may be a binding site with an adjacent atom.

For example, in Formula 1, $A_1$ may be selected from the groups represented by Formulae 1-1(1) to 1-1(5).

In some embodiments, in Formula 2, $A_2$ may be selected from monovalent groups derived from the compounds represented by Formulae 2-1-1 to 2-1-12, Formulae 2-2-1 to 2-2-3, Formulae 2-3-1 to 2-3-9, and Formula 2-4-1, but embodiments of the present disclosure are not limited thereto:

Formula 2-1-1

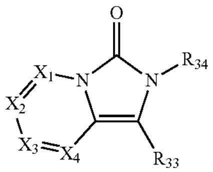

Formula 2-1-2

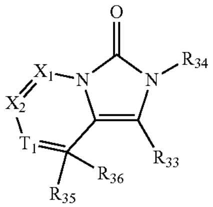

-continued

Formula 2-1-3

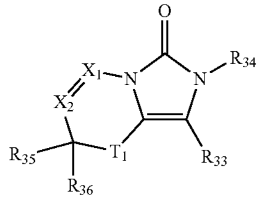

Formula 2-1-4

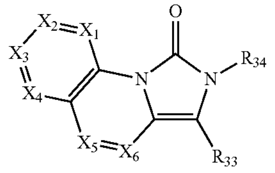

Formula 2-1-5

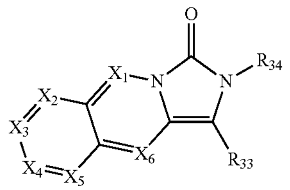

Formula 2-1-6

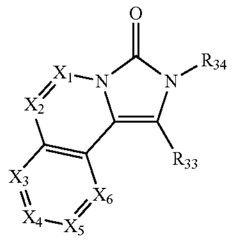

Formula 2-1-7

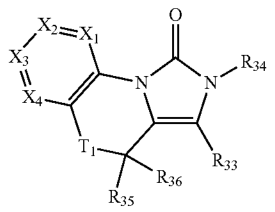

Formula 2-1-8

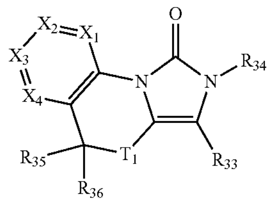

Formula 2-1-9

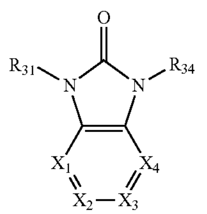

-continued
Formula 2-1-10
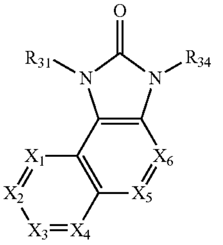
Formula 2-1-11
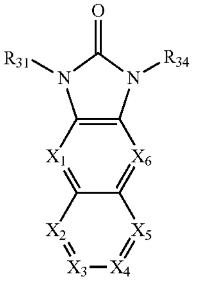
Formula 2-1-12
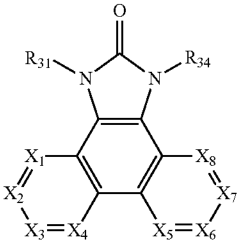
Formula 2-2-1
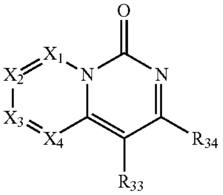
Formula 2-2-2
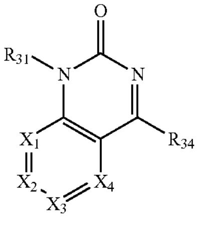
Formula 2-2-3
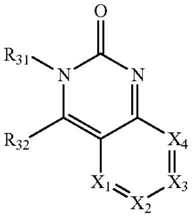
-continued
Formula 2-3-1
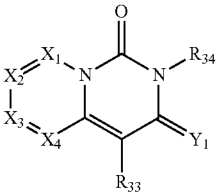
Formula 2-3-2
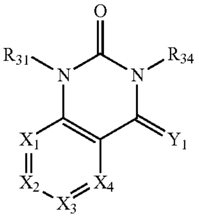
Formula 2-3-3
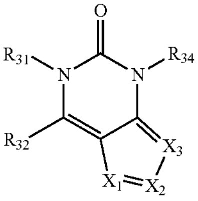
Formula 2-3-4
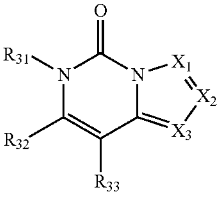
Formula 2-3-5
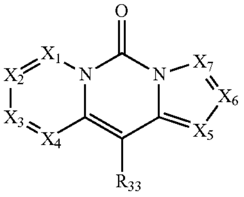
Formula 2-3-6
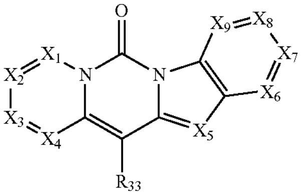
Formula 2-3-7
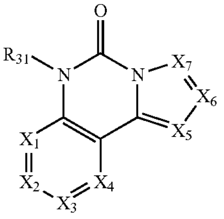

-continued

Formula 2-3-8

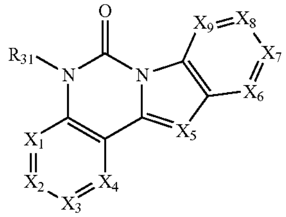

Formula 2-3-9

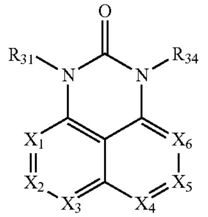

Formula 2-4-1

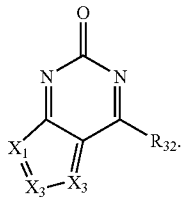

In Formulae 2-1-1 to 2-1-12, Formulae 2-2-1 to 2-2-3, Formulae 2-3-1 to 2-3-9, and Formula 2-4-1, $T_1$ may be selected from oxygen (O) and (S), $X_1$ may be selected from nitrogen (N) and $C(R_{51})$; $X_2$ may be selected from N and $C(R_{52})$; $X_3$ may be selected from N and $C(R_{53})$, $X_4$ may be selected from and $C(R_{54})$; $X_5$ may be selected from N and $C(R_{55})$, $X_6$ may be selected from N and $C(R_{56})$, $X_7$ may be selected from N and $C(R_{57})$; $X_8$ may be selected from N and $C(R_{58})$; $X_9$ may be selected from N and $C(R_{59})$, $R_{31}$ to $R_{36}$ and $R_{51}$ to $R_{59}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and $—Si(Q_1)(Q_2)(Q_3)$, wherein $Q_1$ to $Q_3$ may be the same as described earlier herein, and at least two selected from $R_{31}$ to $R_{36}$ and $R_{51}$ to $R_{59}$ may be optionally linked (e.g., coupled) to each other to form a substituted or unsubstituted $C_5$-$C_{30}$ carbocyclic group, or a substituted or unsubstituted $C_2$-$C_{30}$ heterocyclic group.

For example, in Formula 2, $A_2$ may be selected from monovalent groups derived from the compounds represented by Formulae 2-1-7, 2-1-9, 2-3-8, 2-3-9, and 2-4-1:

Formula 2-1-7

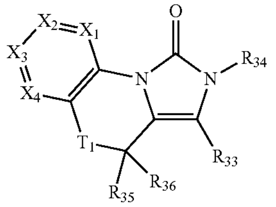

Formula 2-1-9

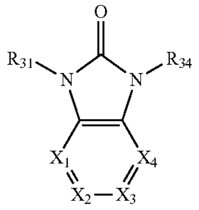

Formula 2-3-8

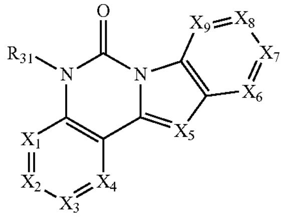

Formula 2-3-9

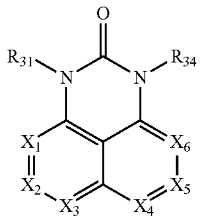

Formula 2-4-1

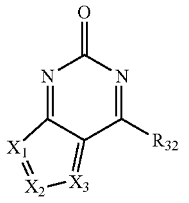

In Formulae 2-1-7, 2-1-9, 2-3-8, 2-3-9, and 2-4-1, $T_1$, $X_1$ to $X_9$, $R_{31}$ to $R_{36}$, and $R_{51}$ to $R_{59}$ may be the same as described earlier herein.

In some embodiments, in Formula 2, $A_2$ may be selected from monovalent groups derived from the compounds represented by Formulae 2-1A to 2-1L, Formulae 2-2A to 2-2C, Formulae 2-3A to 2-3P, and Formulae 2-4A to 2-4F:

Formul 2-1A

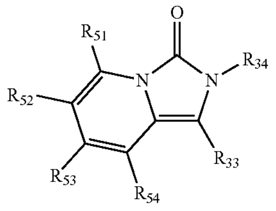

-continued
Formula 2-1B
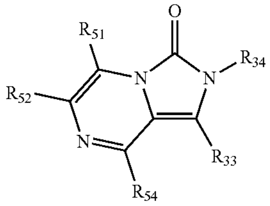
Formula 2-1C
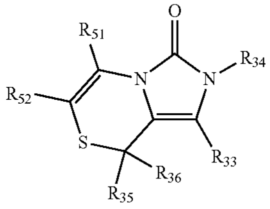
Formula 2-1D
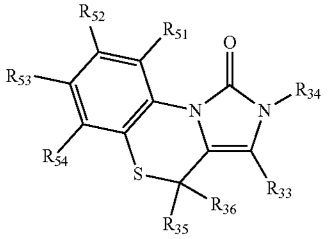
Formula 2-1E
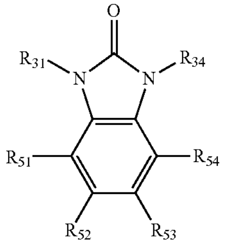
Formula 2-1F
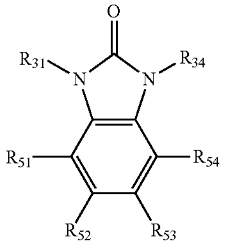
Formula 2-1G
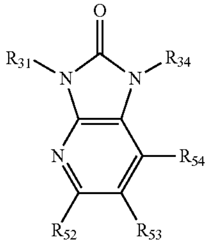
-continued
Formula 2-1H
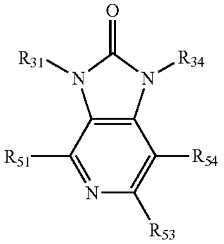
Formula 2-1I
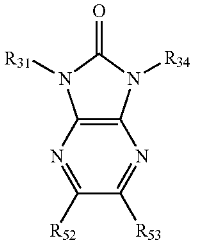
Formula 2-1J
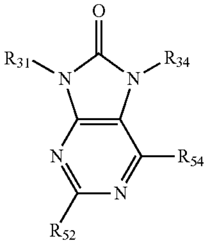
Formula 2-1K
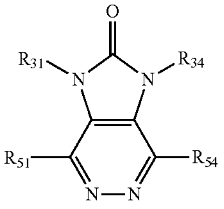
Formula 2-1L
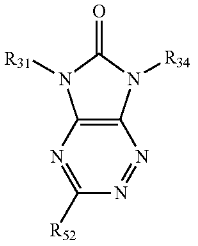
Formula 2-2A
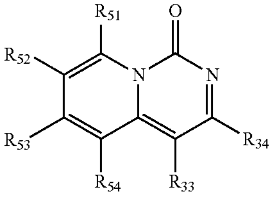

-continued
Formula 2-2B
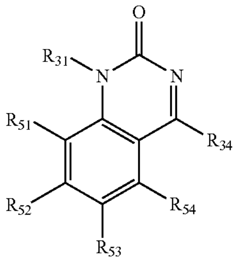
Formula 2-2C
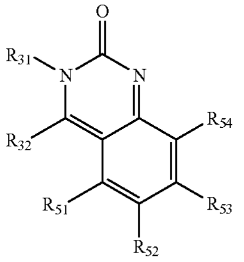
Formula 2-3A
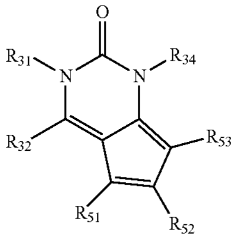
Formula 2-3B
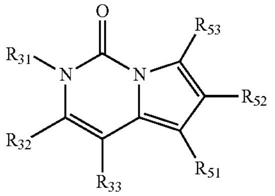
Formula 2-3C
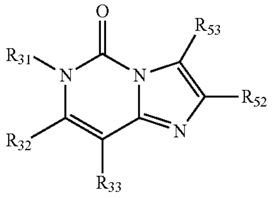
Formula 2-3D
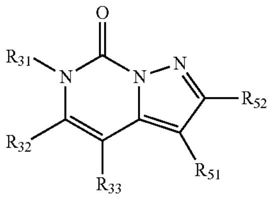
Formula 2-3F
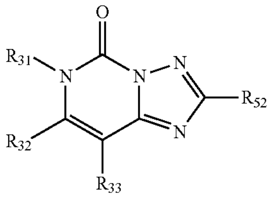
-continued
Formula 2-3G
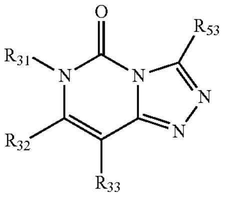
Formula 2-3H
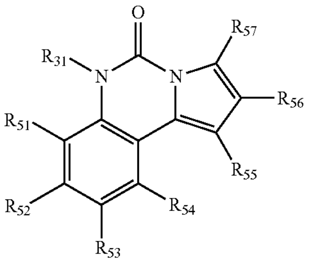
Formula 2-3I
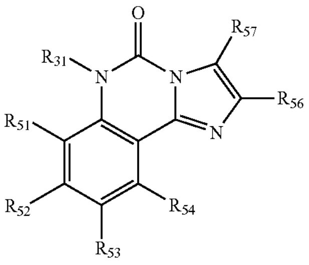
Formula 2-3J
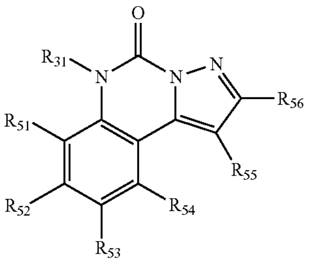
Formula 2-3K
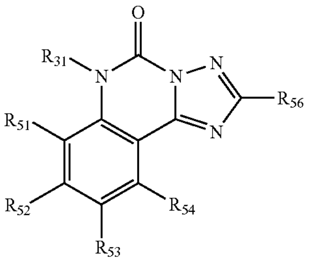
Formula 2-3L
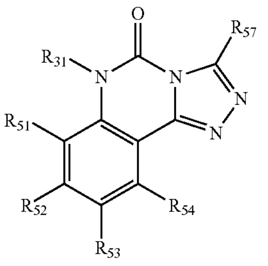

-continued

Formula 2-3M

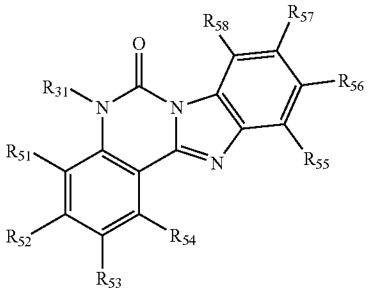

Formula 2-3N

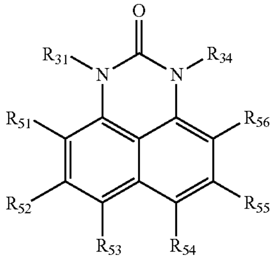

Formula 2-3O

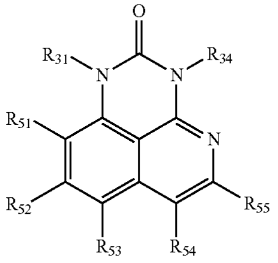

Formula 2-3P

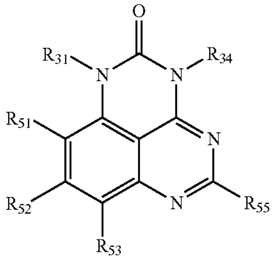

Formula 2-4A

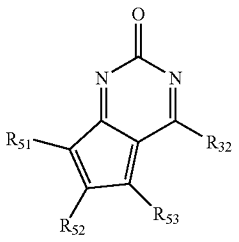

Formula 2-4B

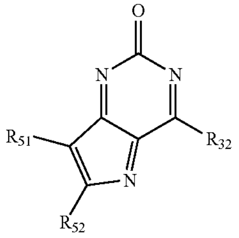

-continued

Formula 2-4C

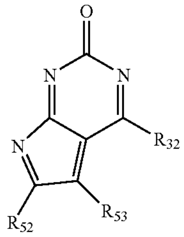

Formula 2-4D

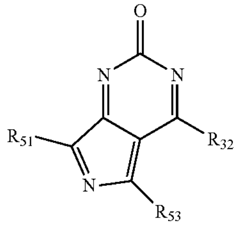

Formula 2-4E

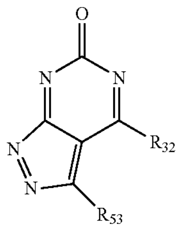

Formula 2-4F

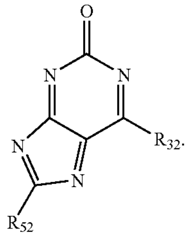

In Formulae 2-1A to 2-1L, Formulae 2-2A to 2-2C, Formulae 2-3A to 2-3P, and Formulae 2-4A to 2-4F, $R_{31}$ to $R_{36}$ and $R_{61}$ to $R_{68}$ may be the same as described earlier herein.

In some embodiments, in Formula 2, $A_2$ may be selected from the groups represented by Formulae 2-1-7(1) to 2-1-7(4), Formulae 2-1-9(1) to 2-1-9(3), Formulae 2-3-8(1) to 2-3-8(4), Formulae 2-3-9(1) to 2-3-9(3), and Formulae 2-4-1(1) to 2-4-1(3):

Formula 2-1-7(1)

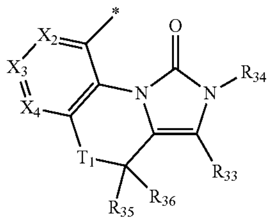

-continued
Formula 2-1-7(2)
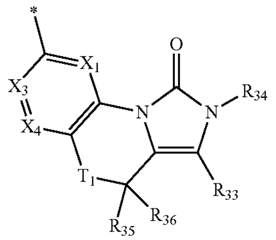
Formula 2-1-7(3)
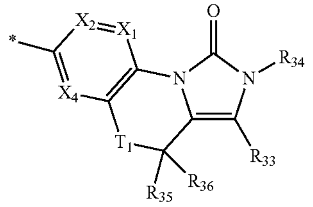
Formula 2-1-7(4)
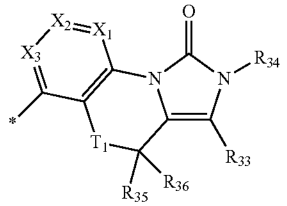
Formula 2-1-9(1)
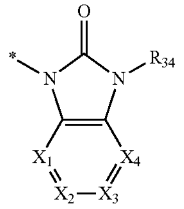
Formula 2-1-9(2)
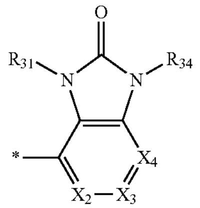
Formula 2-1-9(3)
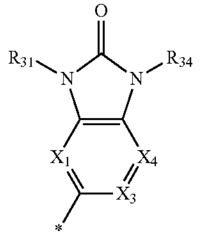
Formula 2-3-8(1)
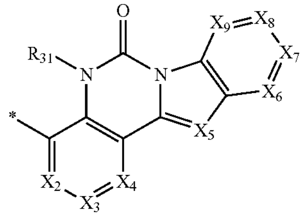
-continued
Formula 2-3-8(2)
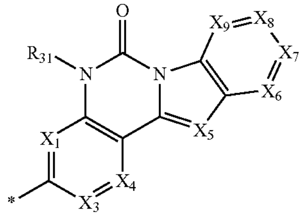
Formula 2-3-8(3)
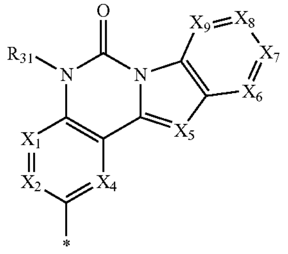
Formula 2-3-8(4)
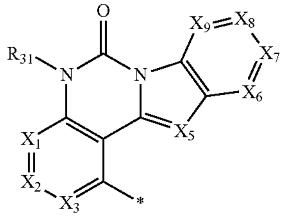
Formula 2-3-9(1)
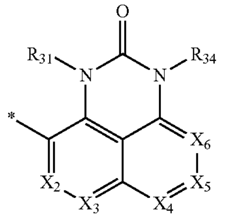
Formula 2-3-9(2)
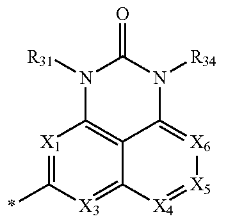
Formula 2-3-9(3)
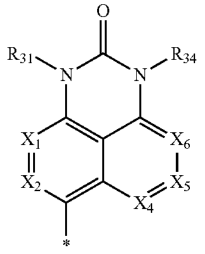
Formula 2-4-1(1)
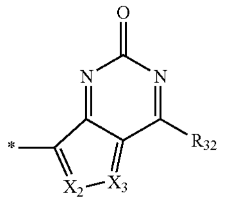

-continued

Formula 2-4-1(2)

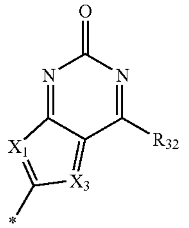

Formula 2-4-1(3)

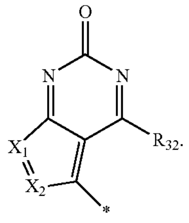

In Formulae 2-1-7(1) to 2-1-7(4), Formulae 2-1-9(1) to 2-1-9(3), Formulae 2-3-8(1) to 2-3-8(4), Formulae 2-3-9(1) to 2-3-9(3), and Formulae 2-4-1(1) to 2-4-1(3), $T_1$, $X_1$ to $X_9$, and $R_{31}$ to $R_{36}$ may be the same as described earlier herein, and * may be a binding site with an adjacent atom.

In Formulae 1 and 2, $L_1$ to $L_3$ and $L_{21}$ to $L_{23}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, in Formulae 1 and 2, $L_1$ to $L_3$ and $L_{21}$ to $L_{23}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, a benzothiazolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, a benzothiazolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an am idino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

In some embodiments, $L_1$ to $L_3$ and $L_{21}$ to $L_{23}$ may each independently be selected from groups represented by Formulae 3-1 to 3-18, but embodiments of the present disclosure are not limited thereto.

Formula 3-1

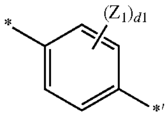

Formula 3-2

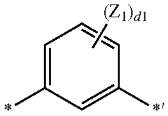

Formula 3-3

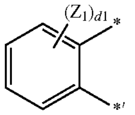

Formula 3-4

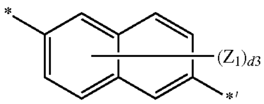

Formula 3-5

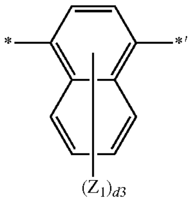

Formula 3-6

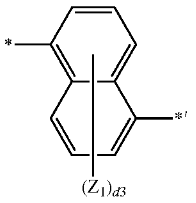

Formula 3-7

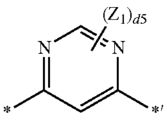

Formula 3-8

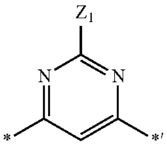

-continued

Formula 3-9

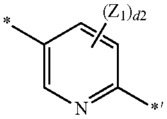

Formula 3-10

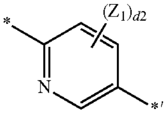

Formula 3-11

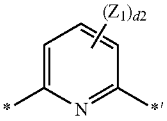

Formula 3-12

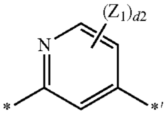

Formula 3-13

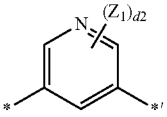

Formula 3-14

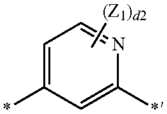

Formula 3-15

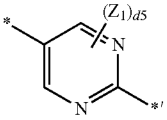

Formula 3-16

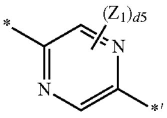

Formula 3-17

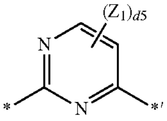

Formula 3-18

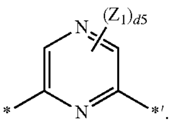

In Formulae 3-1 to 3-18, $Z_1$ may be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, d1 may be an integer selected from 1 to 4, d2 may be an integer selected from 1 to 3, d3 may be an integer selected from 1 to 6, d5 may be an integer selected from 1 and 2, and

* and *' may be each a binding site with an adjacent atom.

In some embodiments, in Formulae 1 and 2, $L_1$ to $L_3$, and $L_{21}$ to $L_{23}$ may each independently be selected from the groups represented by Formulae 4-1 to 4-15, but embodiments of the present disclosure are not limited thereto:

Formula 4-1

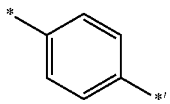

Formula 4-2

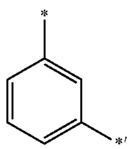

Formula 4-3

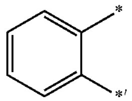

Formula 4-4

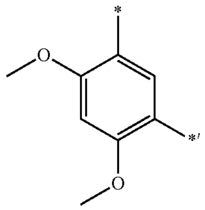

Formula 4-5

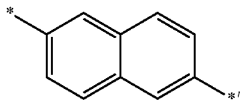

Formula 4-6

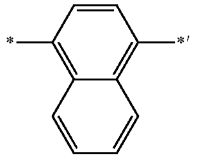

Formula 4-7

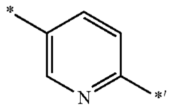

Formula 4-8

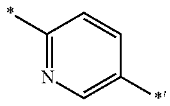

Formula 4-9

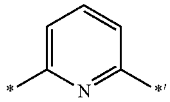

-continued

Formula 4-10

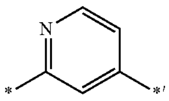

Formula 4-11

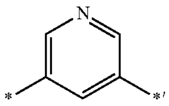

Formula 4-12

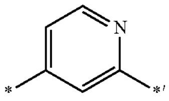

Formula 4-13

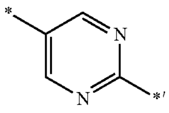

Formula 4-14

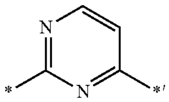

Formula 4-15

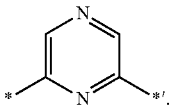

In Formulae 4-1 to 4-15, * and *' may be each a binding site with an adjacent atom.

In Formulae 1 and 2, a1 to a3 and a21 to a23 may each independently be selected from 0, 1, 2, and 3. In Formula 1, when a1 (which indicates the number of $L_1$s), is 0, *-$(L_1)_{a1}$-*' may be a single bond, and when a1 is 2 or greater, each $L_1$s may be independently selected from the above described groups. In Formulae 1 and 2, a2, a3, and a21 to a23 may be the same as described herein in connection with a1.

In some embodiments, in Formula 1, $L_1$ to $L_3$ may each independently be selected from the groups represented by Formulae 4-1 to 4-3, 4-5 and 4-6; and a1 to a3 may each independently be selected from 0 and 1.

In some embodiments, in Formula 2, $L_{21}$ to $L_{23}$ may each independently be selected from the groups represented by Formulae 4-1 to 4-4 and Formulae 4-7 to 4-15, and a21 to a23 may each independently be selected from 0 and 1.

In Formulae 1 and 2, $Ar_1$ and $Ar_2$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formulae 1 and 2, $Ar_1$ and $Ar_2$ may each independently be selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group, and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, an imidazopyrimidinyl group, and —$Si(Q_{31})(Q_{32})(Q_{33})$, wherein $Q_{31}$ to $Q_{33}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

In some embodiments, in Formulae 1 and 2, $Ar_1$ and $Ar_2$ may each independently be selected from the groups represented by Formulae 5-1 to 5-7, but embodiments of the present disclosure are not limited thereto:

Formula 5-1

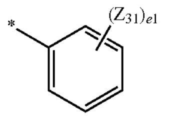

Formula 5-2

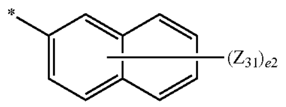

Formula 5-3

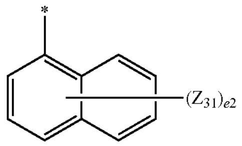

Formula 5-4

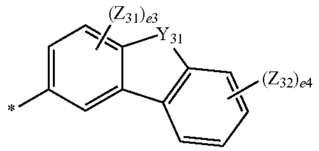

-continued

Formula 5-5

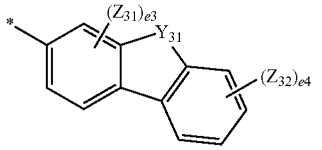

Formula 5-6

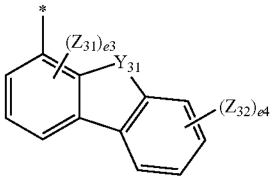

Formula 5-7

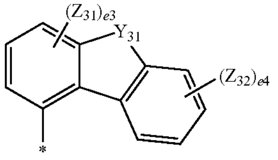
.

In Formulae 5-1 to 5-7, $Y_{31}$ may be selected from O, S, $C(Z_{33})(Z_{34})$, and $N(Z_{35})$, $Z_{31}$ to $Z_{35}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof and a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group, and —$Si(Q_{31})(Q_{32})(Q_{33})$, wherein $Q_{31}$ to $Q_{33}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group;

e1 may be an integer selected from 1 to 5, e2 may be an integer selected from 1 to 7, e3 may be an integer selected from 1 to 3, e4 may be an integer selected from 1 to 4, and

* may be a binding site with an adjacent atom.

In some embodiments, in Formula 2, when a21 is 0, $Ar_2$ may be a group represented by Formula 5-2 (e.g., a substituted or unsubstituted naphthyl group).

In some embodiments, in Formula 2, when a21 is 1, $Ar_2$ may be a group represented by Formula 5-1 (e.g., a substituted or unsubstituted phenyl group).

In some embodiments, in Formulae 1 and 2, $Ar_1$ and $Ar_2$ may each independently be selected from the groups represented by Formulae 6-1 to 6-11, but embodiments of the present disclosure are not limited thereto:

Formula 6-1

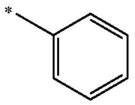

Formula 6-2

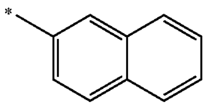

Formula 6-3

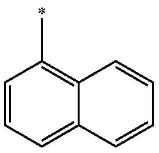

Formula 6-4

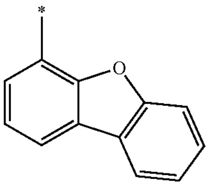

Formula 6-5

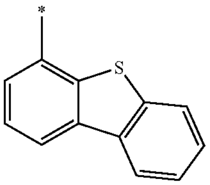

Formula 6-6

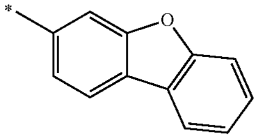

Formula 6-7

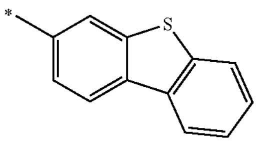

-continued

Formula 6-8

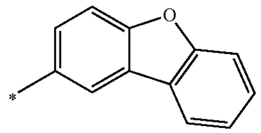

Formula 6-9

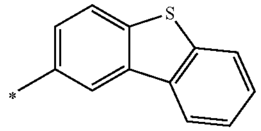

Formula 6-10

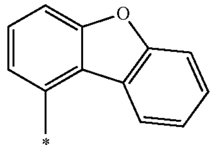

Formula 6-11

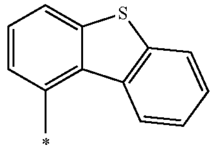

In Formulae 6-1 to 6-11, * may be a binding site with an adjacent atom.

In Formulae 1 and 2, c1 and c2 may each independently be selected from 1, 2, and 3. When c1 (which indicates the number of $Ar_1$s) is 2 or greater, each $Ar_1$ moiety may be independently selected. When c2 (which indicates the number of $Ar_2$s) is 2 or greater, each $Ar_2$ moiety may be independently selected.

For example, in Formulae 1, 1-1, 2, and Formulae 2-1 to 2-4, $R_1$, $R_{11}$ to $R_{20}$, $R_{21}$, $R_{31}$ to $R_{34}$, and $R_{41}$ to $R_{43}$ may each independently be selected from:

hydrogen, deuterium, —F, —Cl, —Br, —I, a hydroxyl group, a cyano group, a nitro group, an amino group, an amidino group, a hydrazine group, a hydrazone group, a $C_1$-$C_{20}$ alkyl group, and a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group, and a dibenzocarbazolyl group, and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group, a dibenzocarbazolyl group, and —Si($Q_{31}$)($Q_{32}$)($Q_{33}$), wherein $Q_{31}$ to $Q_{33}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

In some other embodiments, $R_1$, $R_{11}$ to $R_{20}$, $R_{21}$, $R_{31}$ to $R_{34}$, and $R_{41}$ to $R_{43}$ may each independently be selected from hydrogen, deuterium, —F, —Cl, —Br, —I, a methyl group, an ethyl group, a propyl group, an iso-propyl group, a butyl group, an iso-butyl group, a sec-butyl group, a tert-butyl group, a methoxy group, an ethoxy group, an iso-propoxy group, a butoxy group, an iso-butoxy group, a sec-butoxy group, a tert-butoxy group, and the groups represented by Formulae 7-1 to 7-15:

Formula 7-1

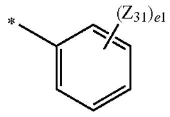

Formula 7-2

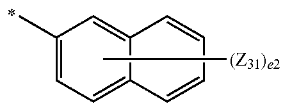

Formula 7-3

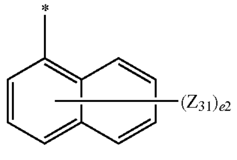

Formula 7-4

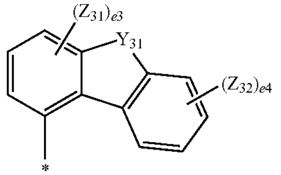

Formula 7-5

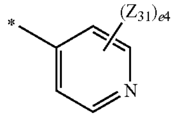

-continued

Formula 7-6

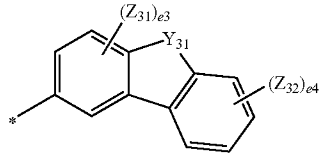

Formula 7-7

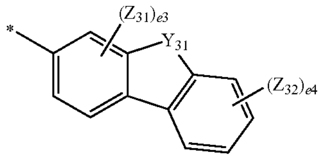

Formula 7-8

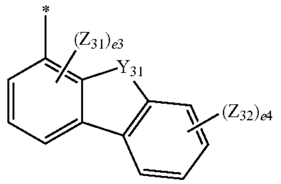

Formula 7-9

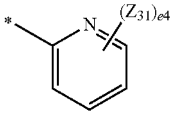

Formula 7-10

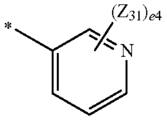

Formula 7-11

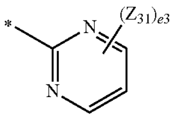

Formula 7-12

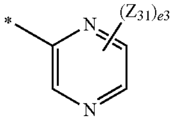

Formula 7-13

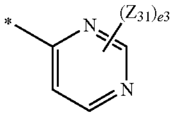

Formula 7-14

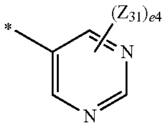

Formula 7-15

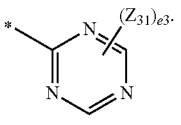

In Formulae 7-1 to 7-15, $Y_{31}$ may be selected from O, S, $C(Z_{33})(Z_{34})$, and $N(Z_{35})$;

$Z_{31}$ to $Z_{35}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof and a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, each substituted with at least one selected from deuterium, —F, —Cl, —Br, —I, a hydroxyl group, a cyano group, a nitro group, an amino group, an am idino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group, and —$Si(Q_{31})(Q_{32})(Q_{33})$, wherein $Q_{31}$ to $Q_{33}$ may each independently be selected from hydrogen, deuterium, —F, —Cl, —Br, —I, a hydroxyl group, a cyano group, a nitro group, an amino group, an am idino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group;

e1 may be an integer selected from 1 to 5, e2 may be an integer selected from 1 to 7, e3 may be an integer selected from 1 to 3, e4 may be an integer selected from 1 to 4, e5 may be an integer selected from 1 and 2, and

* may be a binding site with an adjacent atom.

In some embodiments, in Formulae 1, 1-1, 2, and Formulae 2-1 to 2-4, $R_1$, $R_{11}$ to $R_{20}$, $R_{21}$, $R_{31}$ to $R_{34}$, and $R_{41}$ to $R_{43}$ may each independently be selected from hydrogen, deuterium, —F, —Cl, —Br, —I, a methyl group, an ethyl group, a propyl group, an iso-propyl group, a butyl group, an iso-butyl group, a sec-butyl group, a tert-butyl group, a methoxy group, an ethoxy group, an iso-propoxy group, a butoxy group, an iso-butoxy group, a sec-butoxy group, a tert-butoxy group, and the groups represented by Formulae 8-1 to 8-22, but embodiments of the present disclosure are not limited thereto:

Formula 8-1

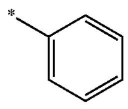

-continued
Formula 8-2
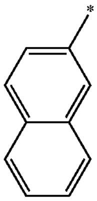
Formula 8-3
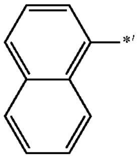
Formula 8-4
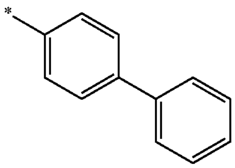
Formula 8-5
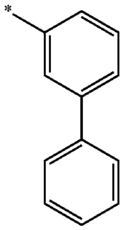
Formula 8-6
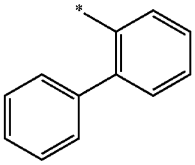
Formula 8-7
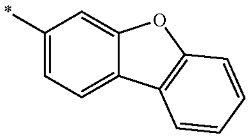
Formula 8-8
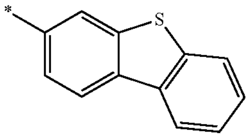
Formula 8-9
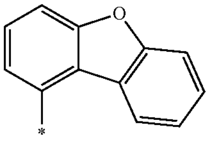
Formula 8-10
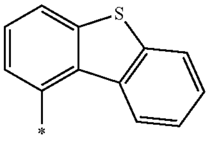
-continued
Formula 8-11
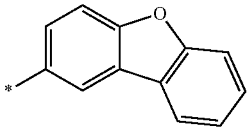
Formula 8-12
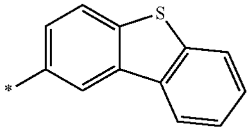
Formula 8-13
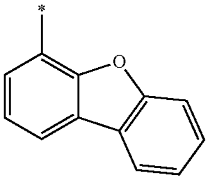
Formula 8-14
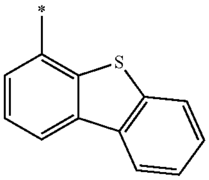
Formula 8-15
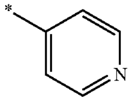
Formula 8-16
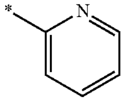
Formula 8-17
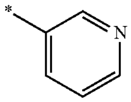
Formula 8-18
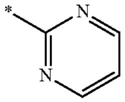
Formula 8-19
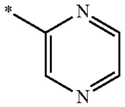
Formula 8-20
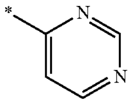
Formula 8-21
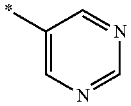
Formula 8-22
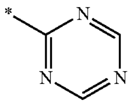

In Formulae 8-1 to 8-22, * may be a binding site with an adjacent atom.

In some embodiments, in Formulae 1 and 1-1, $R_1$ and $R_{11}$ to $R_{20}$ may each independently be selected from hydrogen, deuterium, —F, —Cl, —Br, —I, a methyl group, an ethyl group, a propyl group, an iso-propyl group, a butyl group, an iso-butyl group, a sec-butyl group, a tert-butyl group, a methoxy group, an ethoxy group, an iso-propoxy group, a butoxy group, an iso-butoxy group, a sec-butoxy group, a tert-butoxy group, and the groups represented by Formulae 8-1 to 8-14, but embodiments of the present disclosure are not limited thereto.

In some embodiments, in Formulae 2 and 2-1 to 2-4, $R_{21}$, $R_{31}$ to $R_{34}$, and $R_{41}$ to $R_{43}$ may each independently be selected from hydrogen, deuterium, —F, —Cl, —Br, —I, a methyl group, an ethyl group, a propyl group, an iso-propyl group, a butyl group, an iso-butyl group, a sec-butyl group, a tert-butyl group, a methoxy group, an ethoxy group, an iso-propoxy group, a butoxy group, an iso-butoxy group, a sec-butoxy group, a tert-butoxy group, and the groups represented by Formulae 8-1 to 8-6 and Formulae 8-15 to 8-22, but embodiments of the present disclosure are not limited thereto.

In Formulae 1 and 2, m1 (which indicates the number of $R_1$s) may be selected from 0, 1, 2, and 3, and each $R_1$ moiety may be independently selected when m1 is 2 or greater, and m21 (which indicates the number of $R_{21}$s) may be selected from 0, 1, 2, and 3, and each $R_{21}$ moiety may be independently selected when m21 is 2 or greater.

In Formula 1, b1 (which indicates the number of *-[$(L_3)_{a3}$-$(R_1)_{m1}$]s) may be an integer selected from 0 to 8. In some embodiments, b1 may be 0, 1, or 2. Each *-[$(L_3)_{a3}$-$(R_1)_{m1}$]s may be independently selected when b1 is 2 or greater.

In Formula 2, b21 (which indicates the number of *-[$(L_{23})_{a23}$-$(R_{21})_{m21}$]s) may be an integer selected from 0 to 8. In some embodiments, b21 may be 0, 1, or 2. In some embodiments, b21 may be 0 or 1. Each *-[$(L_{23})_{a23}$-$(R_{21})_{m21}$] may be independently selected when b21 is 2 or greater.

In Formula 1, t1 (which indicates the number of *-[$(L_{22})_{a2}$-$(A_1)_{n1}$]s), may be selected from 1, 2, and 3. In some embodiments, t1 may be 1 or 2. Each *-[$(L_2)_{a2}$-$(A_1)_{n1}$] may be independently selected when t1 is 2 or greater.

In Formulae 2, t2 (which indicates the number of *-[$(L_{22})_{a22}$-$(A_2)_{n2}$]s) may be selected from 1, 2, and 3. In some embodiments, t2 may be 1 or 2. Each *-[$(L_{22})_{a22}$-$(A_2)_{n2}$] may be independently selected when t2 is 2 or greater.

In some embodiments, in Formula 1, $R_1$ may be selected from a phenyl group, a biphenyl group, a terphenyl group, and a naphthyl group, m1 may be selected from 0 and 1, and b1 may be selected from 0, 1, and 2. However, embodiments of the present disclosure are not limited thereto.

In some embodiments, in Formula 2, $R_{21}$ may be a naphthyl group, m21 may be selected from 0 and 1, and b2 may be selected from 0 and 1. However, embodiments of the present disclosure are not limited thereto.

In some embodiments, in Formulae 1 and 2, t1 and t2 may both be 1. However, embodiments of the present disclosure are not limited thereto.

In some embodiments, the first compound may be a compound represented by Formula 11, the second compound may be selected from the compounds represented by Formulae 12-1 and 12-2, and the third compound may be selected from the compounds represented by Formulae 11, 12-1, and 12-2. However, embodiments of the present disclosure are not limited thereto.

Formula 11

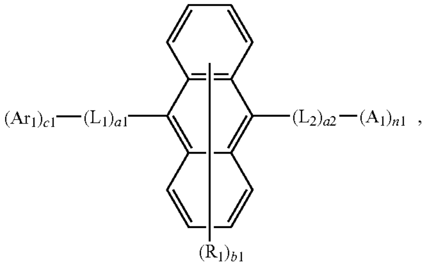

Formula 12-1

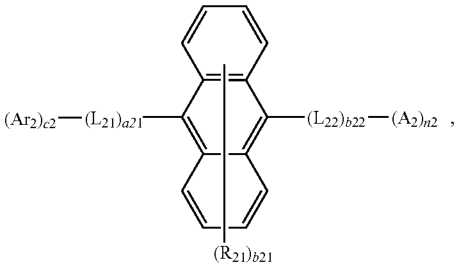

Formula 12-2

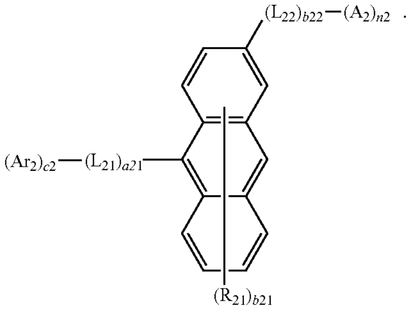

In Formulae 11, 12-1, and 12-2, $A_1$, $A_2$, n1, n2, $L_1$, $L_2$, $L_{21}$, $L_{22}$, a1, a2, a21, $Ar_1$, $Ar_2$, c1, c2, $R_1$, $R_{21}$, b1, and b21 may be the same as described earlier herein, and b22 may be the same as described herein in connection with a22

In some embodiments, the first compound may be selected from the compounds represented by Formulae 11A to 11D, the second compound may be selected from the compounds represented by Formulae 12-1A to 12-1Q and Formulae 12-2A to 12-2Q, and the third compound may be selected from the compounds represented by Formulae 11A to 11D, Formulae 12-1A to 12-1Q, and Formulae 12-2A to 12-2Q. However, embodiments of the present disclosure are not limited thereto.

Formula 11A
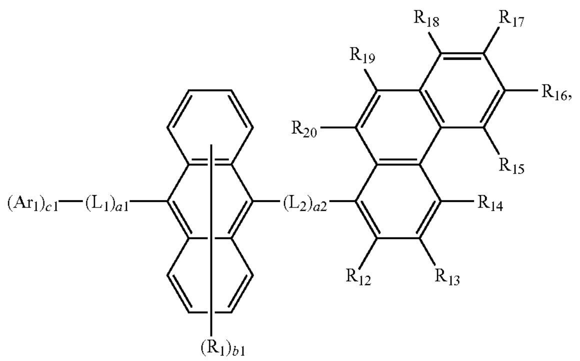
Formula 11B
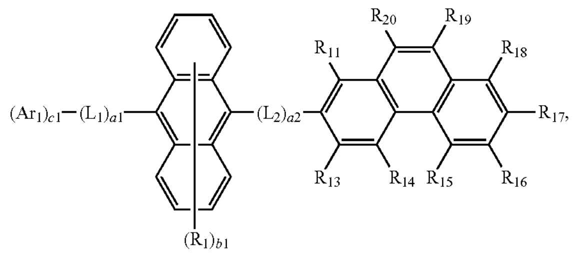
Formula 11C
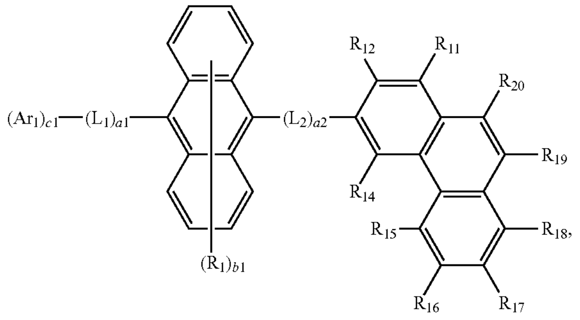
Formula 11D
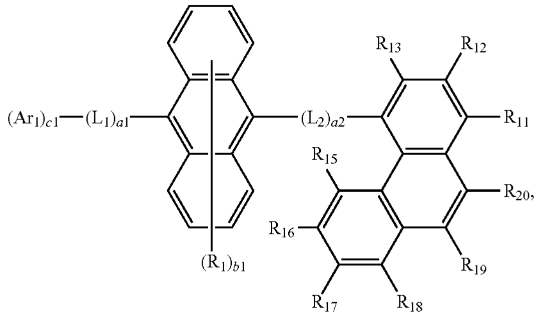
Formula 12-1A
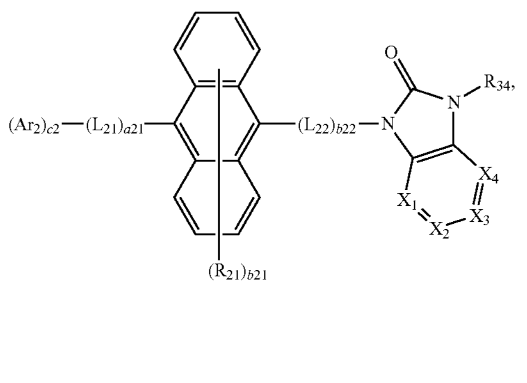
-continued
Formula 12-1B
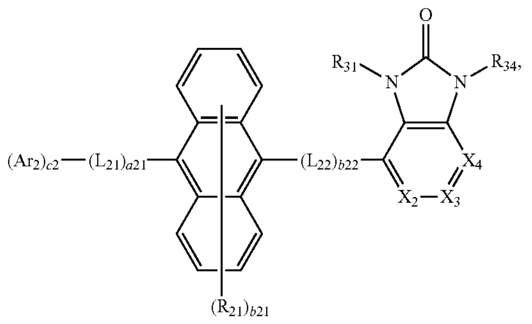
Formula 12-1C
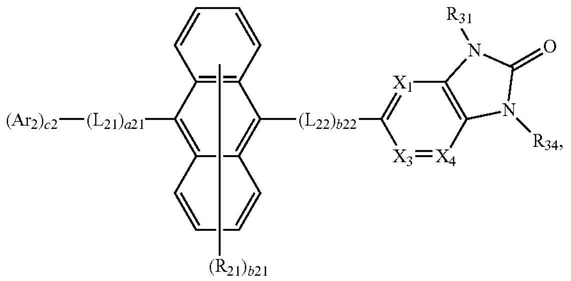
Formula 12-1D
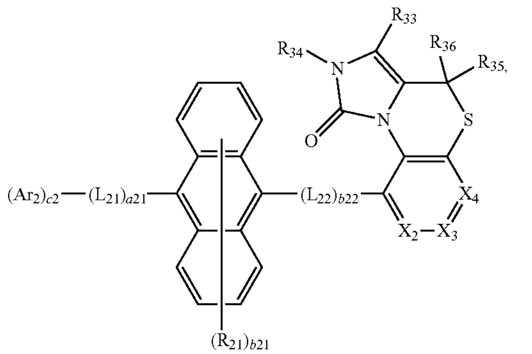
Formula 12-1E
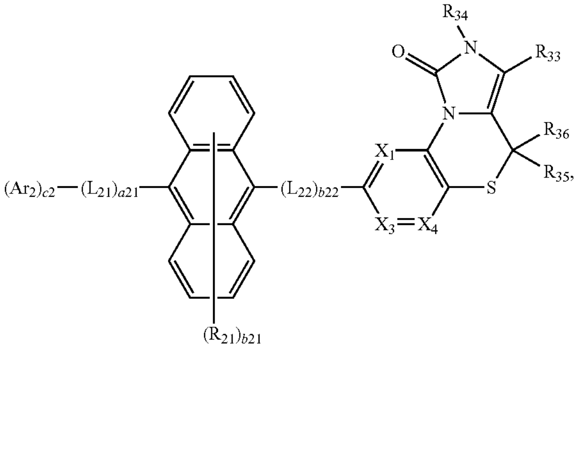

-continued
Formula 12-1F
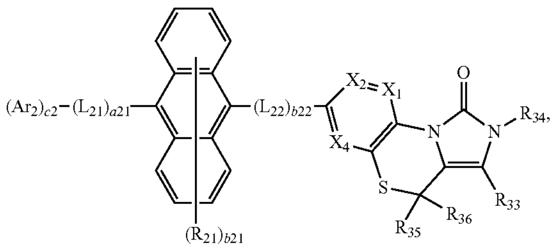
Formula 12-1G
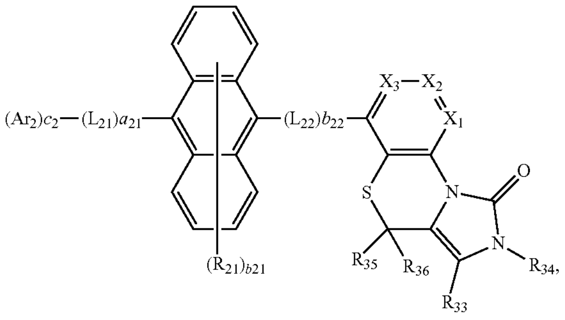
Formula 12-1H
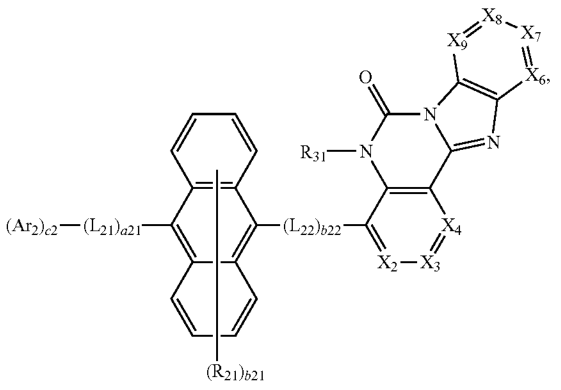
Formula 12-1I
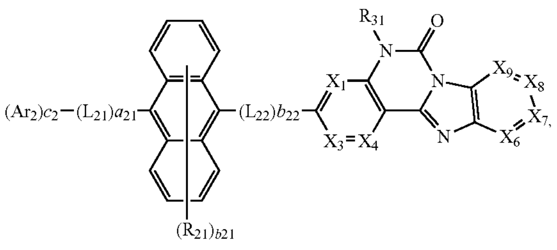
Formula 12-1J
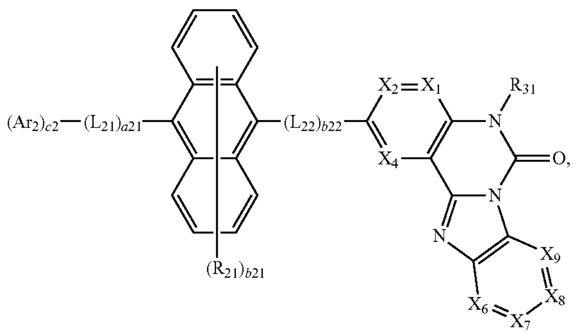
-continued
Formula 12-1K
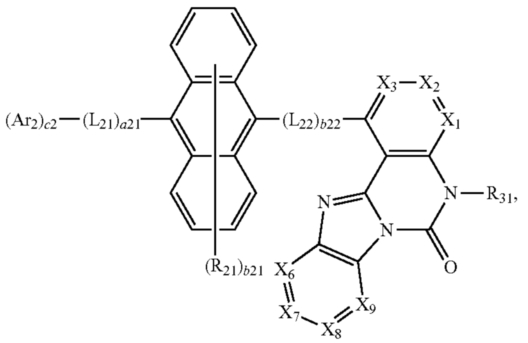
Formula 12-1L
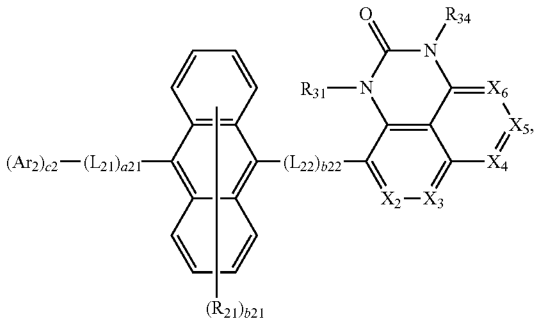
Formula 12-1M
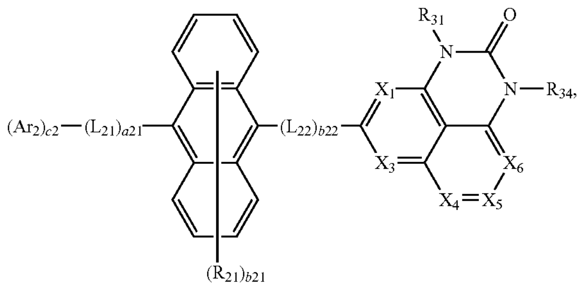
Formula 12-1N
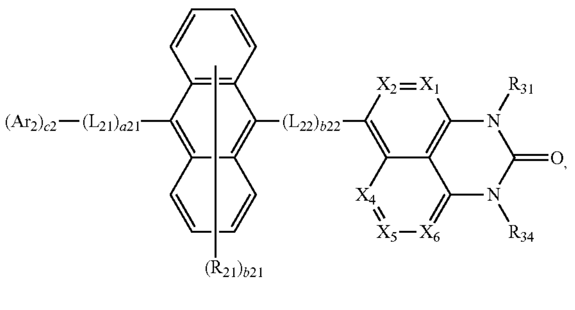

-continued
Formula 12-1O
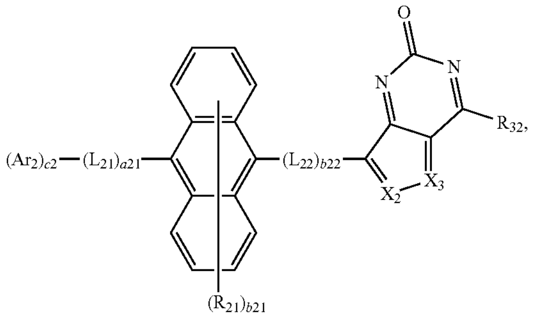
Formula 12-1P
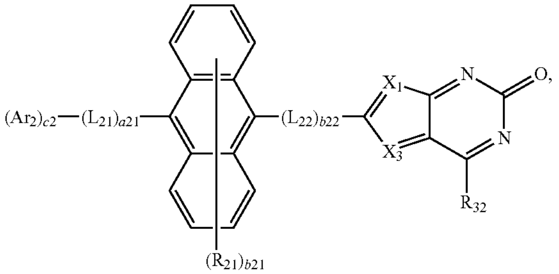
Formula 12-1Q
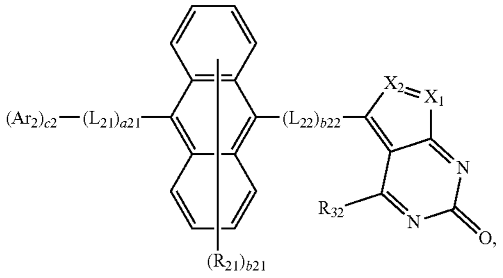
Formula 12-2A
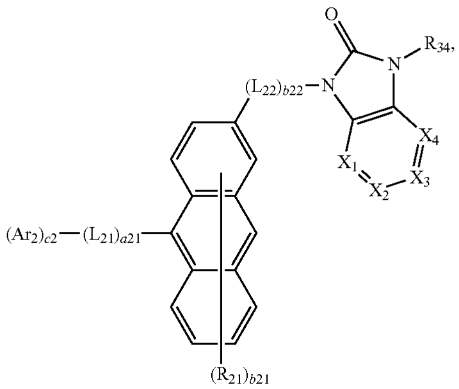
-continued
Formula 12-2B
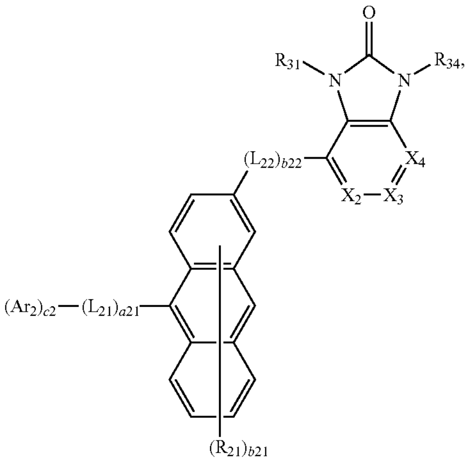
Formula 12-2C
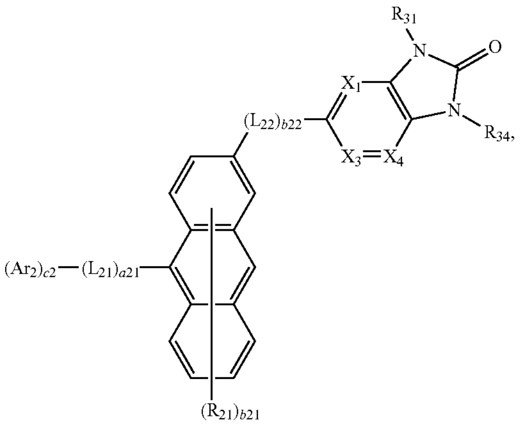
Formula 12-2D
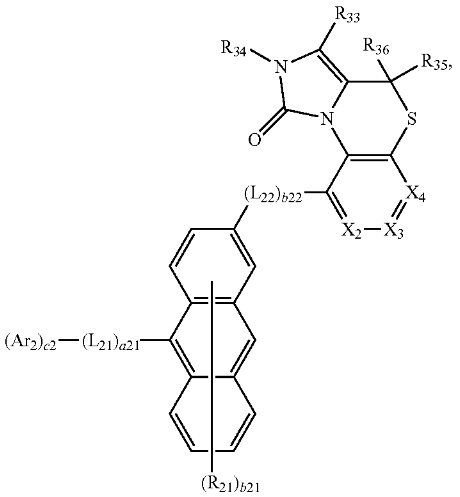

-continued
Formula 12-2E
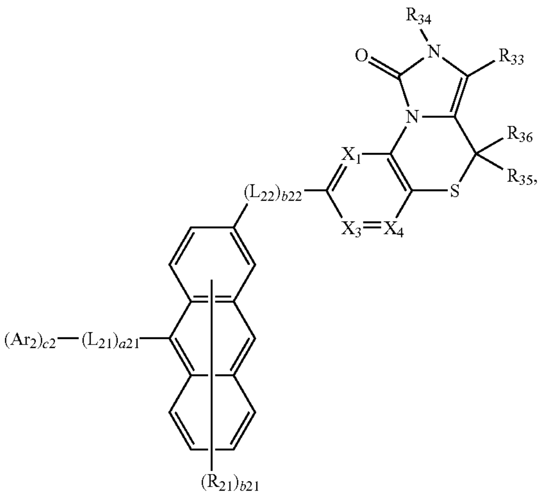
Formula 12-2F
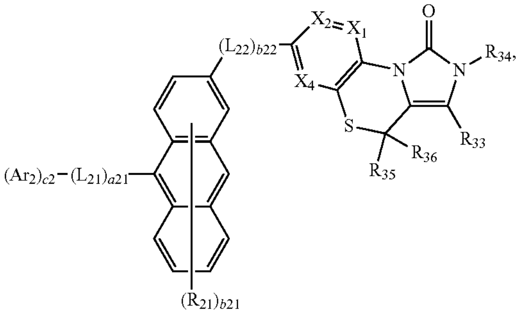
Formula 12-2G
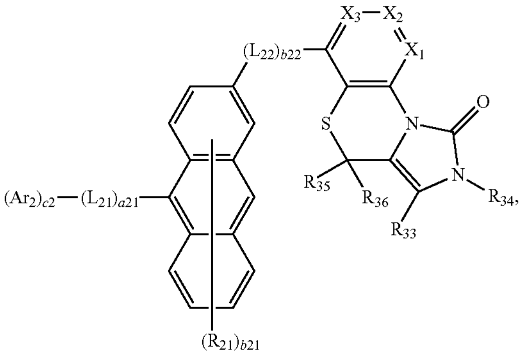
-continued
Formula 12-2H
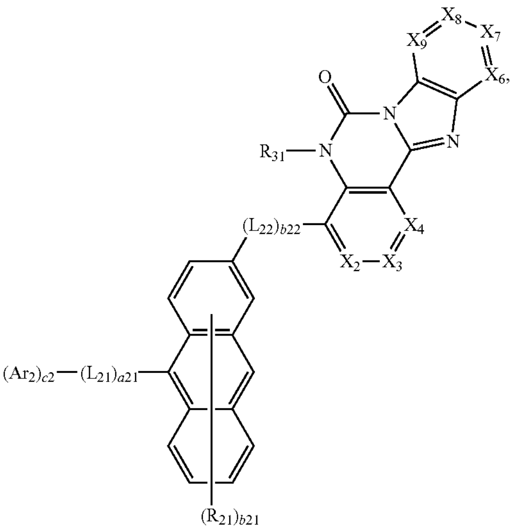
Formula 12-2I
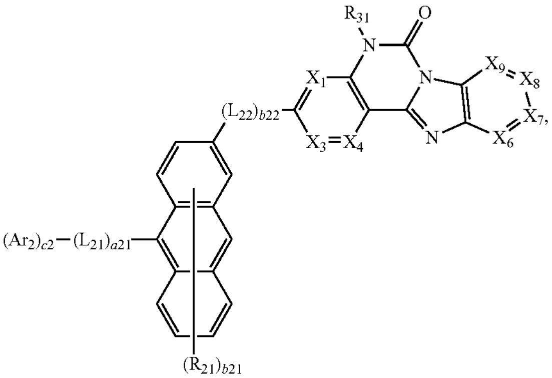
Formula 12-2J
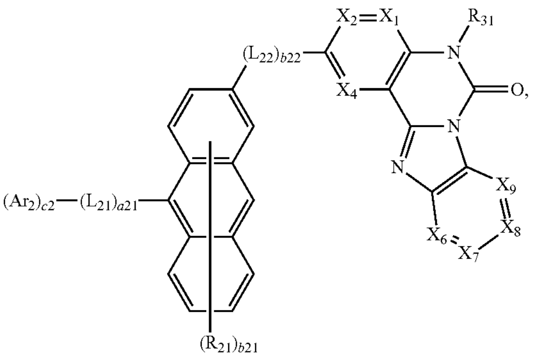

-continued
Formula 12-2K
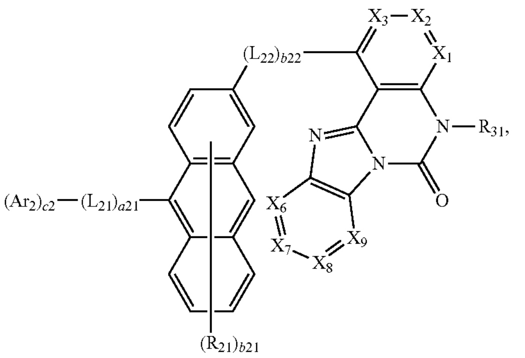
Formula 12-2L
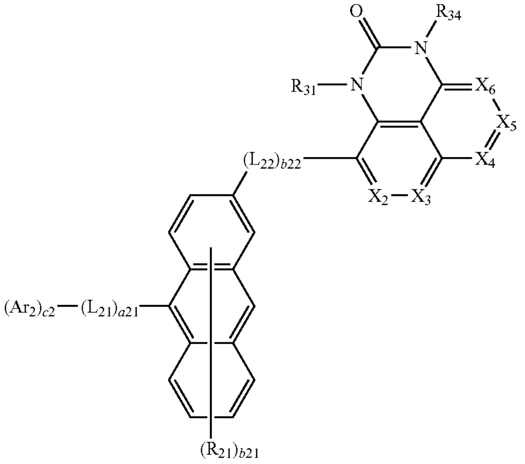
Formula 12-2M
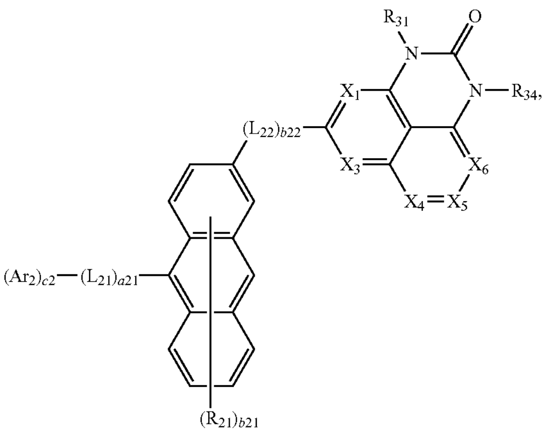
-continued
Formula 12-2N
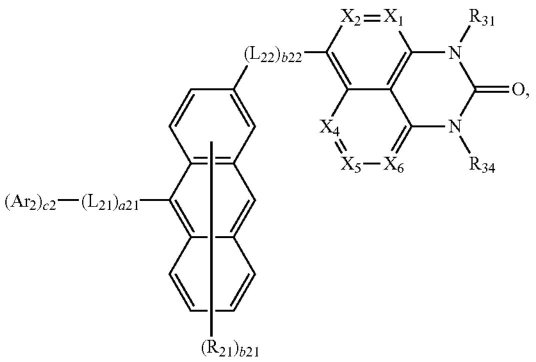
Formula 12-2O
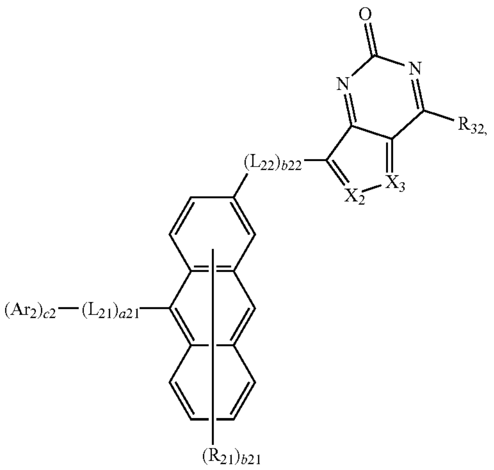
Formula 12-2P
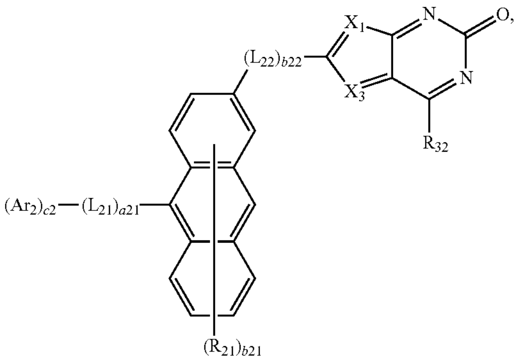
Formula 12-2Q
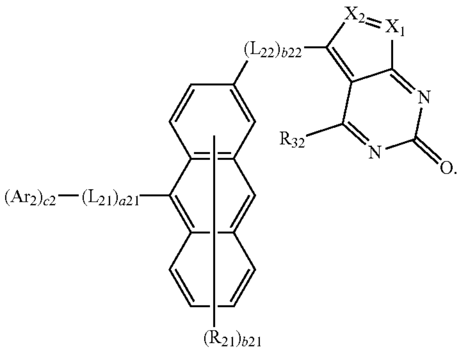

In Formulae 11A to 11D, Formulae 12-1A to 12-1Q, and Formulae 12-2A to 12-2Q, $L_1$, $L_2$, $L_{21}$, $L_{22}$, a1, a2, a21, b22, $Ar_1$, $Ar_2$, c1, c2, $R_1$, $R_{11}$ to $R_{20}$, $R_{21}$, $R_{31}$ to $R_{36}$, b1, b21, and $X_1$ to $X_9$ may be the same as described earlier herein.

For example, the second and third compounds may each independently be selected from the groups represented by Formulae 12-1A, 12-1C, 12-1F, 12-1I, 12-1N, 12-1P, 12-2A, and 12-2C. However, embodiments of the present disclosure are not limited thereto.

For example, in Formulae 11A to 11D, $L_1$ and $L_2$ may each independently be selected from the groups represented by Formulae 4-1 to 4-3, 4-5, and 4-6;

a1 and a2 may each independently be selected from 0 and 1;

$Ar_1$ may be selected from the groups represented by Formulae 6-1 to 6-11;

c1 may be 1;

$R_1$ and $R_{11}$ to $R_{20}$ may each independently be selected from hydrogen, deuterium, —F, —Cl, —Br, —I, a methyl group, an ethyl group, a propyl group, an iso-propyl group, a butyl group, an iso-butyl group, a sec-butyl group, a tert-butyl group, a methoxy group, an ethoxy group, an iso-propoxy group, a butoxy group, an iso-butoxy group, a sec-butoxy group, a tert-butoxy group, and the groups represented by Formulae 8-1 to 8-14; and b1 may be selected from 0, 1, and 2.

For example, in Formulae 12-1A to 12-1Q, and Formulae 12-2A to 12-2Q, $L_{21}$ and $L_{22}$ may each independently be selected from the groups represented by Formulae 4-1 to 4-4 and Formulae 4-7 to 4-15;

a21 and a22 may each independently be selected from 0 and 1;

$Ar_2$ may be selected from the groups represented by Formulae 6-1 to 6-11;

c1 may be 1;

$R_{21}$, $R_{31}$ to $R_{34}$, and $R_{51}$ to $R_{59}$ may each independently be selected from hydrogen, deuterium, —F, —Cl, —Br, —I, a methyl group, an ethyl group, a propyl group, an iso-propyl group, a butyl group, an iso-butyl group, a sec-butyl group, a tert-butyl group, a methoxy group, an ethoxy group, an iso-propoxy group, a butoxy group, an iso-butoxy group, a sec-butoxy group, a tert-butoxy group, and the groups represented by Formulae 8-1 to 8-6 and Formulae 8-15 to 8-22.

For example, when b1 is 1, $R_1$ may be linked (e.g., coupled) to the 2-position, 3-position, or 7-position of anthracene.

For example, when b1 is 2, $R_1$ may be linked (e.g., coupled) to at least two positions selected from the 2-position, 3-position, and 7-position of anthracene. For example, when b1 is 2, $R_1$ may be linked (e.g., coupled) to the 3-position and 7-position of anthracene.

In some embodiments, the first compound may be selected from Compounds 1-1 to 1-95, the second compound may be selected from Compounds 2-1 to 2-13, and the third compound may be selected from Compounds 1-1 to 1-95 and Compounds 2-1 to 2-13. However, embodiments of the present disclosure are not limited thereto.

1-1

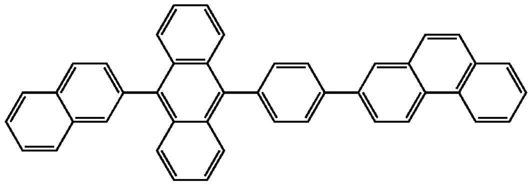

1-2

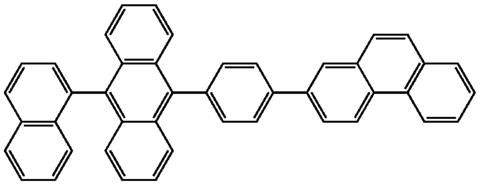

1-3

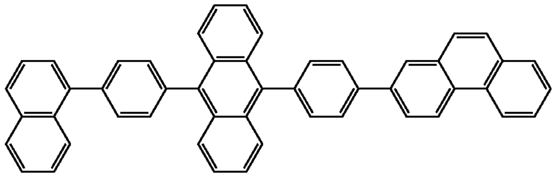

1-4

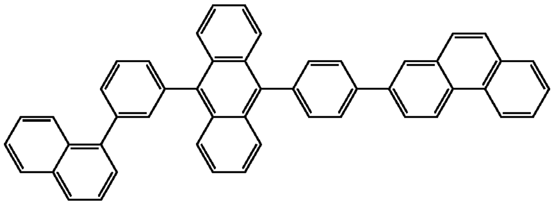

1-5

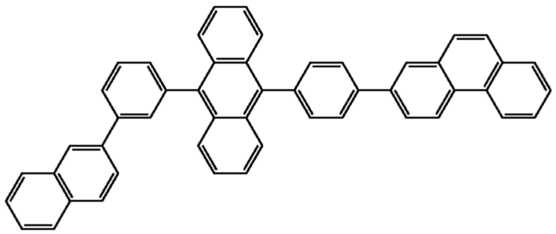

1-6

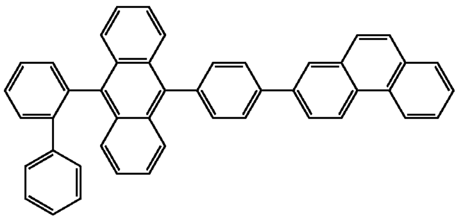

-continued
1-7
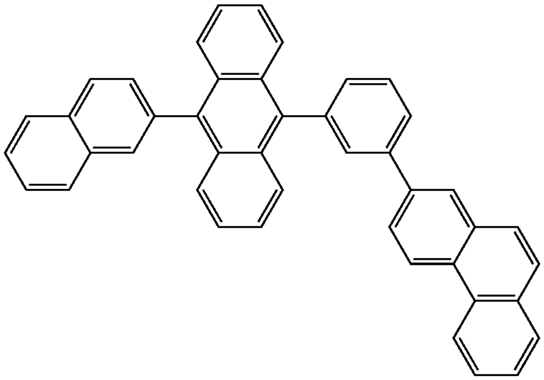
1-8
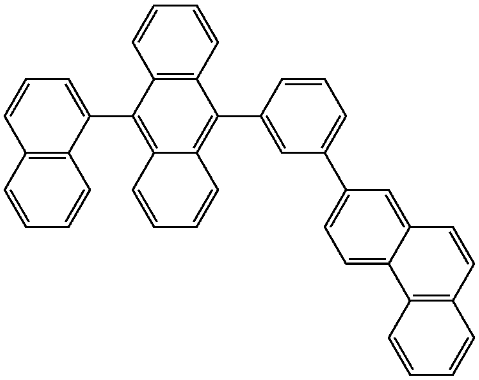
1-9
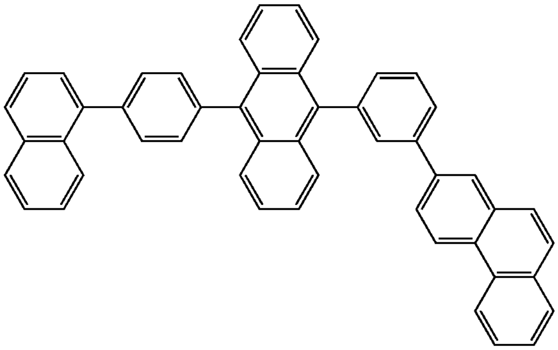
1-10
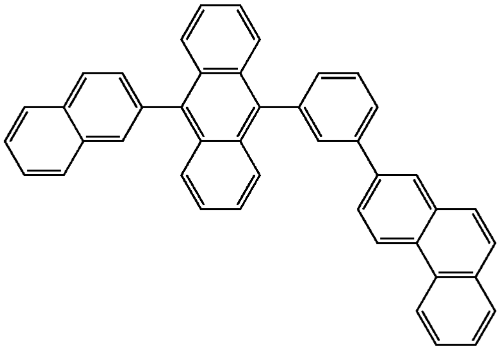
1-11
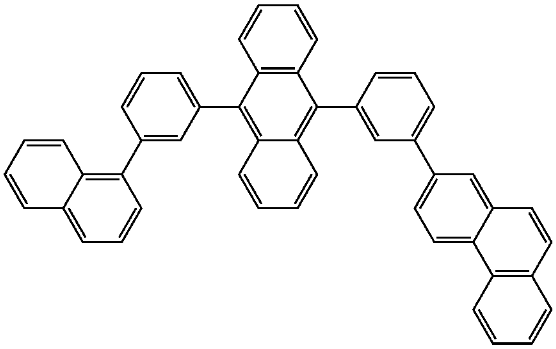
1-12
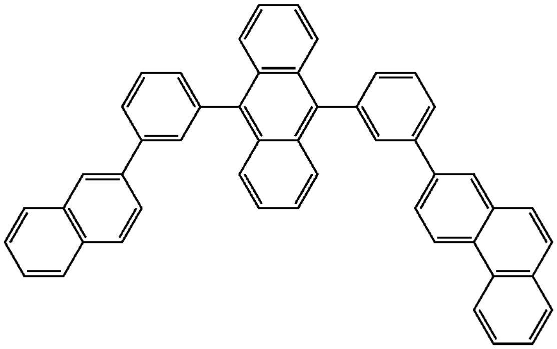
1-13
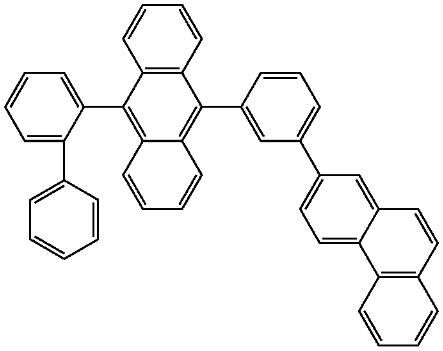
1-14
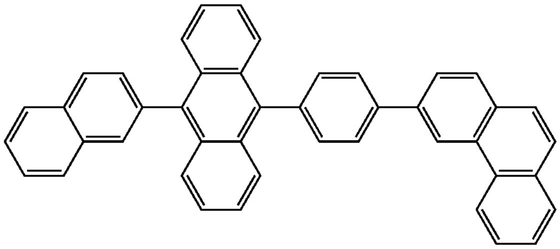

-continued
1-15
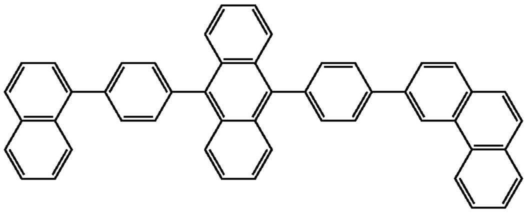
1-16
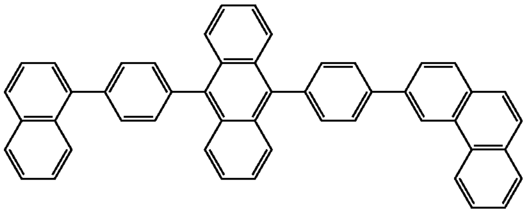
1-17
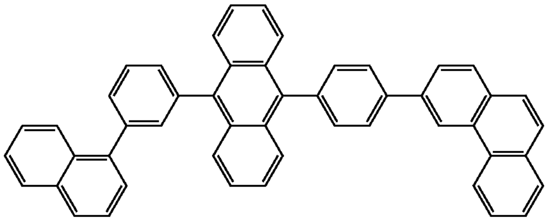
1-18
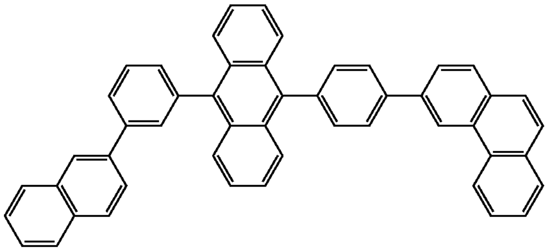
1-19
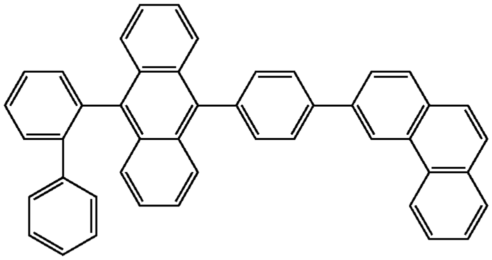
1-20
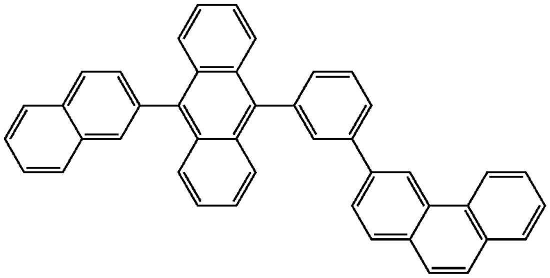
1-21
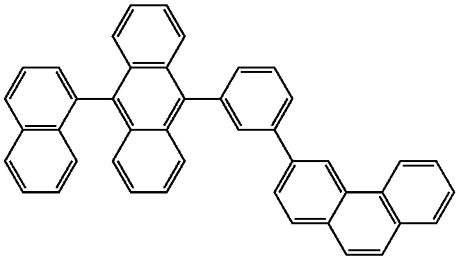
1-22
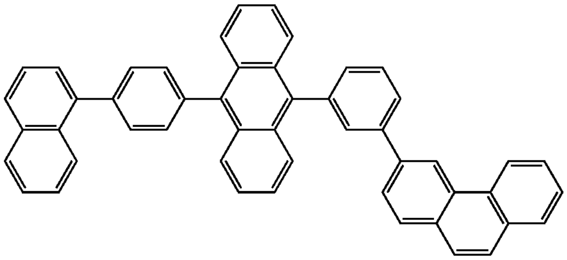
1-23
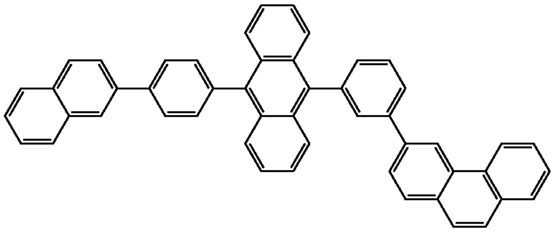
1-24
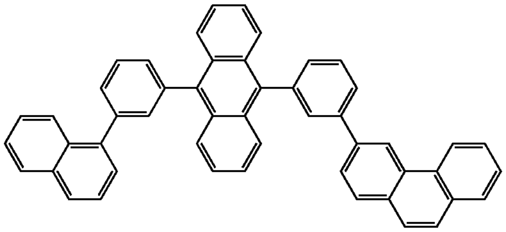
1-25
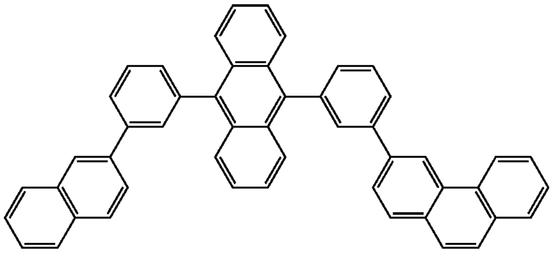
1-26
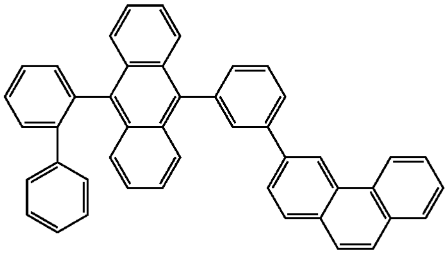

-continued
1-27
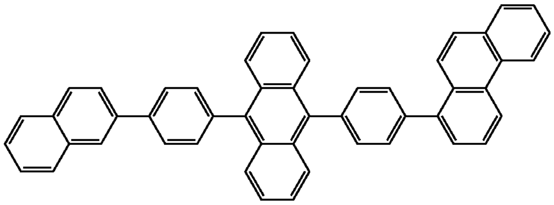
1-28
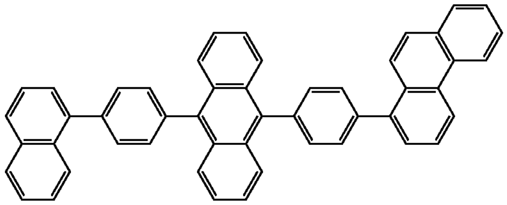
1-29
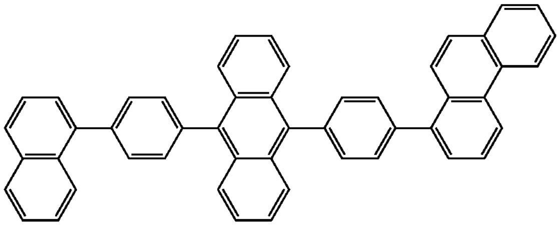
1-30
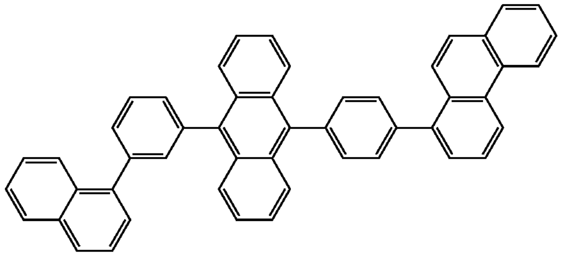
1-31
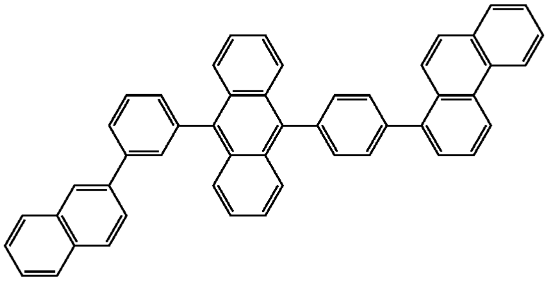
1-32
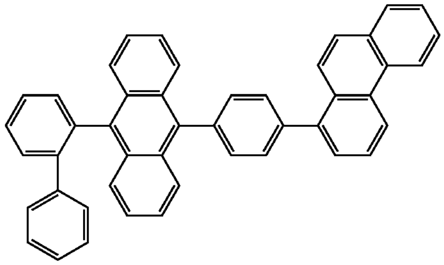
1-33
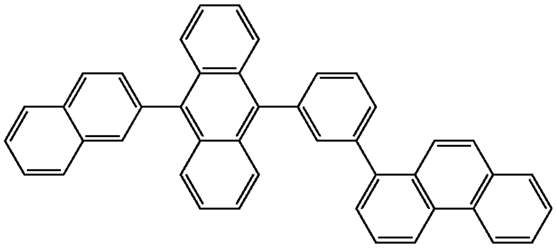
1-34
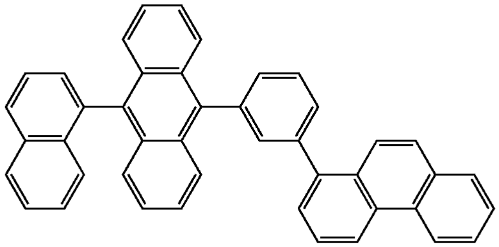
1-35
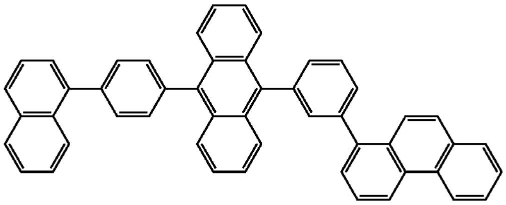
1-36
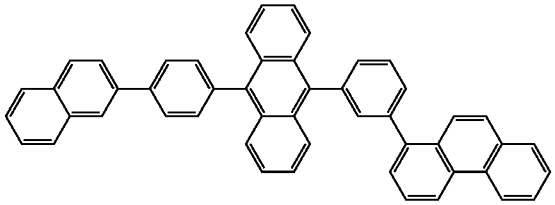
1-37
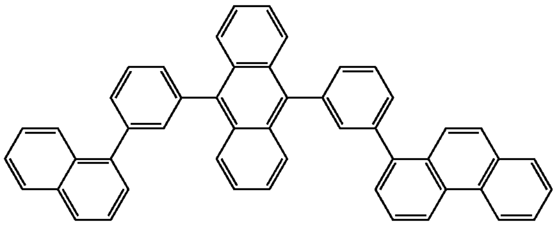
1-38
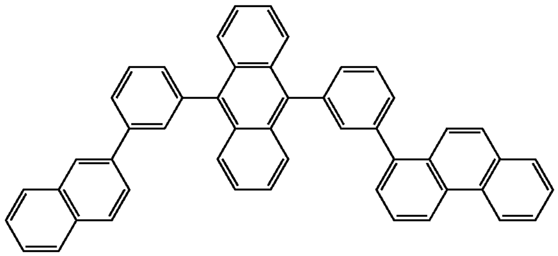

-continued
1-39
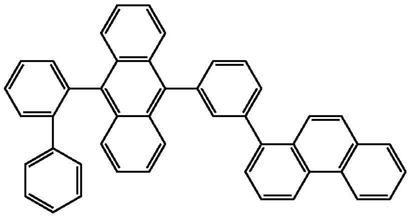
1-40
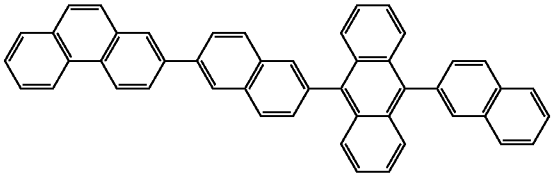
1-41
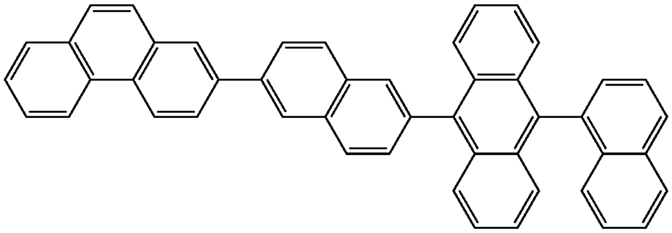
1-42
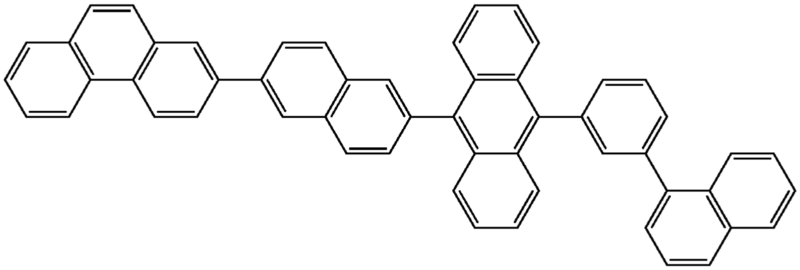
1-43
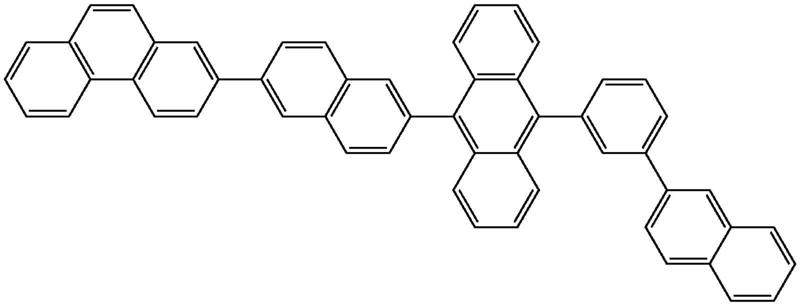
1-44
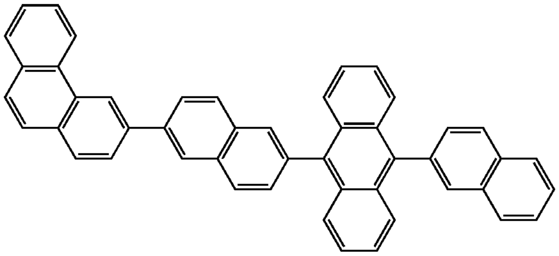
1-45
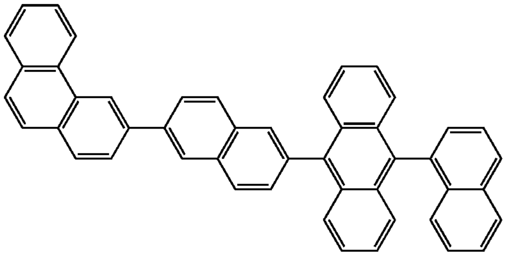

-continued
1-46
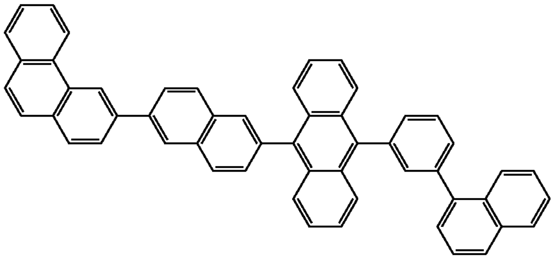
1-47
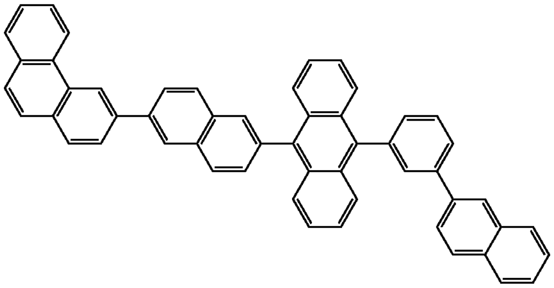
1-48
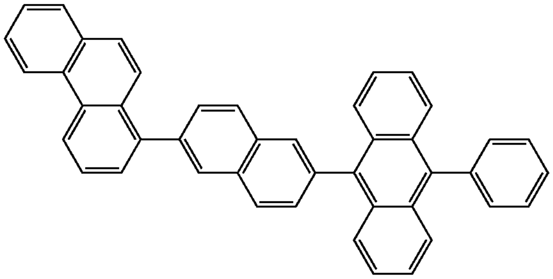
1-49
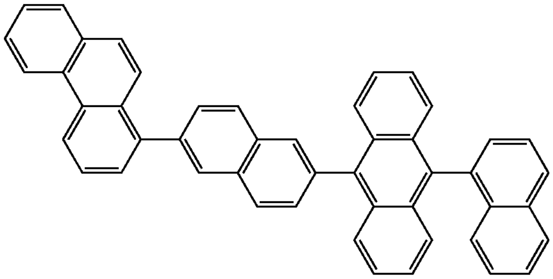
1-50
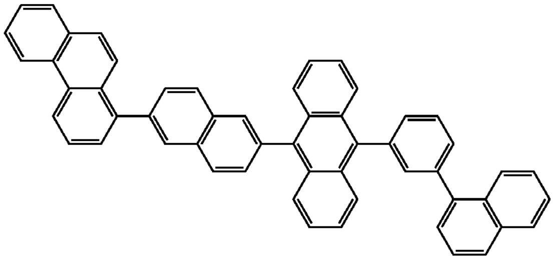
1-51
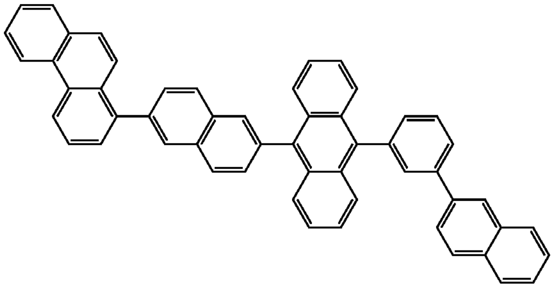
1-52
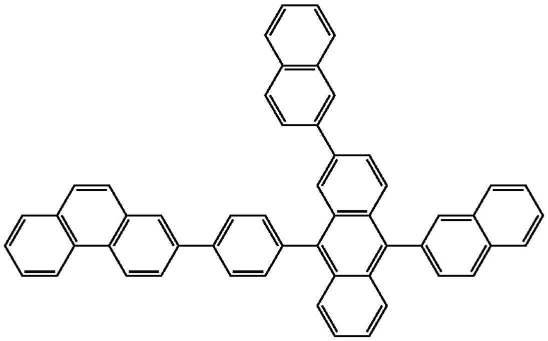
1-53
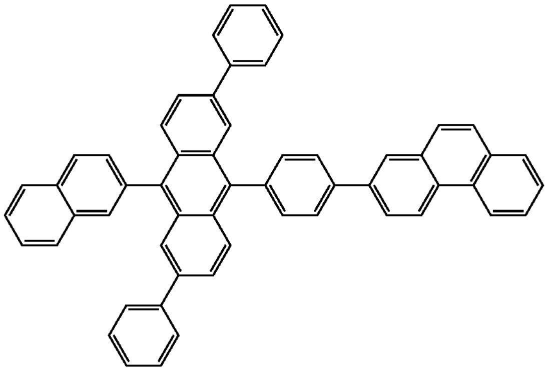

-continued
1-54
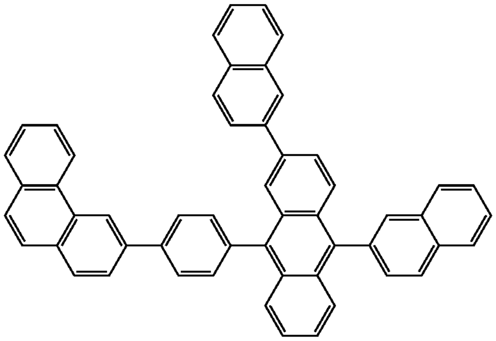
1-55
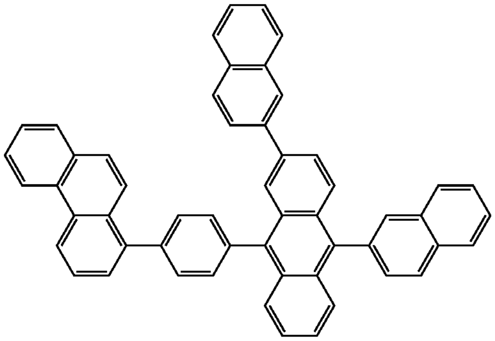
1-56
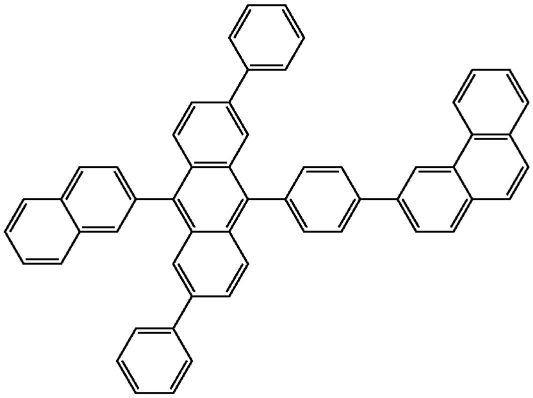
1-57
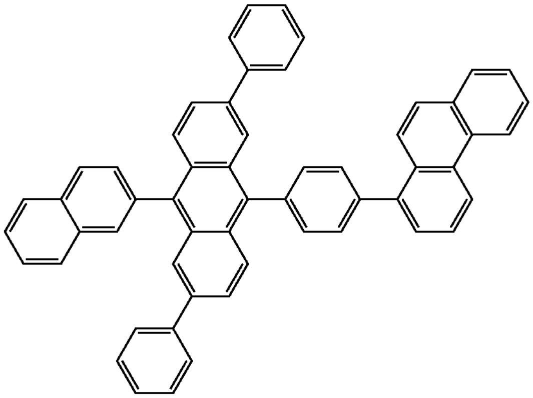
1-58
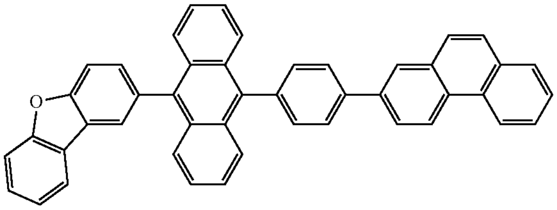
1-59
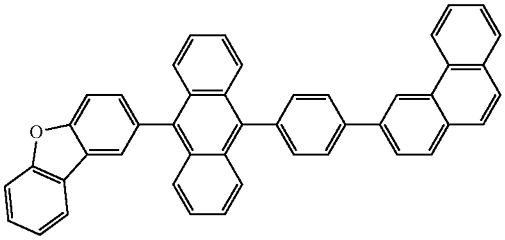
1-60
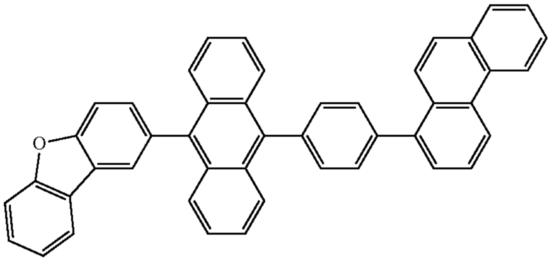
1-61
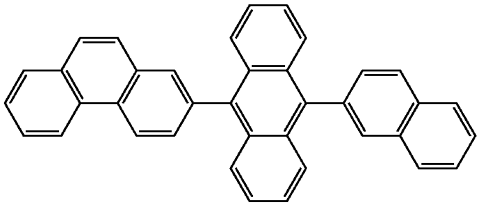
1-62
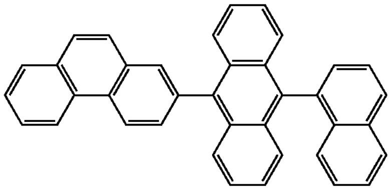
1-63
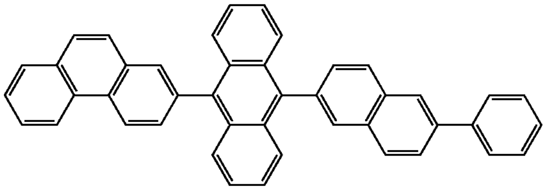

-continued
1-64
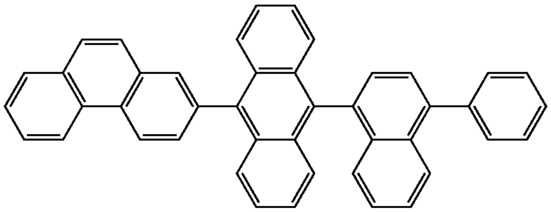
1-65
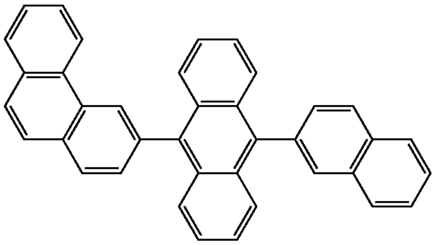
1-66
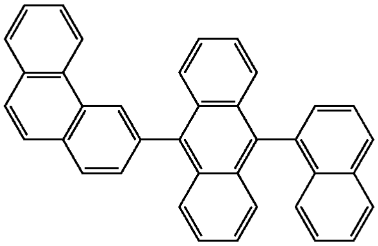
1-67
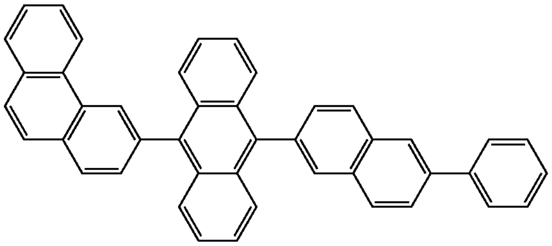
1-68
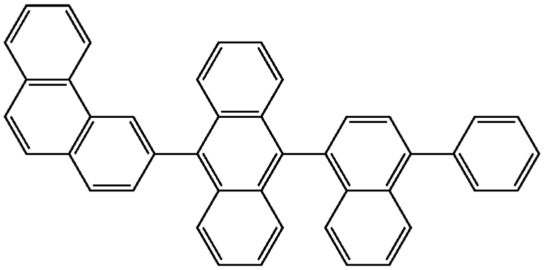
1-69
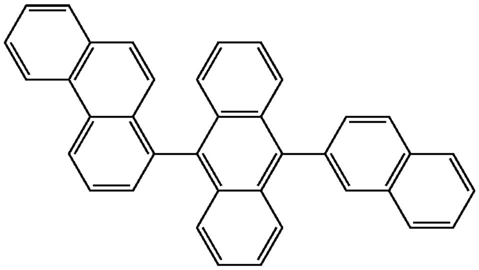
1-70
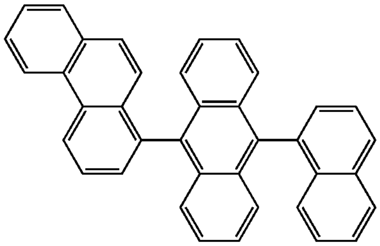
1-71
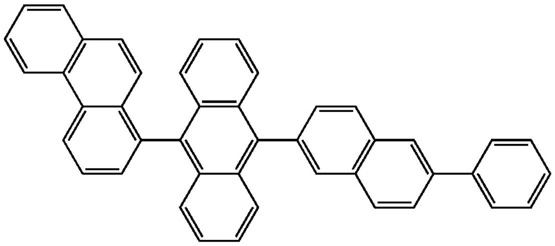
1-72
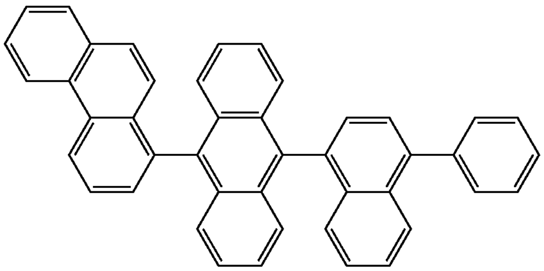
1-73
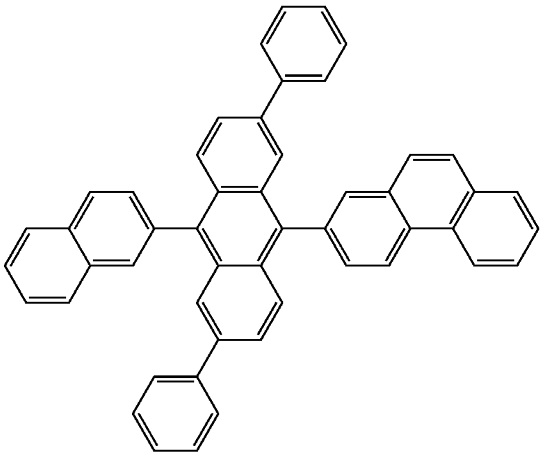

-continued
1-74
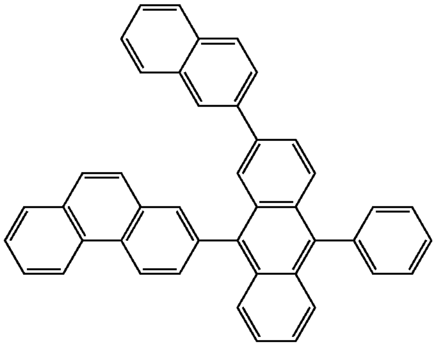
1-75
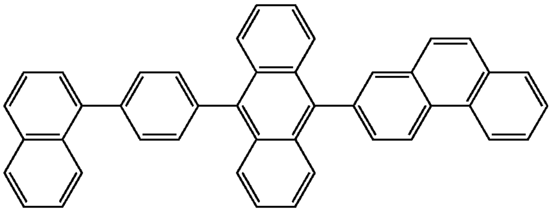
1-76
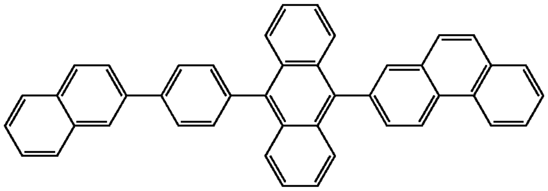
1-77
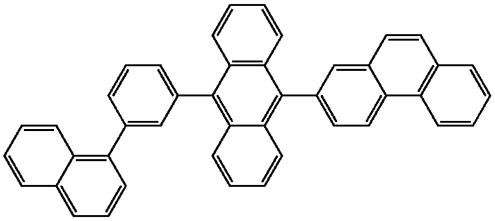
1-78
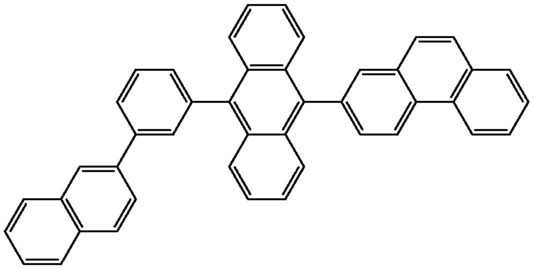
1-79
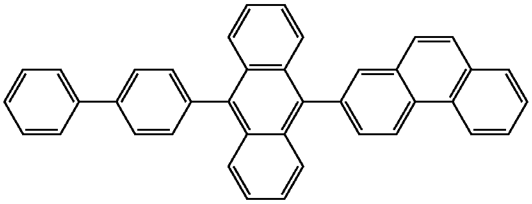
1-80
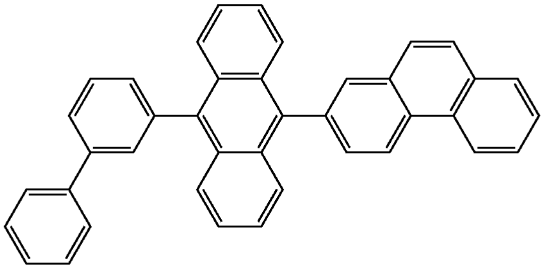
1-81
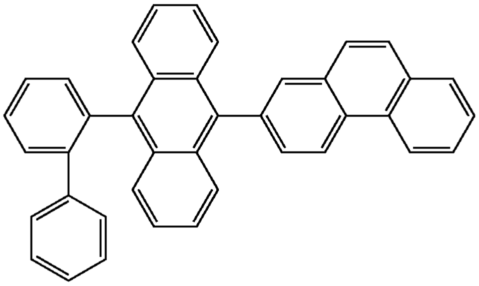
1-82
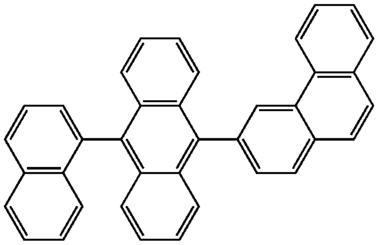
1-83
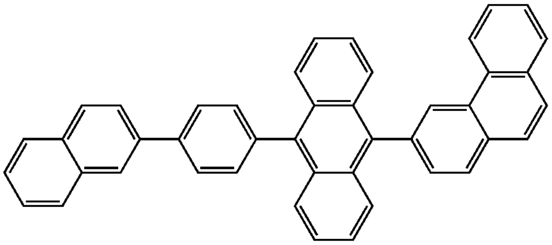

-continued
1-84
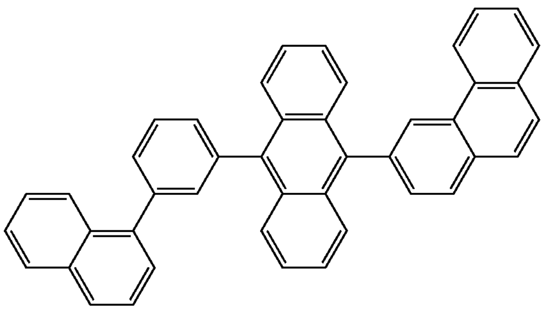
1-85
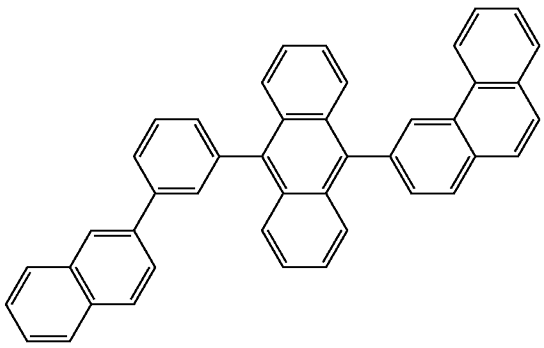
1-86
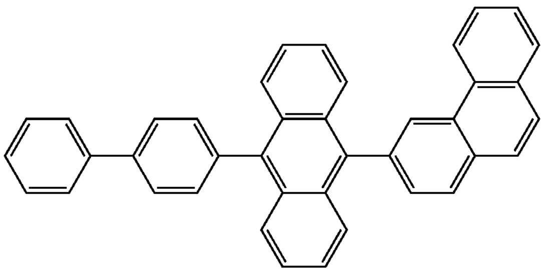
1-87
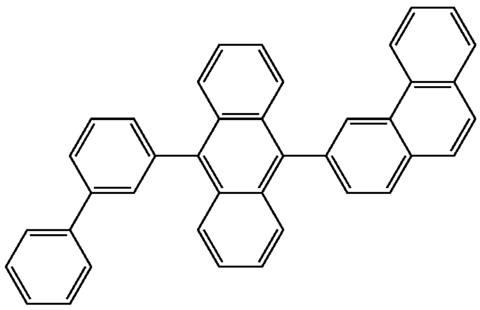
1-88
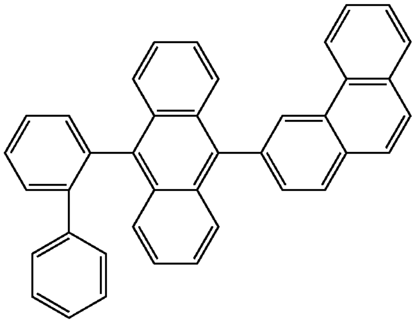
1-89
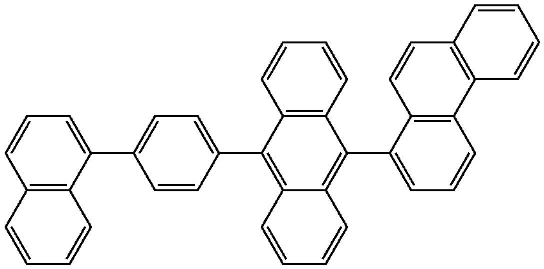
1-90
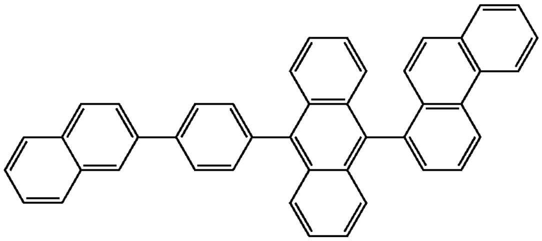
1-91
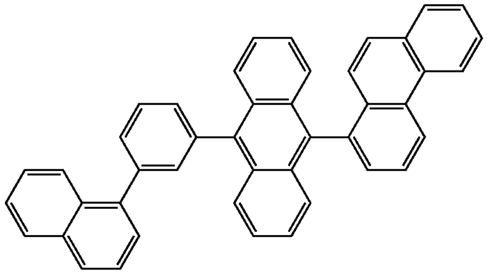

-continued
1-92
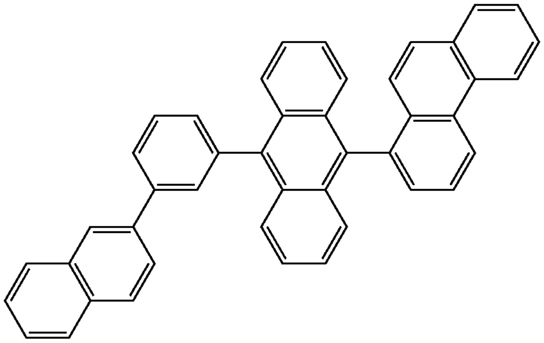
1-93
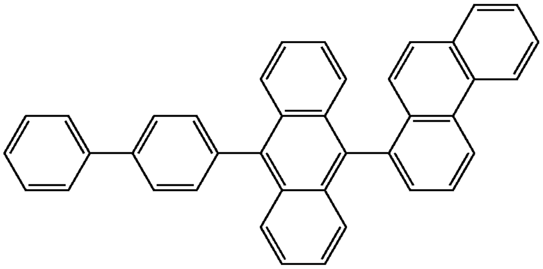
1-94
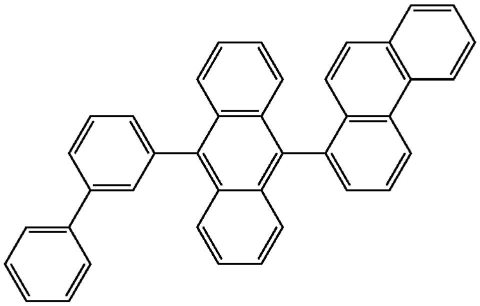
1-95
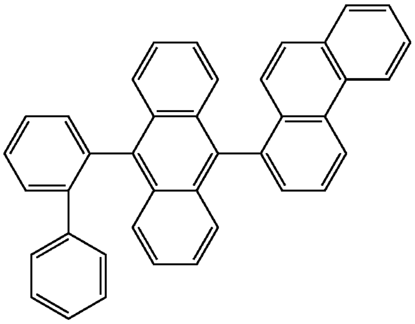
2-1
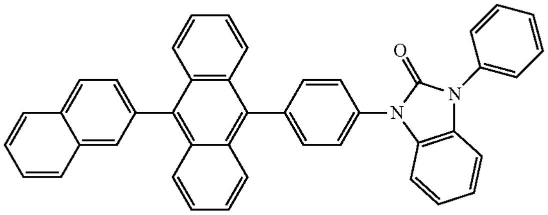
2-2
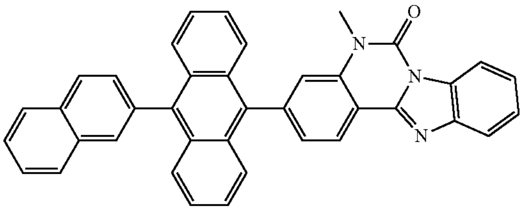
2-4
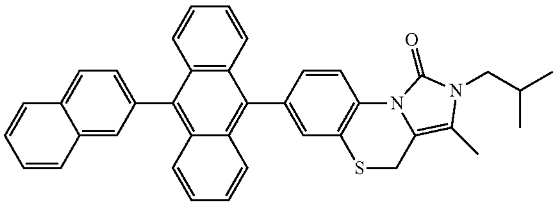
2-3
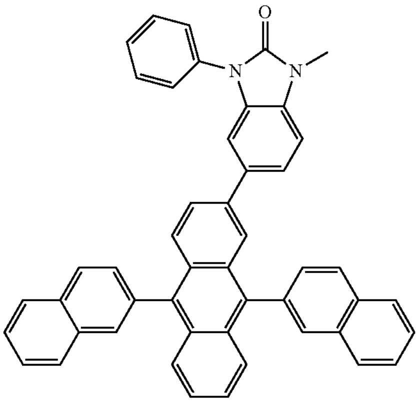

-continued
2-5
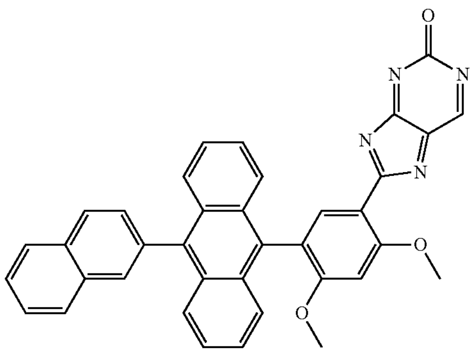
2-6
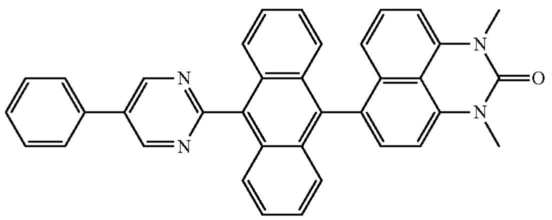
2-7
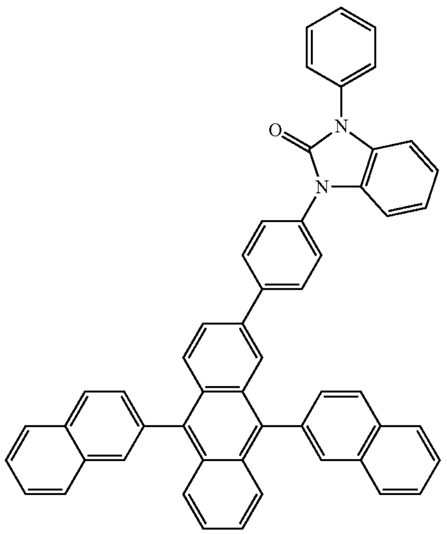
2-8
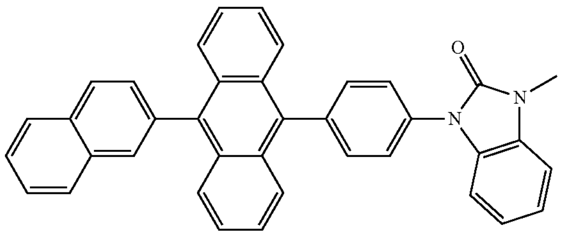
2-9
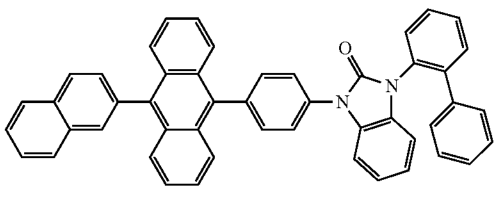
2-10
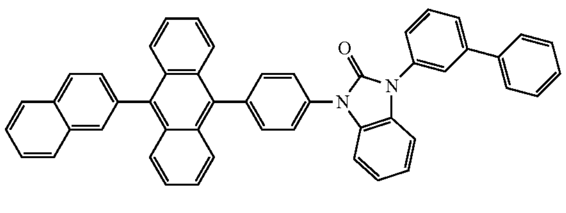
2-11
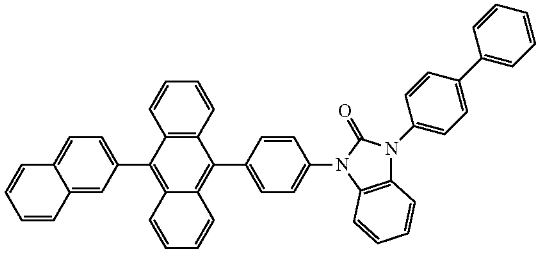
2-12
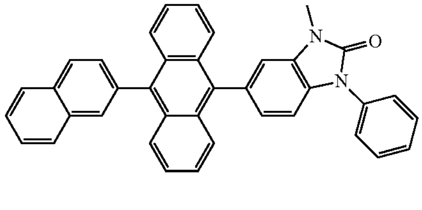

-continued 2-13

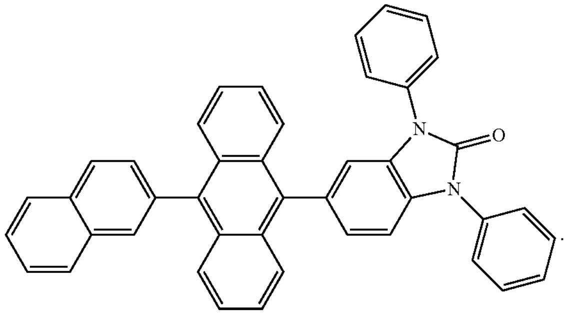

The third compound in the electron control layer may include a compound represented by Formula 1 but exclude a compound represented by Formula 2; may exclude a compound represented by Formula 1 and include a compound represented by Formula 2; and/or may include a compound represented by Formula 1 and a compound represented by Formula 2.

In some embodiments, the third compound may be the same as the first compound. Accordingly, the electron control layer and the emission layer may include the same compound at the same time.

In some embodiments, the third compound may be the same as the second compound. Accordingly, the electron control layer and the electron transport layer may include the same compound at the same time.

In some embodiments, the first compound in the emission layer may be a host, and the emission layer may further include a dopant.

The electron control layer and the emission layer may directly contact each other; the electron control layer may directly contact the electron transport layer; and/or the electron control layer may directly contact both the emission layer and the electron transport layer.

In some embodiments, the electron transport region may further include an electron injection layer between the electron transport layer and the second electrode. However, embodiments of the present disclosure are not limited thereto.

In some embodiments, the electron transport layer may further include a metal-containing material, in addition to the second compound. For example, the metal-containing material may include a Li complex. The Li complex may include, for example, compound ET-D1 (lithium quinolate, LiQ) or compound ET-D2.

ET-D1

-continued

ET-D2

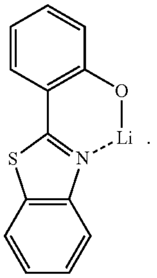

In some embodiments, a weight ratio of the second compound to the metal-containing material may be about 1:99 to about 80:20. For example, a weight ratio of the second compound to the metal-containing material may be about 1:1.

As described above, in one or more embodiments of the organic light-emitting device, the emission layer may include a first compound selected from the compounds represented by Formula 1, the electron transport layer may include a second compound selected from the compounds represented by Formula 2, and the electron control layer between the emission layer and the electron transport layer may include a third compound selected from the compounds of Formula 1 and the compounds of Formula 2, the third compound being the same as the first compound in the emission layer and/or the second compound in the electron transport layer, so that injection balance of holes and electrons in the emission layer may be achieved, and consequently the organic light-emitting device may have improved driving voltage, efficiency, and lifetime characteristics.

Hereinafter, a structure of an organic light-emitting device according to an embodiment of the present disclosure and a method of manufacturing the same will now be described with reference to FIG. 1.

FIG. 1 is a schematic cross-sectional view of an organic light-emitting device 10 according to an embodiment of the present disclosure. Referring to FIG. 1, the organic light-emitting device 10 may have a stacked structure of a first electrode 110, a hole transport region 130, an emission layer (EML) 150, an electron transport region 170, and a second electrode 190 that are sequentially stacked upon one another in the stated order. The electron transport region 170 may include an electron control layer. The electron control layer may directly contact the EML 150.

A substrate may be under the first electrode 110 and/or on the second electrode 190 in FIG. 1. The substrate may be a glass and/or transparent plastic substrate with good mechanical strength, thermal stability, transparency, surface smoothness, ease of handling, and/or water resistance.

For example, the first electrode 110 may be formed by depositing and/or sputtering a first electrode-forming material on the substrate. When the first electrode 110 is an anode, a material having a high work function may be used as the first electrode-forming material so as to facilitate hole injection. The first electrode 110 may be a reflective electrode, a semi-transmissive electrode, and/or a transmissive electrode. Transparent and conductive materials such as ITO, IZO, $SnO_2$, and/or ZnO may be used to form the first electrode. The first electrode 110 as a semi-transmissive electrode and/or a reflective electrode may be formed of at least one material selected from magnesium (Mg), aluminum (Al), aluminum-lithium (Al—Li), calcium (Ca), magnesium-indium (Mg—In), and magnesium-silver (Mg—Ag).

The first electrode 110 may have a single-layer structure and/or a multi-layer structure including a plurality of layers. For example, the first electrode 110 may have a three-layered structure of ITO/Ag/ITO, but embodiments of the present disclosure are not limited thereto.

Holes injected from the first electrode 110 may move into the emission layer 150 through the hole transport region 130.

The hole transport region 130 may have a single-layer structure and/or a multi-layer structure including at least two layers. The hole transport region 130 may include a single material and/or at least two different materials.

The hole transport region 130 may have a stacked structure of hole injection layer/hole transport layer, hole injection layer/hole transport layer/hole auxiliary layer, hole injection layer/hole transport layer/buffer layer/hole auxiliary layer, hole injection layer/hole auxiliary layer, hole injection layer/buffer layer/hole auxiliary layer, hole transport layer/hole auxiliary layer, and/or hole transport layer/buffer layer/hole auxiliary layer, wherein the layers forming each stacked structure of the hole transport region 130 may be sequentially stacked on the first electrode 110 in the stated order. However, embodiments of the present disclosure are not limited thereto. For example, the hole transport region 130 may include only a hole injection layer (HIL), and/or only a hole transport layer (HTL).

When the hole transport region 130 includes a HIL, the HIL may be formed on the first electrode 110 using any suitable method, for example, by using vacuum deposition, spin coating, casting, Langmuir-Blodgett (LB) deposition, inkjet printing, laser printing, laser induced thermal imaging (LITI), and/or the like.

When the HIL is formed using vacuum deposition, the deposition conditions may vary depending on the material that is used to form the HIL and the structure of the HIL. For example, the deposition conditions may include a deposition temperature of about 100° C. to about 500° C., a degree of vacuum of about $10^{-8}$ to about $10^{-3}$ torr, and a deposition rate of about 0.01 to 100 Å/sec.

When the HIL is formed using spin coating, the coating conditions may vary depending on the material that is used to form the HIL and the structure of the HIL. For example, the coating conditions may include a coating rate of about 2,000 rpm to about 5,000 rpm and a heat treatment temperature of about 80° C. to about 200° C.

The HTL, the hole auxiliary layer, and the buffer layer may be formed in a similar manner as the HIL described above.

In some embodiments, the hole transport region 130 may include at least one selected from m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrenesulfonate)(PEDOT/PSS), polyaniline/camphor sulfonic acid (PANI/CSA), polyaniline/poly(4-styrenesulfonate) (PANI/PSS), a compound represented by Formula 201, and a compound represented by Formula 202.

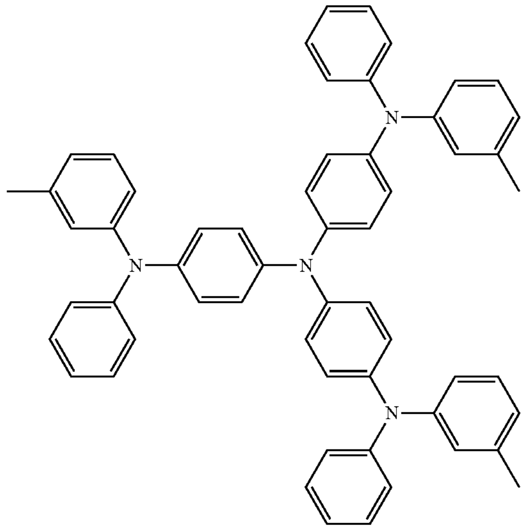

m-MTDATA

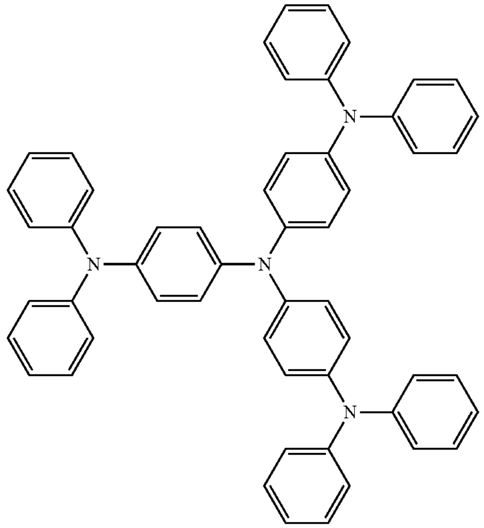

TDATA

-continued
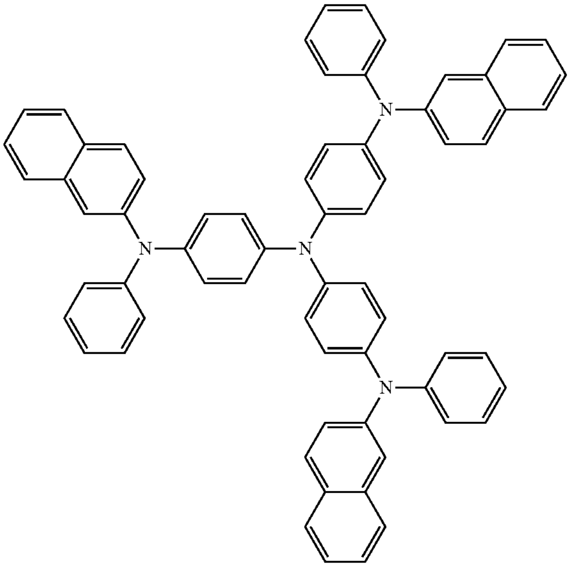
2-TNATA
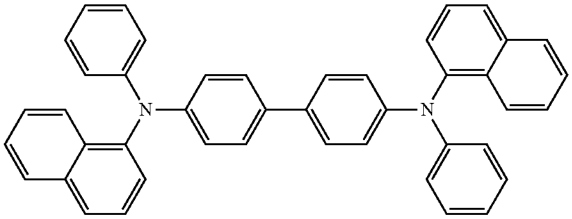
NPB
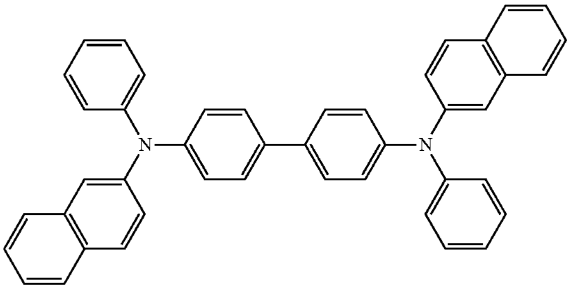
β-NPB
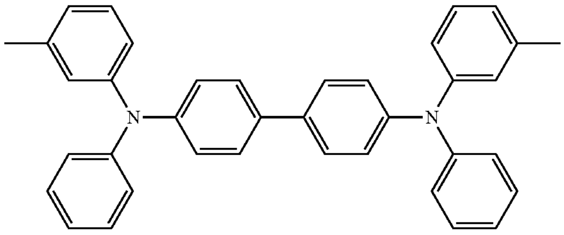
TPD
-continued
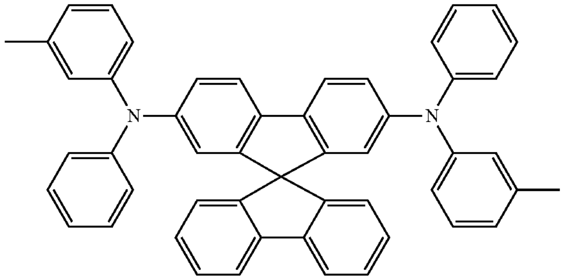
Spiro-TPD
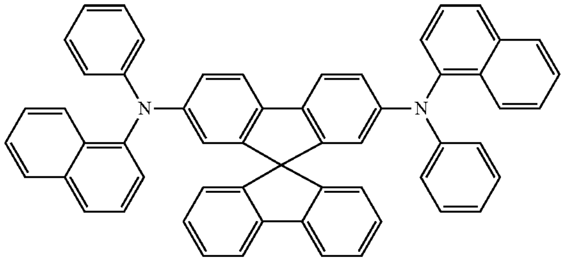
Spiro-NPB
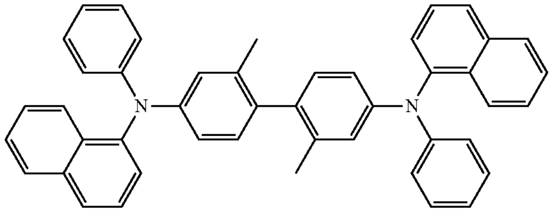
methylated NPB
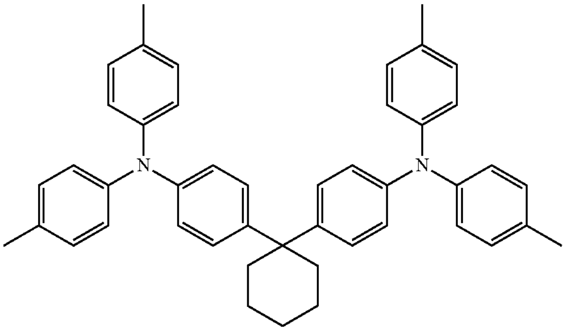
TAPC
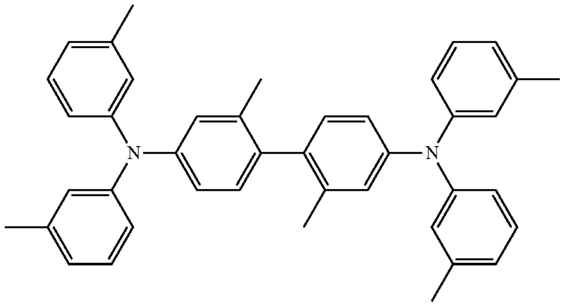
HMTPD -continued

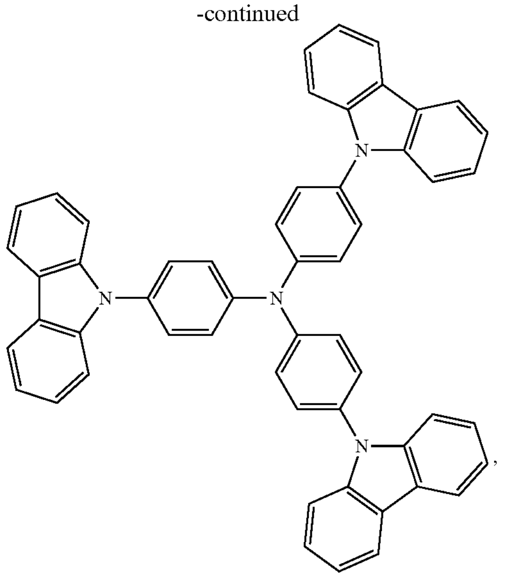

TCTA

Formula 201

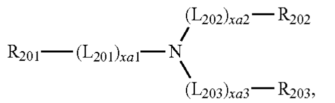

Formula 202

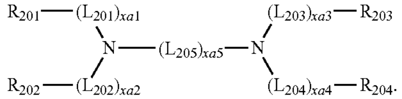

In Formulae 201 and 202, $L_{201}$ to $L_{205}$ may each independently be the same as described herein in connection with $L_1$ to $L_3$ in Formula 1;

xa1 to xa4 may each independently be selected from 0, 1, 2, and 3;

xa5 may be selected from 1, 2, 3, 4, and 5;

$R_{201}$ to $R_{204}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formulae 201 and 202, $L_{201}$ to $L_{205}$ may each independently be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may each independently be selected from 0, 1, and 2;

xa5 may be 1, 2, or 3;

$R_{201}$ to $R_{204}$ may each independently be selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group. However, embodiments of the present disclosure are not limited thereto.

The compound of Formula 201 may be further represented by Formula 201A.

Formula 201A

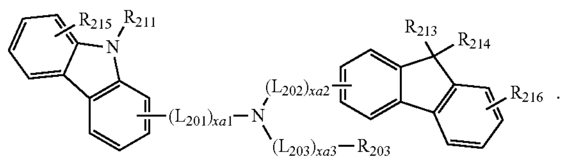

In some embodiments, the compound of Formula 201 may be further represented by Formula 201A-1, but embodiments of the present disclosure are not limited thereto.

Formula 201A-1

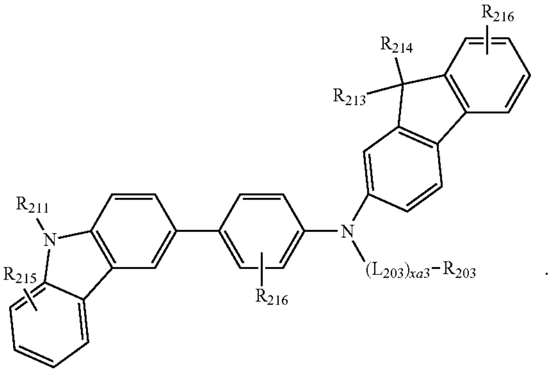

The compound of Formula 202 may be further represented by Formula 202A, but embodiments of the present disclosure are not limited thereto.

Formula 202A

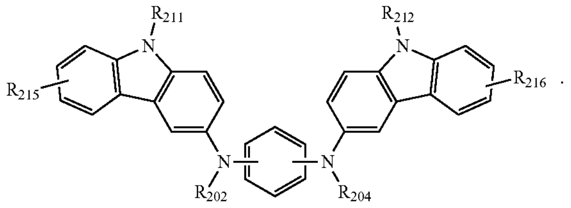

In Formulae 201A, 201A-1, and 202A, $L_{201}$ to $L_{203}$, xa1 to xa3, xa5, and $R_{202}$ to $R_{204}$ may be the same as described earlier herein in conjunction with Formulae 201 and 202;

$R_{211}$ and $R_{212}$ may be the same as described earlier herein in conjunction with $R_{203}$ in Formulae 201 and 202; and $R_{213}$ to $R_{216}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$aryloxy group, a $C_6$-$C_{60}$arylthio group, a $C_1$-$C_{60}$ heteroaryl group, a monovalent non-aromatic condensed polycyclic group, and a monovalent non-aromatic condensed heteropolycyclic group.

For example, in Formulae 201A, 201A-1, and 202A, $L_{201}$ to $L_{203}$ may each independently be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may each independently be selected from 0 and 1;

$R_{203}$, $R_{204}$, $R_{211}$, and $R_{212}$ may each independently be selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, carboxylic acid a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may each independently be selected from:

a $C_1$-$C_{20}$ alkyl group and a $C_1$-$C_{20}$ alkoxy group, a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may each independently be selected from:
hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group, and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be selected from 1 and 2.

For example, in Formulae 201A and 201A-1, $R_{213}$ and $R_{214}$ may be linked (e.g., coupled) to each other to form a saturated or unsaturated ring.

The compound represented by Formula 201, and the compound represented by Formula 202 may include compounds HT1 to HT20, but embodiments of the present disclosure are not limited thereto:

HT1

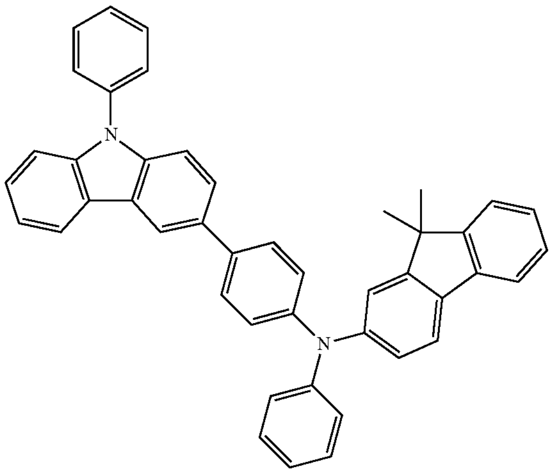

-continued
HT2
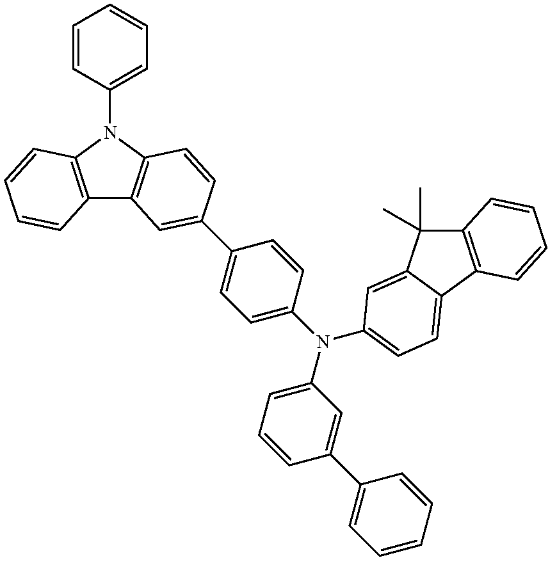
HT3
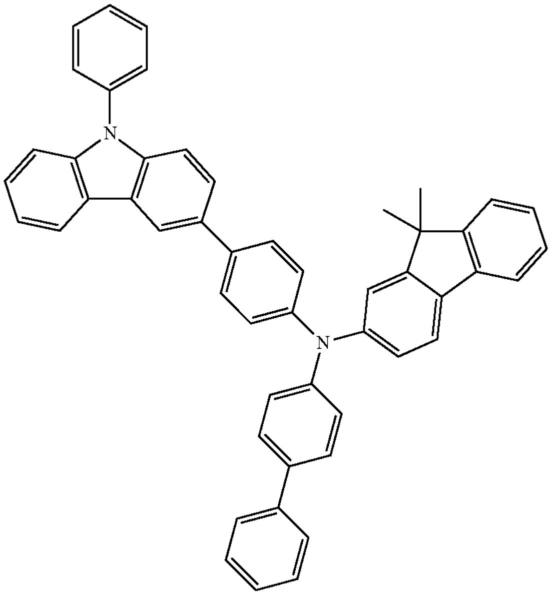
-continued
HT4
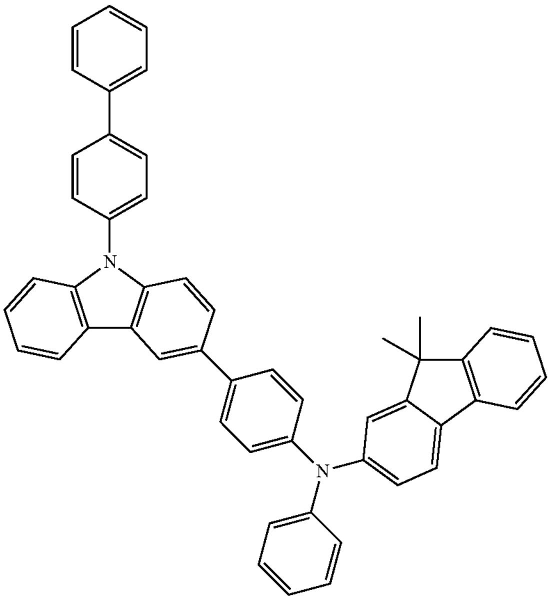
HT5
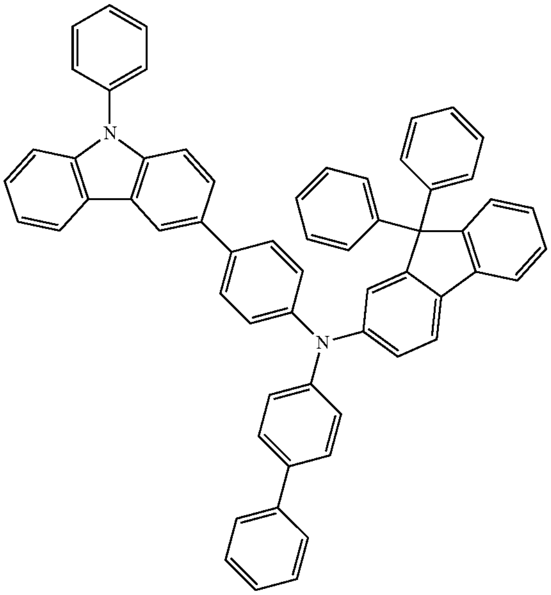

-continued
HT6
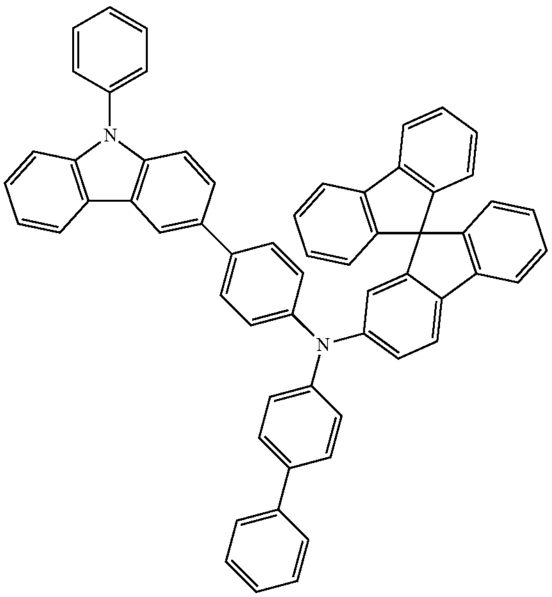
HT7
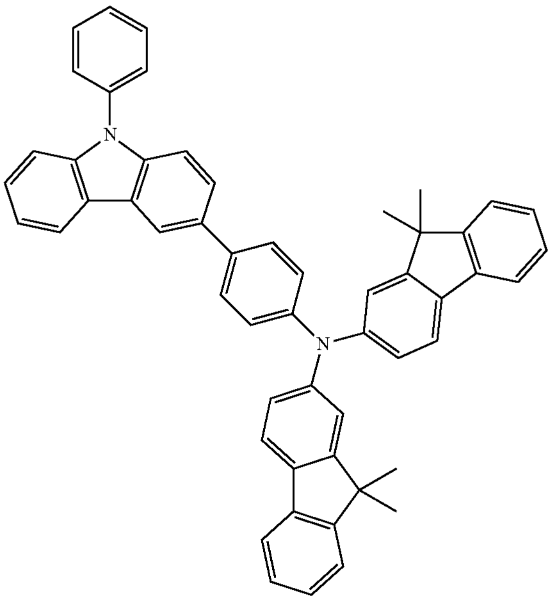
-continued
HT8
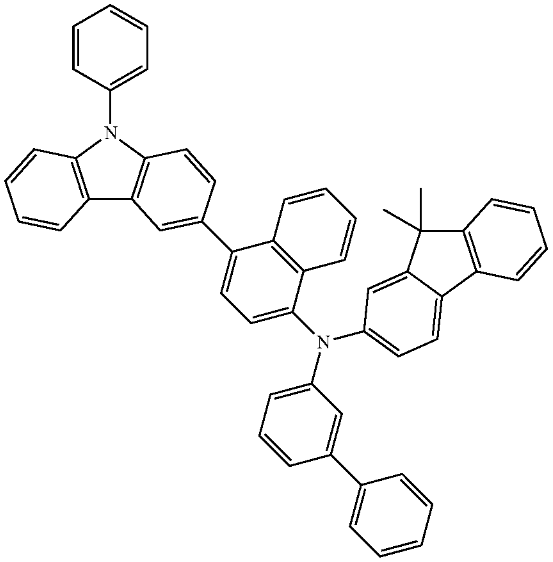
HT9
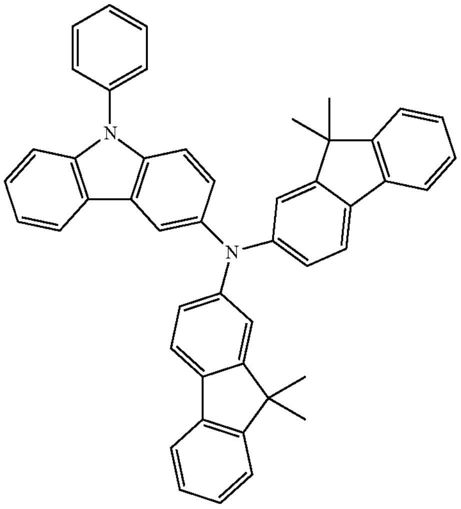

-continued
HT10
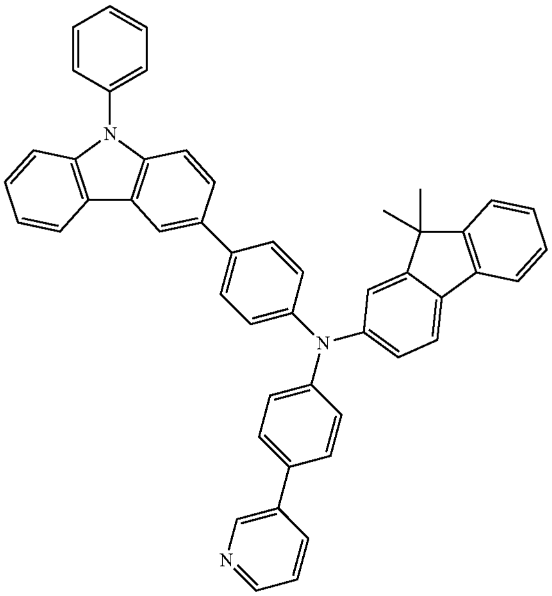
HT11
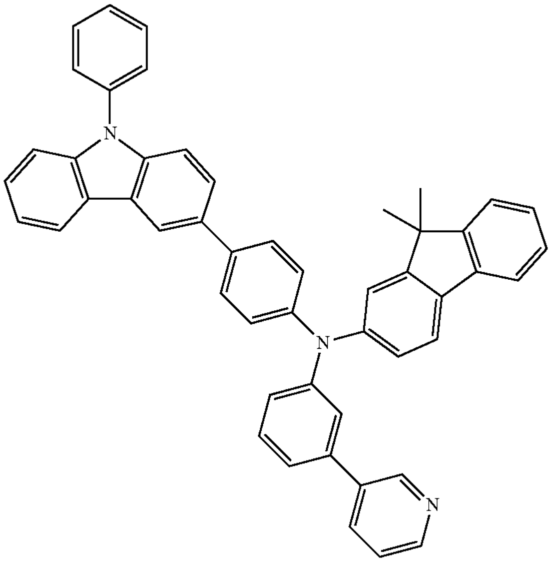
-continued
HT12
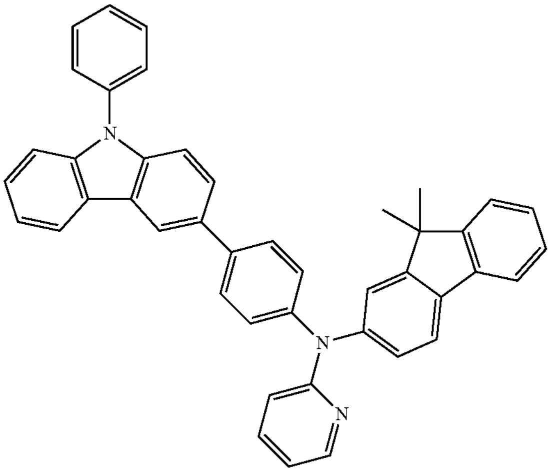
HT13
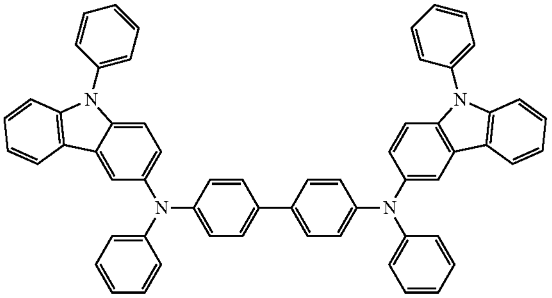
HT14
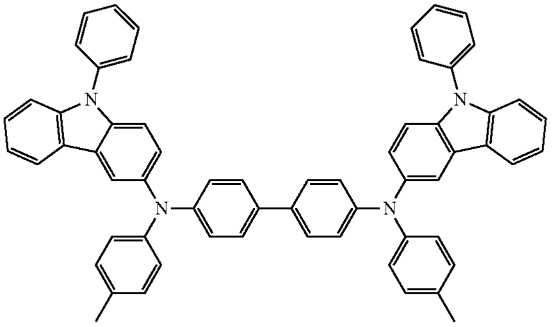
HT15
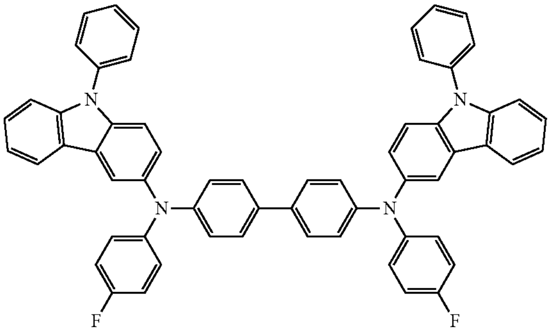

-continued

HT16

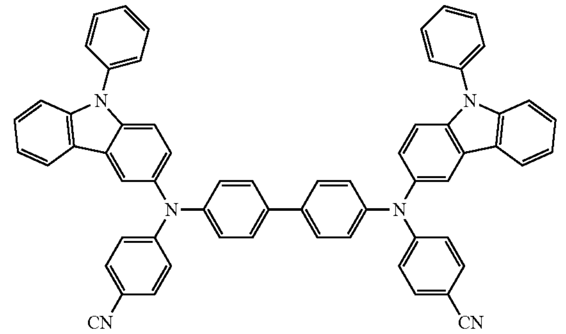

HT17

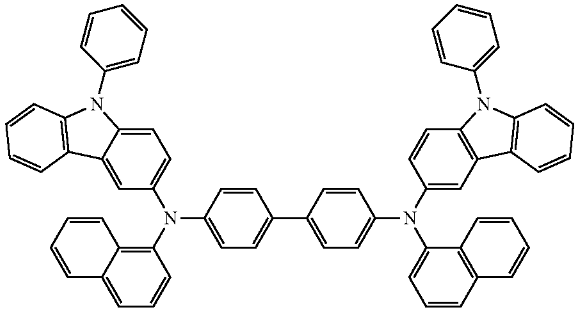

HT18

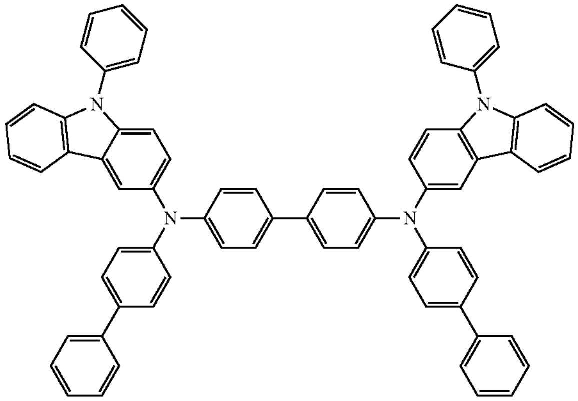

HT19

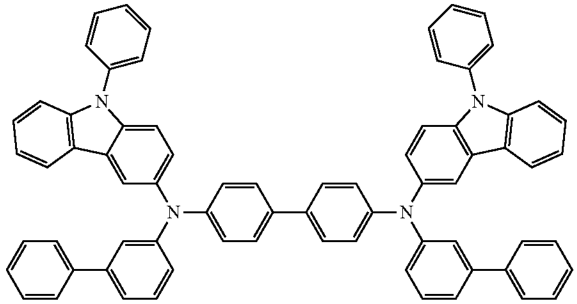

-continued

HT20

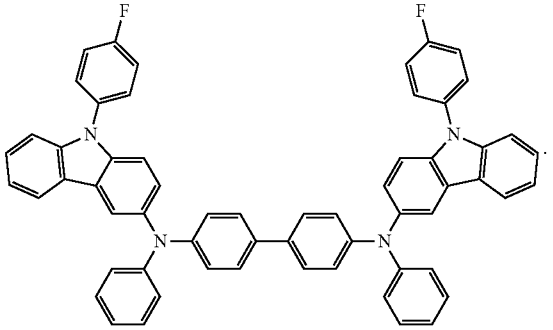

The thickness of the hole transport region 130 may be about 100 Å to about 10,000 Å, and in some embodiments, about 100 Å to about 1,000 Å. When the hole transport region 130 includes at least one selected from a HIL and a HTL, the thickness of the HIL may be about 100 Å to about 10,000 Å, and in some embodiments, about 100 Å to about 1,000 Å; the thickness of the HTL may be about 50 Å to about 2,000 Å, and in some embodiments, about 100 Å to about 1,500 Å. When the thicknesses of the hole transport region 130, the HIL, and the HTL are within any of these ranges, satisfactory hole transport characteristics may be obtained without a substantial increase in driving voltage.

The hole transport region 130 may further include a charge-generating material to improve conductivity, in addition to the materials as described above. The charge-generating material may be homogeneously or inhomogeneously dispersed in the hole transport region.

The charge-generating material may include, for example, a p-dopant. The p-dopant may be selected from quinone derivatives, metal oxides, and compounds with a cyano group, but embodiments of the present disclosure are not limited thereto. Non-limiting examples of the p-dopant may include quinone derivatives such as tetracyanoquinonedimethane (TCNQ), Compound HT-D2, and/or the like; metal oxides such as tungsten oxide, molybdenum oxide, and/or the like; and Compound HT-D1.

Compound HT-D1

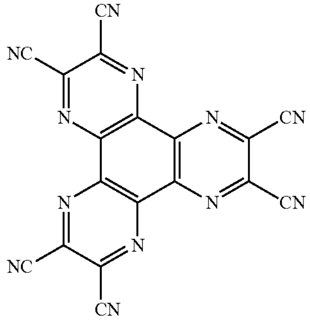

Compound HT-D2

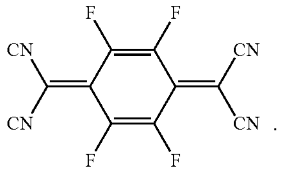

The hole transport region 130 may further include, in addition to the HIL and HTL described above, at least one selected from a buffer layer and an electron blocking layer (EBL). The buffer layer may compensate for an optical resonance distance of light according to a wavelength of the light emitted from the EML (e.g., be used to adjust the optical resonance distance to match the wavelength of light emitted from the emission layer), and thus may improve light-emission efficiency. The material in the buffer layer may be any suitable material used in the hole transport region. The EBL may block or reduce migration of electrons from the electron transport region into the EML.

When the hole transport region 130 include a HTL, the HTL may directly contact the EML 150. However, embodiments of the present disclosure are not limited thereto.

The EML 150 may be formed on the hole transport region 130 using one or more suitable methods, for example, using vacuum deposition, spin coating, casting, Langmuir-Blodgett (LB) deposition, inkjet printing, laser printing, laser induced thermal imaging (LITI), and/or the like. When the EML 150 is formed using vacuum deposition and/or spin coating, the deposition and coating conditions for forming the EML 150 may be similar to the above-described deposition and coating conditions for forming the HIL, and will not be described again.

When the organic light-emitting device 10 is a full color organic light-emitting device, the EML 150 may be patterned into a red emission layer, a green emission layer, and/or a blue emission layer to correspond to individual subpixels. In some embodiments, the EML 150 may have a structure in which a red emission layer, a green emission layer and/or a blue emission layer are stacked upon one another, and/or a structure including a mixture of a red light-emitting material, a green light-emitting material, and a blue light-emitting material, and thus may emit white light.

The EML 150 in FIG. 1 may include a dopant, in addition to the above-described first compound as a host.

The dopant in the EML 150 may include a phosphorescent dopant and/or a fluorescent dopant.

The phosphorescent dopant may include an organometallic complex represented by Formula 401:

Formula 401

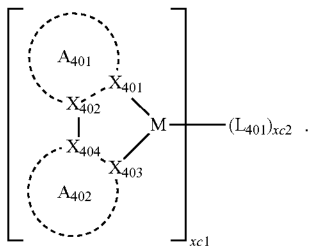

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may each independently be selected from nitrogen (N) or carbon (C);

rings $A_{401}$ and $A_{402}$ may each independently be selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene;

at least one substituent of the substituted benzene, the substituted naphthalene, the substituted fluorene, the substituted spiro-fluorene, the substituted indene, the substituted pyrrole, the substituted thiophene, the substituted furan, the substituted imidazole, the substituted pyrazole, the substituted thiazole, the substituted isothiazole, the substituted oxazole, the substituted isoxazole, the substituted pyridine, the substituted pyrazine, the substituted pyrimidine, the substituted pyridazine, the substituted quinoline, the substituted isoquinoline, the substituted benzoquinoline, the substituted quinoxaline, the substituted quinazoline, the substituted carbazole, the substituted benzimidazole, the substituted benzofuran, the substituted benzothiophene, the substituted isobenzothiophene, the substituted benzoxazole, the substituted isobenzoxazole, the substituted triazole, the substituted oxadiazole, the substituted triazine, the substituted dibenzofuran, and the substituted dibenzothiophene may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{401})(Q_{402})$, —$Si(Q_{403})(Q_{404})(Q_{405})$, and —$B(Q_{406})(Q_{407})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{411})(Q_{412})$, —$Si(Q_{413})(Q_{414})(Q_{415})$, and —$B(Q_{416})(Q_{417})$, and —$N(Q_{421})(Q_{422})$, —$Si(Q_{423})(Q_{424})(Q_{425})$, and —$B(Q_{426})(Q_{427})$, $L_{401}$ may be an organic ligand, xc1 may be selected from 1, 2, and 3, and xc2 may be selected from 0, 1, 2, and 3, wherein $Q_{401}$ to $Q_{407}$, $Q_{411}$ to $Q_{417}$ and $Q_{421}$ to $Q_{427}$ may each independently be selected from hydrogen, a $C_1$-$C_{60}$ alkyl group, a $C_2$-$C_{60}$alkenyl group, a $C_6$-$C_{60}$ aryl group, and a $C_1$-$C_{60}$ heteroaryl group.

For example, in Formula 401, $L_{401}$ may be a monovalent, divalent, and/or trivalent organic ligand. For example, $L_{401}$ in Formula 401 may be selected from a halogen ligand (for example, Cl and/or F), a diketone ligand (for example, acetylacetonate, 1,3-diphenyl-1,3-propanedionate, 2,2,6,6-tetramethyl-3,5-heptanedionate, and/or hexafluoroacetonate), a carboxylic acid ligand (for example, picolinate, dimethyl-3-pyrazolecarboxylate, and/or benzoate), a carbon monoxide ligand, an isonitrile ligand, a cyano ligand, and a phosphorous ligand (for example, phosphine and/or phosphite). However, embodiments of the present disclosure are not limited thereto.

When $A_{401}$ in Formula 401 has at least two substituent groups, the substituent groups of $A_{401}$ may be linked (e.g., coupled) to each other to form a saturated or unsaturated ring.

When $A_{402}$ in Formula 401 has at least two substituent groups, the substituent groups of $A_{402}$ may be linked (e.g., coupled) to each other to form a saturated or unsaturated ring.

When xc1 in Formula 401 is 2 or greater, a plurality of ligands

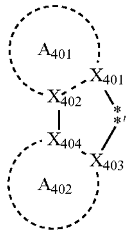

in Formula 401 may be identical to or different from each other. When xc1 in Formula 401 is 2 or greater, $A_{401}$ and/or $A_{402}$ of one ligand may be linked (e.g., coupled) to a respective $A_{401}$ and/or $A_{402}$ of another adjacent ligand, either directly (e.g., via a bond such as a single bond) or via a linking group (for example, a $C_1$-$C_5$ alkylene group, —N(R')— (where R' is a $C_1$-$C_{10}$ alkyl group and/or a $C_6$-$C_{20}$ aryl group), and/or C(═O)—).

The phosphorescent dopant may include at least one selected from Compounds PD1 to PD76, but embodiments of the present disclosure are not limited thereto.

PD1

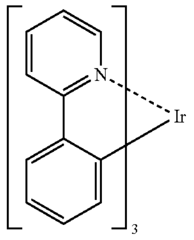

PD2

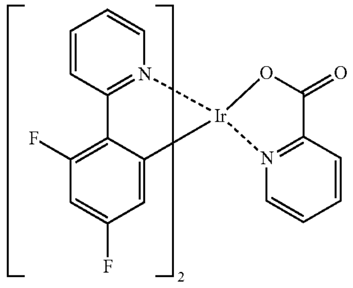

PD3

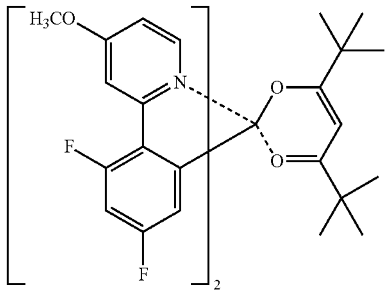

PD4

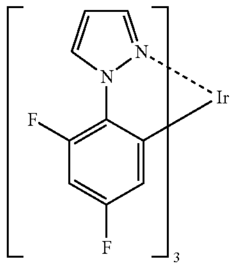

-continued
PD5
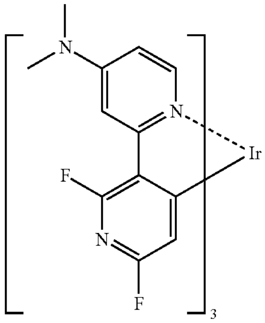
PD6
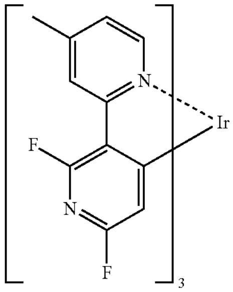
PD7
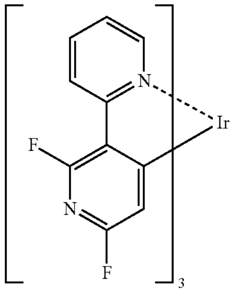
PD8
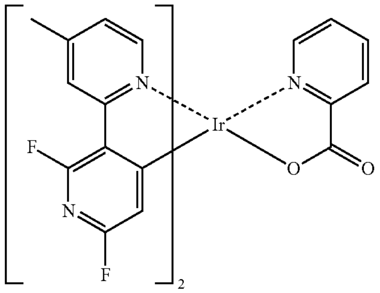
PD9
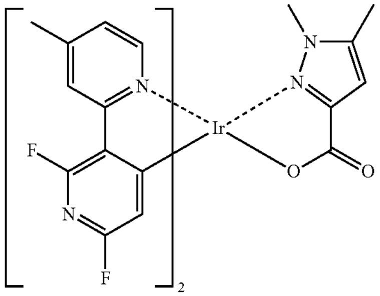
-continued
PD10
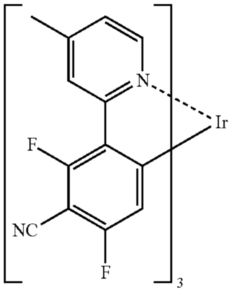
PD11
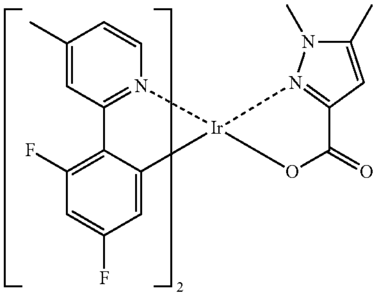
PD12
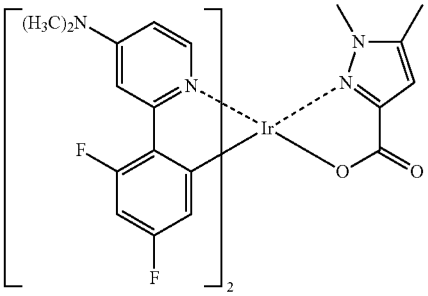
PD13
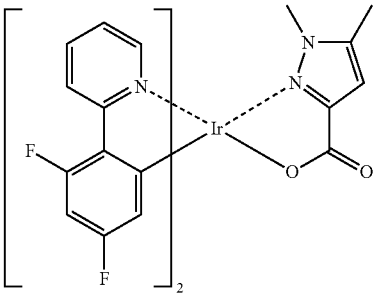
PD14
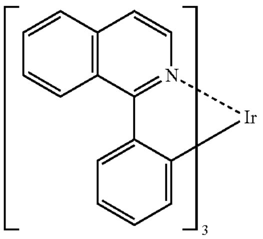

-continued
PD15
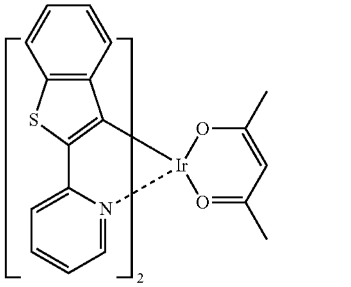
PD16
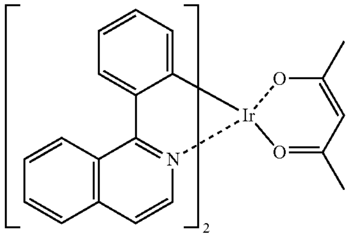
PD17
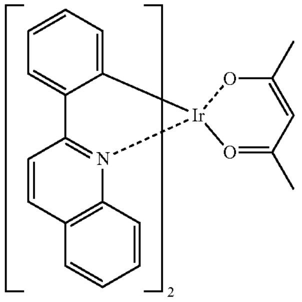
PD18
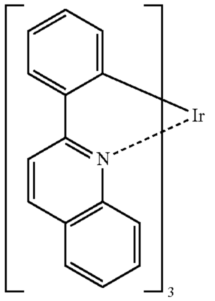
PD19
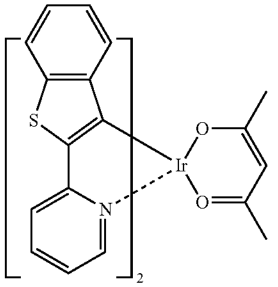
-continued
PD20
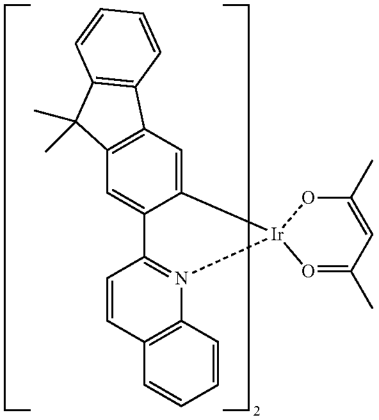
PD21
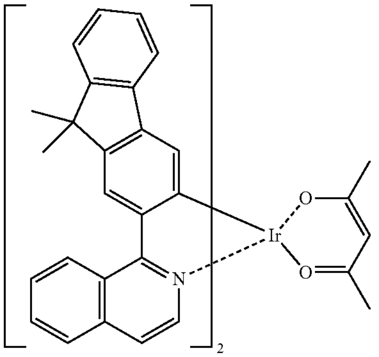
PD22
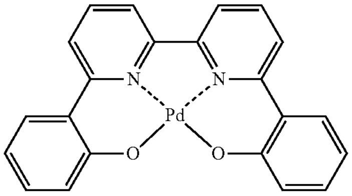
PD23
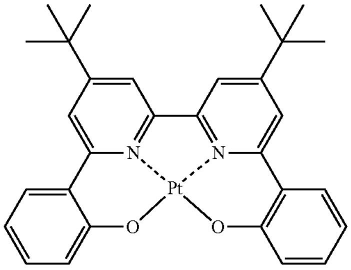
PD24
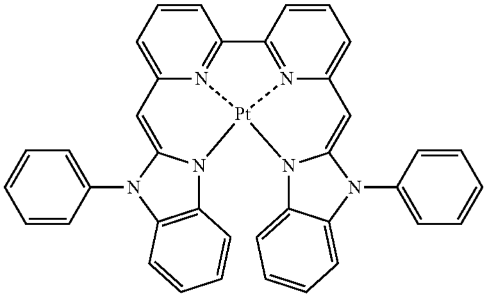

-continued
PD25
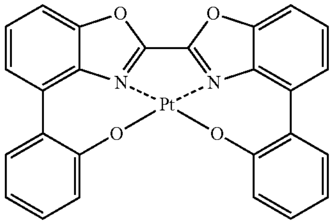
PD26
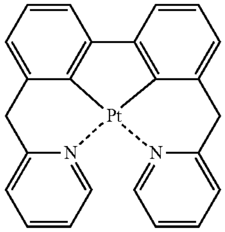
PD27
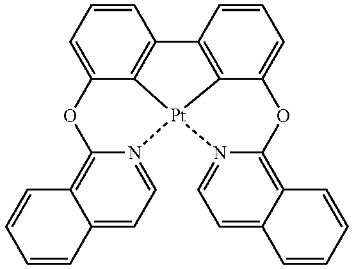
PD28
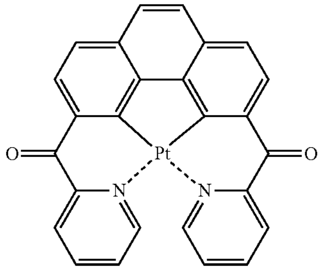
PD29
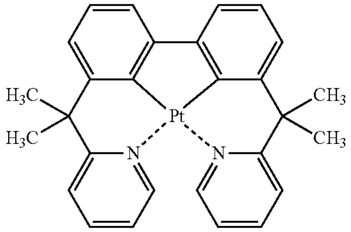
PD30
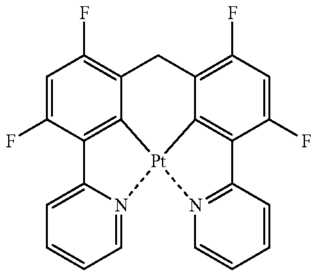
-continued
PD31
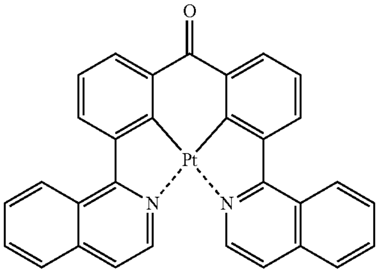
PD32
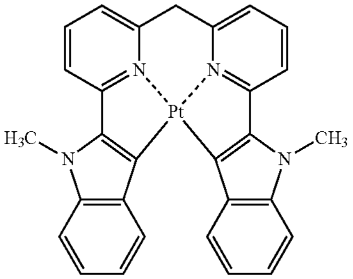
PD33
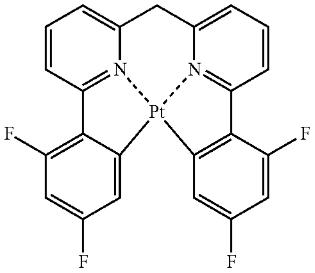
PD34
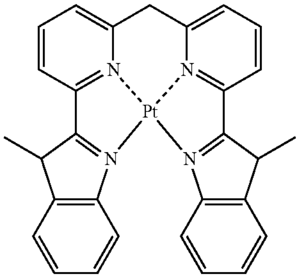
PD35
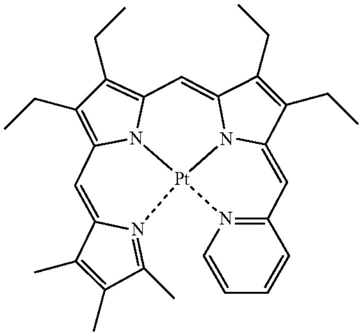

-continued
PD36
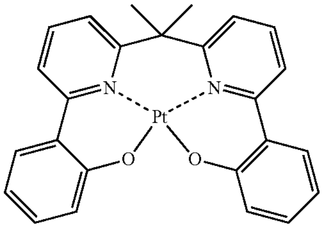
PD37
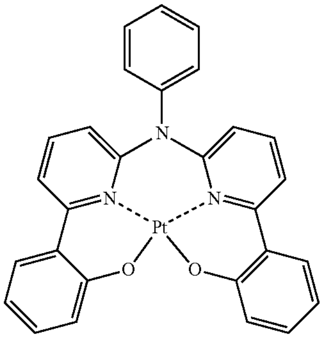
PD38
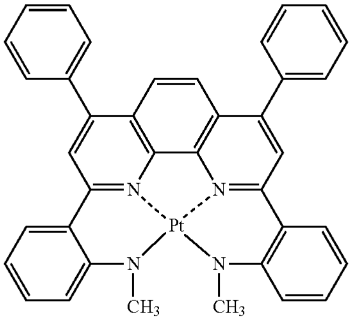
PD39
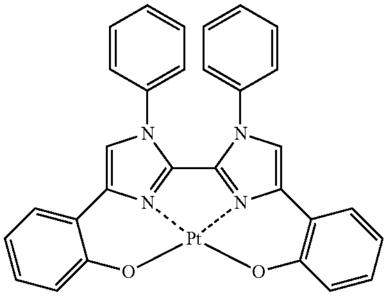
PD40
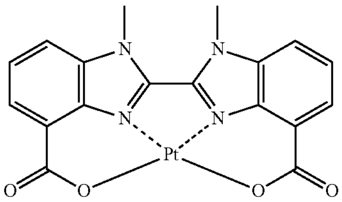
PD41
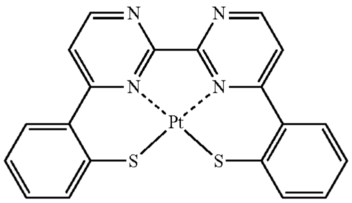
-continued
PD42
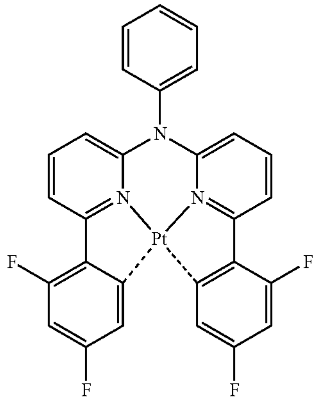
PD43
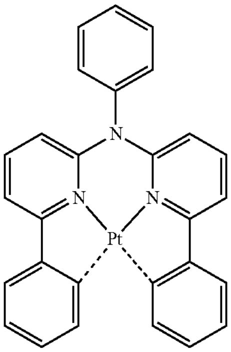
PD44
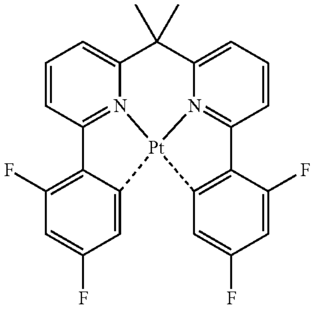
PD45
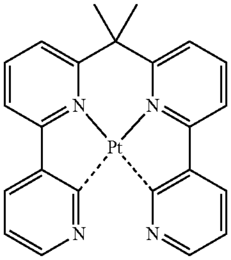
PD46
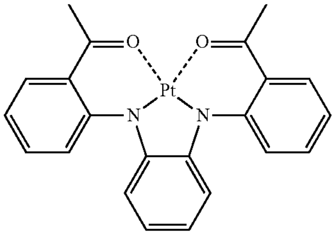

-continued
PD47
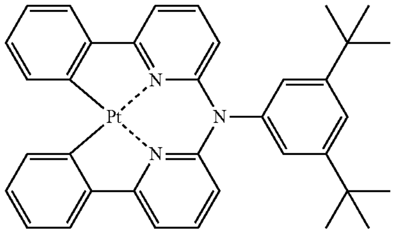
PD48
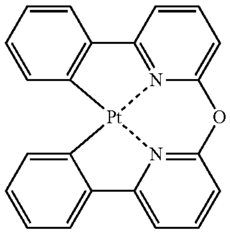
PD49
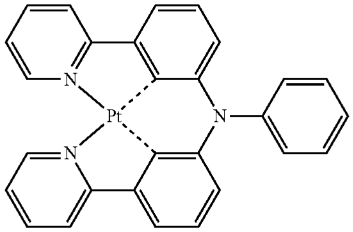
PD50
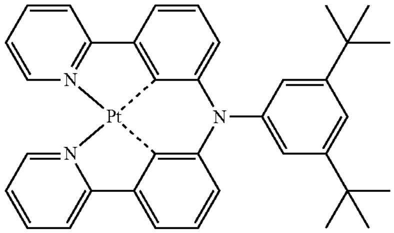
PD51
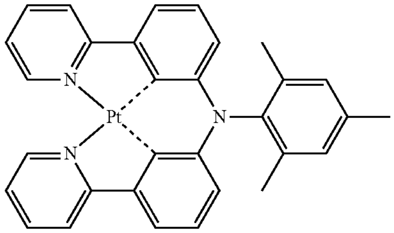
PD52
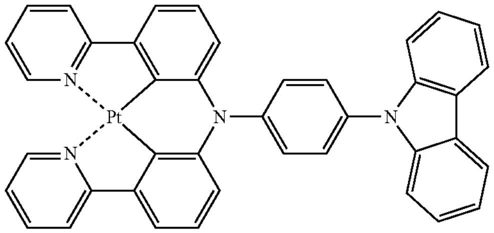
-continued
PD53
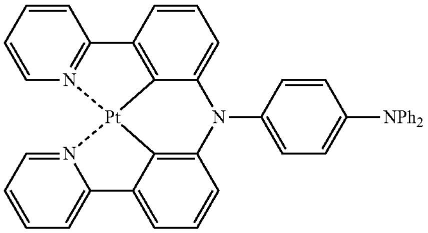
PD54
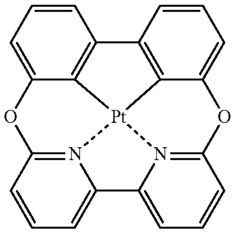
PD55
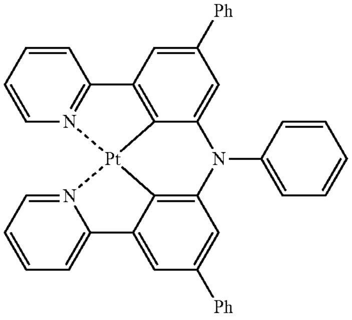
PD56
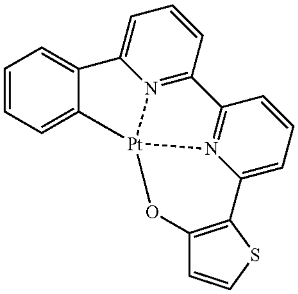
PD57
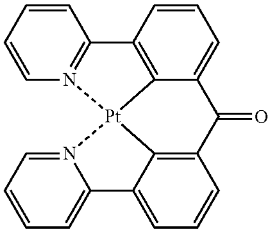

-continued
PD58
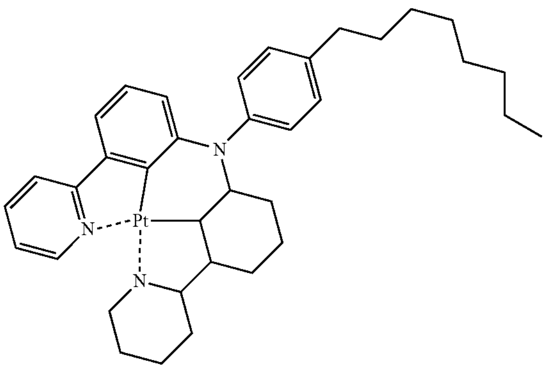
PD59
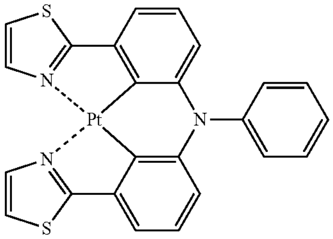
PD60
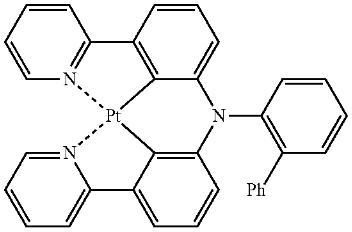
PD61
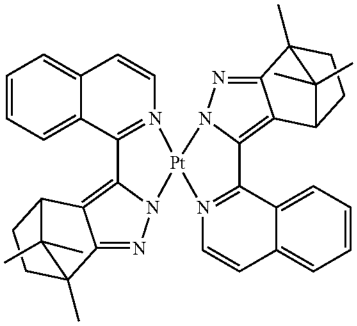
PD62
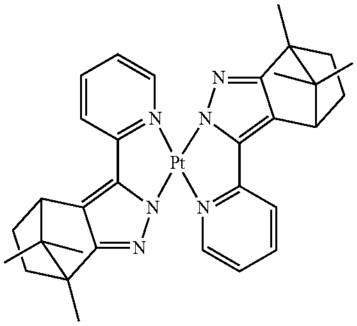
-continued
PD63
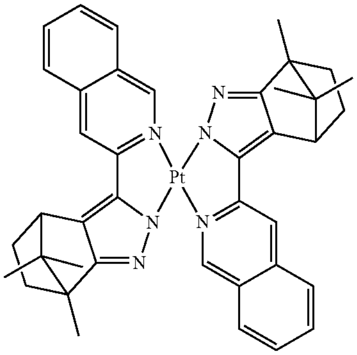
PD64
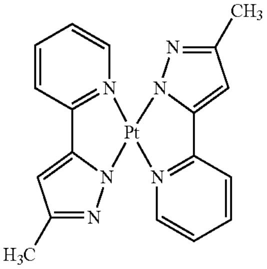
PD65
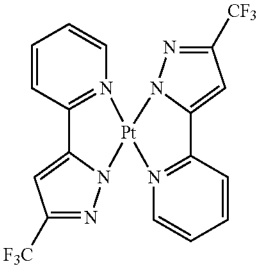
PD66
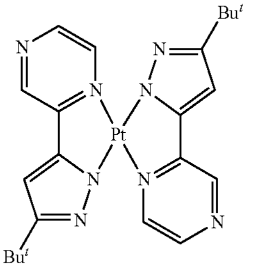
PD67
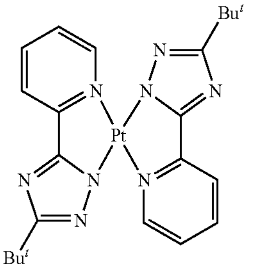

-continued

PD68

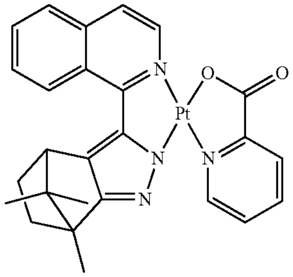

PD69

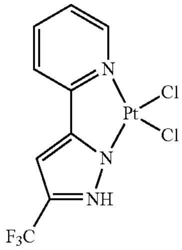

PD70

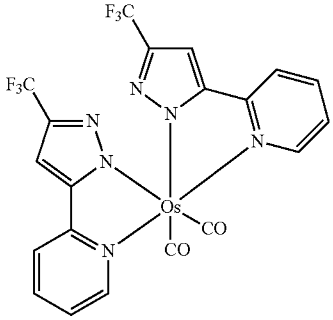

PD71

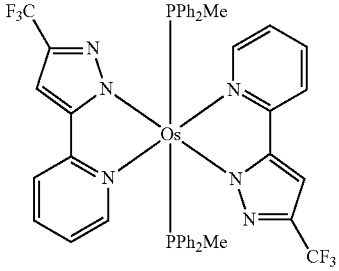

PD72

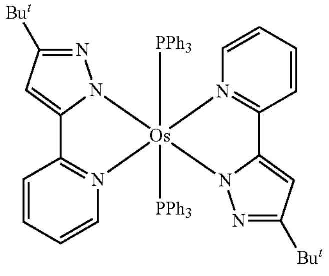

-continued

PD73

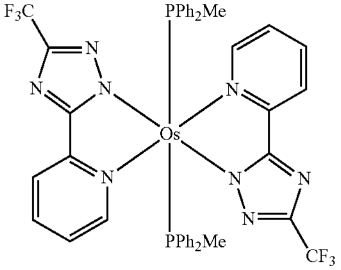

PD74

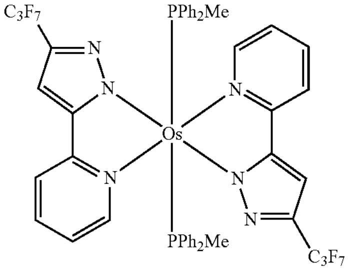

PD75

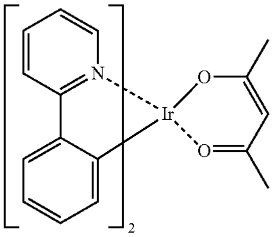

PD76

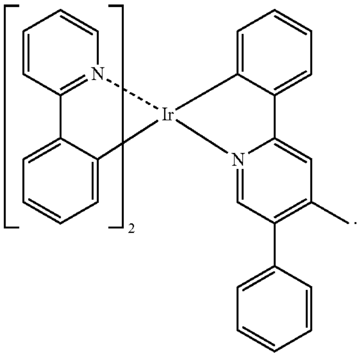

For example, the fluorescent dopant may include a compound represented by Formula 501:

Formula 501

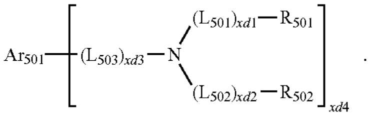

In Formula 501, $Ar_{501}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —$Si(Q_{501})(Q_{502})(Q_{503})$, wherein $Q_{501}$ to $Q_{503}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

$L_{501}$ to $L_{503}$ may be the same as described earlier herein in connection with $L_1$;

$R_{501}$ and $R_{502}$ may each independently be selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, and a phenyl group, a biphenyl group, a terphenyl group, a naphthyl group, a fluorenyl group, spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from a phenyl group, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and a dibenzofuranyl group, and a dibenzothiophenyl group;

xd1 to xd3 may each independently be selected from 0, 1, 2, and 3; and xd4 may be selected from 1, 2, 3, and 4.

For example, the fluorescent dopant may include at least one selected from Compounds FD1 to FD9.

FD1

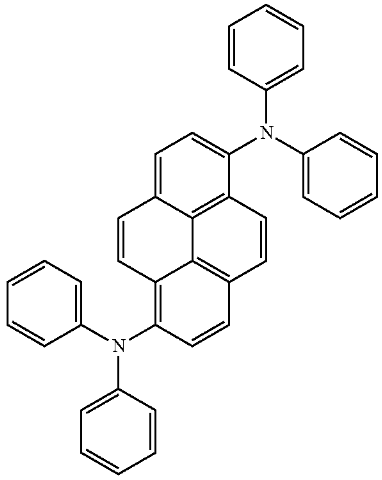

FD2

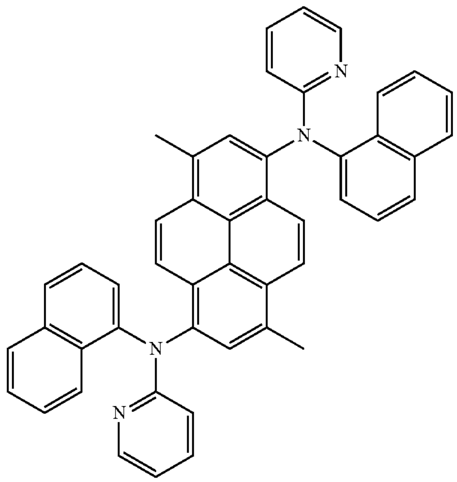

FD3

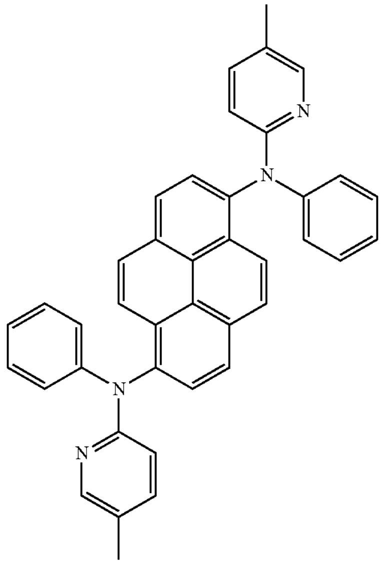

-continued
FD4
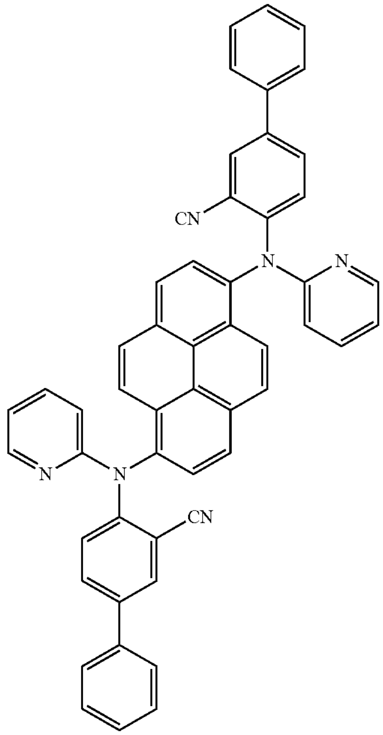
FD5
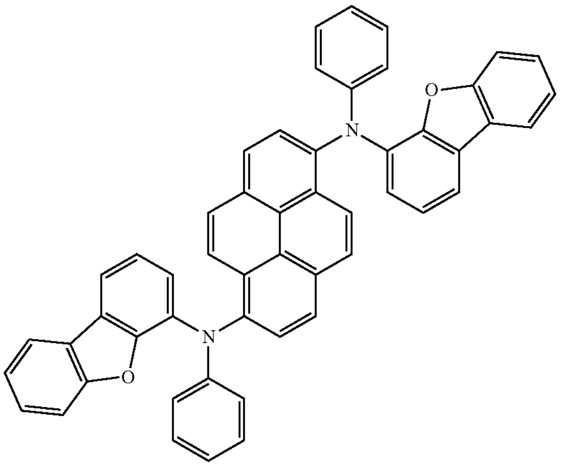
-continued
FD6
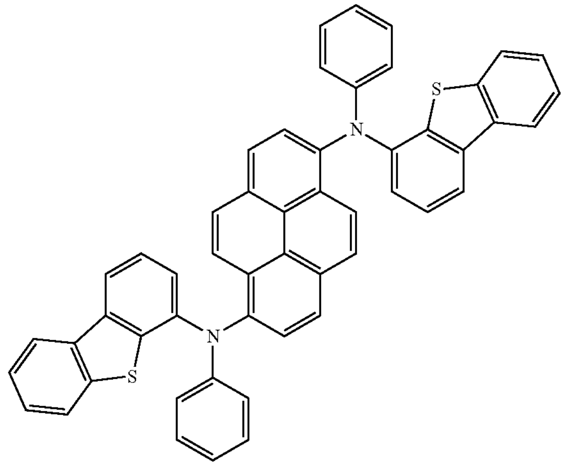
FD7
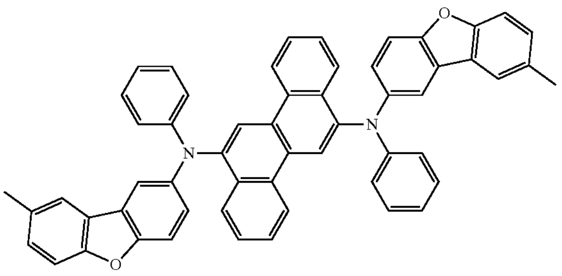
FD8
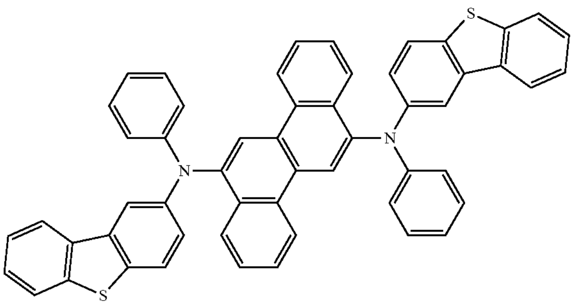
FD9
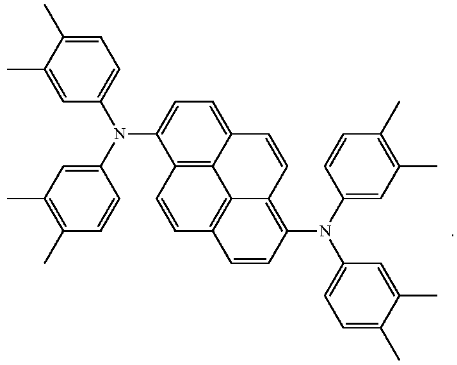
The amount of the dopant in the EML 150 may be about 0.01 parts to about 15 parts by weight based on 100 parts by weight of the host, but is not limited to this range.
The thickness of the EML 150 may be about 100 Å to about 1,000 Å, and in some embodiments, may be about 200 Å to about 600 Å. When the thickness of the EML 150 is within any of these ranges, the organic light-emitting device may have good light emitting ability without a substantial increase in driving voltage.

The electron transport region 170 may be on the EML 150. The electron transport region 170 may include an electron transport layer (ETL) and an electron control layer.

The ETL may include the second compound, and/or the second compound and a metal-containing material as described above. The electron control layer may include the third compound. The electron control layer may directly contact the EML 150, and/or may directly contact both the EML 150 and the electron transport layer.

The thickness of the electron control layer may be about 10 Å to about 5,000 Å. When the thickness of the electron control layer is within this range, the organic light-emitting device may have satisfactory charge injection balance characteristics without a substantial increase in driving voltage.

The electron transport region 170 may further include an electron injection layer (EIL) that may facilitate the injection of electrons from the second electrode 190, in addition to the electron control layer and the ETL.

The electron control layer, the ETL, and/or the EIL may each be formed in a similar manner as the HIL described above.

The thickness of the ETL may be about 100 Å to about 1,000 Å, and in some embodiments, about 150 Å to about 500 Å. When the thickness of the ETL is within any of these ranges, the organic light-emitting device may have satisfactory electron transporting ability without a substantial increase in driving voltage.

The EIL may be formed on the ETL using any suitable method, for example, using vacuum deposition, spin coating, casting, Langmuir-Blodgett (LB) deposition, inkjet printing, laser printing, laser induced thermal imaging (LITI), and/or the like. When the EIL is formed using vacuum deposition and/or spin coating, the deposition and coating conditions for forming the EIL may be similar to the above-described deposition and coating conditions for forming the HIL, and will not be described again.

The EIL may include at least one selected from LiF, NaCl, CsF, $Li_2O$, BaO, and LiQ.

The thickness of the EIL may be about 1 Å to about 100 Å, and in some embodiments, about 3 Å to about 90 Å. When the thickness of the EIL is within any of these ranges, the EIL may have satisfactory electron injection ability without a substantial increase in driving voltage.

The second electrode 190 may be on the electron transport region 170 as described above. The second electrode 190 may be a cathode (e.g., as an electron injecting electrode). The material for forming the second electrode 190 may be a metal, an alloy, an electrically conductive compound, which have a low-work function, and/or a mixture thereof. Non-limiting examples of the material for forming the second electrode 190 may include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO and/or IZO. The second electrode 190 may be a semi-transmissive electrode and/or a transmissive electrode.

As used herein, the term "$C_1$-$C_{60}$ alkyl group" may refer to a linear or branched aliphatic hydrocarbon monovalent group having 1 to 60 carbon atoms. Non-limiting examples of the $C_1$-$C_{60}$ alkyl group may include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" may refer to a divalent group having substantially the same structure as the $C_1$-$C_{60}$ alkyl group.

As used herein, the term "$C_1$-$C_{60}$ alkoxy group" may refer to a monovalent group represented by —O-$A_{101}$ (where $A_{101}$ is the $C_1$-$C_{60}$ alkyl group as described above). Non-limiting examples of the $C_1$-$C_{60}$ alkoxy group may include a methoxy group, an ethoxy group, and an isopropoxy group.

As used herein, the term "$C_2$-$C_{60}$ alkenyl group" may refer to a hydrocarbon group including at least one carbon-carbon double bond at one or more positions along a hydrocarbon chain of the $C_2$-$C_{60}$ alkyl group (e.g., in the middle or at either terminal end of the $C_2$-$C_{60}$ alkyl group). Non-limiting examples of the $C_2$-$C_{60}$ alkenyl group may include an ethenyl group, a propenyl group, and a butenyl group. The term "$C_2$-$C_{60}$ alkylene group" may refer to a divalent group having substantially the same structure as the $C_2$-$C_{60}$ alkenyl group.

As used herein, the term "$C_2$-$C_{60}$ alkynyl group" may refer to a hydrocarbon group including at least one carbon-carbon triple bond at one or more positions along a hydrocarbon chain of the $C_2$-$C_{60}$ alkyl group (e.g., in the middle or at either terminal end of the $C_2$-$C_{60}$ alkyl group). Non-limiting examples of the $C_2$-$C_{60}$ alkynyl group may include an ethynyl group and a propynyl group. The term "$C_2$-$C_{60}$ alkynylene group", as used herein, may refer to a divalent group having substantially the same structure as the $C_2$-$C_{60}$ alkynyl group.

As used herein, the term "$C_3$-$C_{10}$ cycloalkyl group" may refer to a monovalent, monocyclic hydrocarbon group having 3 to 10 carbon atoms. Non-limiting examples of the $C_3$-$C_{10}$ cycloalkyl group may include a cyclopropyl group, a cyclobutyl group, a cyclopentyl group, a cyclohexyl group, and a cycloheptyl group. The term "$C_3$-$C_{10}$ cycloalkylene group" may refer to a divalent group having substantially the same structure as the $C_3$-$C_{10}$ cycloalkyl group.

As used herein, the term "$C_1$-$C_{10}$ heterocycloalkyl group" may refer to a monovalent monocyclic group having 1 to 10 carbon atoms, in which at least one hetero atom selected from N, O, silicon (Si), phosphorus (P), and sulfur (S) is included as a ring-forming atom. Non-limiting examples of the $C_1$-$C_{10}$ heterocycloalkyl group may include a tetrahydrofuranyl group, and a tetrahydrothiophenyl group. The term "$C_1$-$C_{10}$ heterocycloalkylene group" may refer to a divalent group having substantially the same structure as the $C_1$-$C_{10}$ heterocycloalkyl group.

As used herein, the term "$C_3$-$C_{10}$ cycloalkenyl group" may refer to a monovalent monocyclic group having 3 to 10 carbon atoms that includes at least one double bond in the ring but does not have aromaticity (e.g., is not aromatic). Non-limiting examples of the $C_3$-$C_{10}$ cycloalkenyl group may include a cyclopentenyl group, a cyclohexenyl group, and a cycloheptenyl group. The term "$C_3$-$C_{10}$ cycloalkenylene group" may refer to a divalent group having substantially the same structure as the $C_3$-$C_{10}$ cycloalkenyl group.

As used herein, the term "$C_1$-$C_{10}$ heterocycloalkenyl group" may refer to a monovalent monocyclic group having 1 to 10 carbon atoms that includes at least one double bond in the ring and in which at least one hetero atom selected from N, O, Si, P, and S is included as a ring-forming atom. Non-limiting examples of the $C_1$-$C_{10}$ heterocycloalkenyl group may include a 2,3-hydrofuranyl group and a 2,3-hydrothiophenyl group. The term "$C_1$-$C_{10}$ heterocycloalkenylene group", as used herein, may refer to a divalent group having substantially the same structure as the $C_1$-$C_{10}$ heterocycloalkenyl group.

As used herein, the term "$C_6$-$C_{60}$ aryl group" may refer to a monovalent, aromatic carbocyclic group having 6 to 60 carbon atoms, and the term "$C_6$-$C_{60}$ arylene group" may refer to a divalent, aromatic carbocyclic group having 6 to 60 carbon atoms. Non-limiting examples of the $C_6$-$C_{60}$ aryl group may include a phenyl group, a biphenyl group, a terphenyl group, a naphthyl group, an anthracenyl group, a phenanthrenyl group, a pyrenyl group, and a chrysenyl group. When the $C_6$-$C_{60}$ aryl group and/or the $C_6$-$C_{60}$ arylene group include at least two rings, the respective rings may be fused to each other.

As used herein, the term "$C_1$-$C_{60}$ heteroaryl group" may refer to a monovalent, aromatic carbocyclic group having 1 to 60 carbon atoms, in which at least one hetero atom selected from N, O, Si, P, and S is included as a ring-forming atom. The term "$C_1$-$C_{60}$ heteroarylene group" may refer to a divalent, aromatic carbocyclic group having 1 to 60 carbon atoms, in which at least one hetero atom selected from N, O, P, and S is included as a ring-forming atom. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl and/or the $C_1$-$C_{60}$ heteroarylene include at least two rings, the respective rings may be fused to each other.

As used herein, the term "$C_6$-$C_{60}$ aryloxy group" may refer to a monovalent group represented by —O-$A_{102}$ (where $A_{102}$ is the $C_6$-$C_{60}$ aryl group as described above), and a $C_6$-$C_{60}$ arylthio group may refer to a monovalent group represented by —S-$A_{103}$ (where $A_{103}$ is the $C_6$-$C_{60}$ aryl group as described above).

As used herein, the term "monovalent non-aromatic condensed polycyclic group" may refer to a monovalent group having at least two rings condensed (e.g., fused) to each other, in which only carbon atoms (for example, 8 to 60 carbon atoms) are included as ring-forming atoms, and the entire molecule does not have aromaticity (e.g., is not aromatic). A non-limiting example of the monovalent non-aromatic condensed polycyclic group may be a fluorenyl group. The term "divalent non-aromatic condensed polycyclic group" may refer to a divalent group having substantially the same structure as the monovalent non-aromatic condensed polycyclic group.

As used herein, the term "monovalent non-aromatic condensed heteropolycyclic group" may refer to a monovalent group having at least two rings condensed (e.g., fused) to each other, in which carbon atoms (for example, 1 to 60 carbon atoms) and at least one hetero atom selected from N, O, Si, P, and S are included as ring-forming atoms and the entire molecule does not have aromaticity (e.g., is not aromatic). The term "divalent non-aromatic condensed heteropolycyclic group" may refer to a divalent group having substantially the same structure as the monovalent non-aromatic condensed heteropolycyclic group.

As used herein, at least one substituent of the substituted $C_5$-$C_{30}$ carbocyclic group, the substituted $C_2$-$C_{30}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group, may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$) ($Q_{13}$), —N($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$), and —Si($Q_{31}$)($Q_{32}$)($Q_{33}$), —N($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" as used herein may refer to phenyl, the term "Me" as used herein may refer to methyl, the term "Et" as used herein may refer to ethyl, and the acronym "ter-Bu" or "But" as used herein may refer to tert-butyl.

The term "biphenyl group" as used herein may refer to a monovalent group in which two benzene moieties are linked (e.g., coupled) to each other via a single bond, and the term "terphenyl group" may refer to a monovalent group in which three benzene moieties are linked (e.g., coupled) to each other via two single bonds.

One or more embodiments of the present disclosure will now be described in more detail with reference to the following examples. However, these examples are only for illustrative purposes and are not intended to limit the scope of embodiments of the present disclosure. In the following synthesis examples, the expression "B was used instead of A" means that an equivalent amount of B was used in place of A.

EXAMPLES

Synthesis Example 1

Synthesis of Compound 1-1

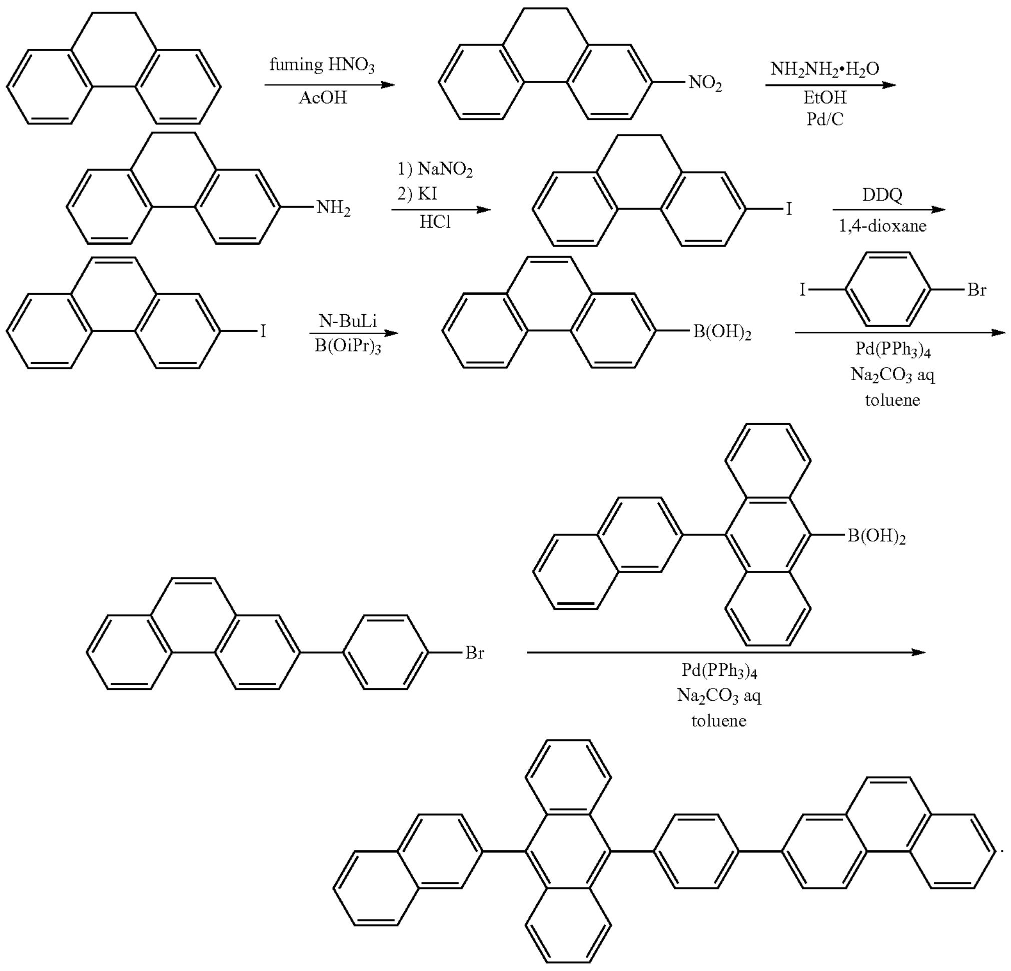

1-1

1) Synthesis of 2-nitro-9,10-dihydrophenanthrene 300 g of 9,10-dihydrophenanthrene was dissolved in 2 L of acetic acid, and 450 mL of fuming nitric acid was added dropwise thereto. The resulting reaction solution was stirred at room temperature for about 7 hours, poured into 5 L of water, and the resulting precipitated crystals were separated by filtration. The collected crystals were washed with water and methanol, and dried under reduced pressure to obtain 280 g of tangerine colored crystals (Yield: 74%).

2) Synthesis of 2-amino-9,10-dihydrophenanthrene 280 g of 2-nitro-9,10-dihydrophenanthrene, 2.0 g of palladium on carbon (Pd/C), and 2.5 L of ethanol were mixed, and 140 mL of hydrazine hydrate was added thereto. The resulting reaction solution was heated under reflux for about 4 hours while stirring. The reaction solution was cooled to room temperature, and poured into 5 L of water, followed by extraction with 3 L of toluene. The organic phase was separated, dried using magnesium sulfate, filtered, and the solvent was removed by vacuum distillation. The resulting residue was purified by silica gel column chromatography to obtain 220 g of a light yellow colored solid (Yield: 89%).

3) Synthesis of 2-iodo-9,10-dihydrophenanthrene

Under an argon atmosphere, 220 g of 2-amino-9,10-dihydrophenanthrene, 3 L of 3N HCl, and 2 L of acetic acid were mixed and heated for about 3 hours with stirring, followed by cooling to room temperature and then cooling on ice. 91 g of sodium nitrite was added dropwise thereto, the reaction was stirred on ice for about 1 hour, and then 660 g of an aqueous solution of potassium iodide was added thereto. 2 L of dichloromethane was added thereto and the reaction was stirred at room temperature for about 3 hours, followed by extraction with dichloromethane. The organic phase was collected, repeatedly washed with aqueous potassium carbonate, dried with magnesium sulfate, filtered, and the solvent was removed by vacuum distillation. The resulting residue was purified by silica gel column chromatography to obtain 210 g of a light yellow colored solid (Yield: 62%).

4) Synthesis of 2-iodophenanthrene

Under an argon atmosphere, 125 g of 2-iodo-9,10-dihydrophenanthrene, 98 g 2,3- of dichloro-5,6-dicyano-p-benzoquinone (DDQ), and 1.2 L of 1,4-dioxane were mixed and heated under reflux for about 24 hours with stirring, followed by cooling to room temperature and concentrating the reaction solution. The resulting residue was purified by silica gel column chromatography, followed by washing with methanol to obtain 98 g of white crystals (Yield: 68%).

5) Synthesis of phenanthrene-2-boronic acid

Under an argon atmosphere, 98 g of 2-iodophenanthrene and 3 L of dehydrated ether were mixed, the resulting reaction solution was cooled to about −60° C., 210 mL of a 1.6 M n-butyllithium solution in hexane was added thereto, and then the resulting reaction solution was heated to about 0° C. for about 1 hour with stirring. The resulting reaction solution was cooled down to about −60° C., and 100 mL of a triisopropyl borate (151 g) solution in dehydrated ether was added dropwise thereto. The resulting reaction solution was heated to room temperature with stirring for about 5 hours. 1 L of a 10% HCl aqueous solution was added thereto and the reaction was stirred for about 1 hour. The aqueous phase was removed, the remaining organic phase was washed with water and with a saturated saline solution, dried using magnesium sulfate, filtered, and concentrated to obtain a solid. The solid was washed with hexane and toluene to obtain 42 g of phenanthrene-2-boronic acid (Yield: 58%).

6) Synthesis of 2-(4-bromophenyl) phenanthrene

Under an argon atmosphere, 22.2 g of phenanthrene-2-boronic acid, 28.3 g of 4-bromoiodobenzene, 2.31 g of tetrakis (triphenylphosphine)palladium(0), 400 mL of toluene, and 200 mL of a 2 M aqueous sodium carbonate solution were mixed and stirred under reflux for about 8 hours, followed by cooling to room temperature and extraction with toluene. After the aqueous phase was removed, the remaining organic phase was washed with water and with a saturated saline solution, dried using magnesium sulfate, filtered, and concentrated. The resulting residue was purified by silica gel column chromatography to obtain 30.3 g of 10-(3-bromophenyl)benzo[c]phenanthrene (Yield: 91%).

7) Synthesis of Compound 1-1

Under an argon atmosphere, 3.33 g of 2-(4-bromophenyl) phenanthrene, 4.18 g of 10-(2-naphthyl)anthracene-9-boronic acid, 0.231 g of tetrakis(triphenylphosphine)palladium (0), 40 mL of toluene, and 20 mL of a 2 M aqueous sodium carbonate solution were mixed and stirred under reflux for about 8 hours, followed by cooling to room temperature and extraction with toluene. After the aqueous phase was removed, the remaining organic phase was washed with water and with a saturated saline solution, dried using magnesium sulfate, filtered (to remove the magnesium sulfate), and concentrated. The resulting residue was purified by silica gel column chromatography to obtain 4.56 g of light yellow colored crystals, which were identified by mass spectroscopy to be the target compound having a molecular weight of about 556.22 and a mass-to-charge ratio (hereinafter, m/e value) of about 556.

Synthesis Example 2

Synthesis of Compound 1-61

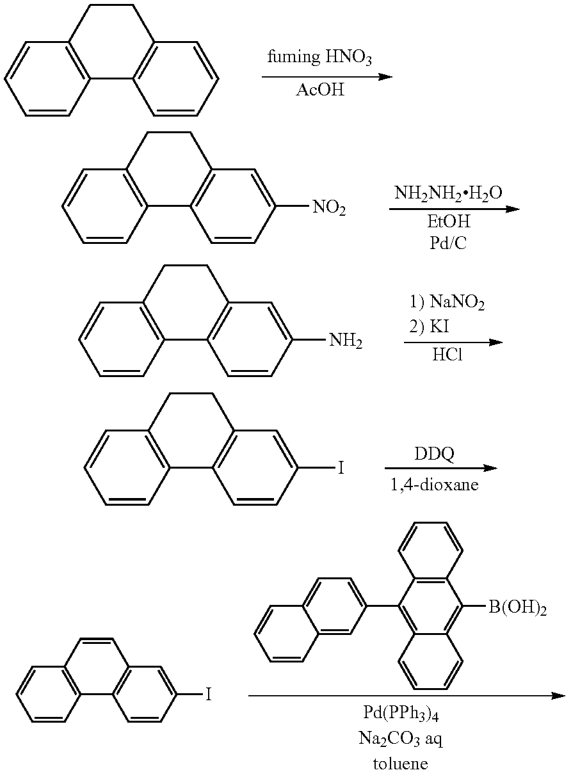

-continued

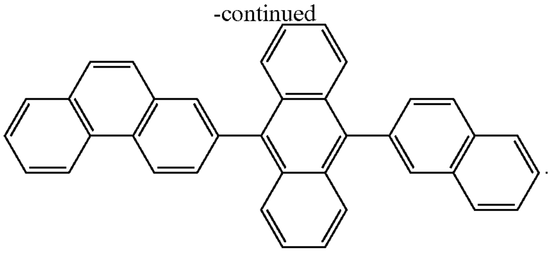

1-61

-continued

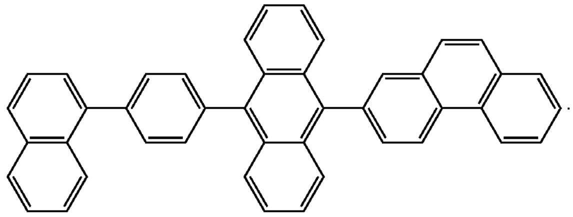

1-75

2-nitro-9,10-dihydrophenanthrene, 2-amino-9,10-dihydrophenanthrene, 2-iodo-9,10-dihydrophenanthrene, and 2-iodophenanthrene were synthesized in substantially the same manner as in Synthesis Example 1.

Under an argon atmosphere, 3.04 g of 2-iodophenanthrene, 4.18 g of 10-(2-naphthyl)anthracene-9-boronic acid, 0.231 g of tetrakis(triphenylphosphine)palladium (0), 40 mL of toluene, and 20 mL of a 2 M aqueous sodium carbonate solution were mixed and stirred under reflux for about 8 hours, followed by cooling to room temperature and extraction with toluene. After the aqueous phase was removed, the remaining organic phase was washed with water and with a saturated saline solution, dried using magnesium sulfate, filtered (to remove the magnesium sulfate), and concentrated. The resulting residue was purified by silica gel column chromatography to obtain 4.56 g of light yellow colored crystals, which were identified by mass spectroscopy to be the target compound having a molecular weight of about 480.19 and a m/e value of about 480.

Synthesis Example 3

Synthesis of Compound 1-75

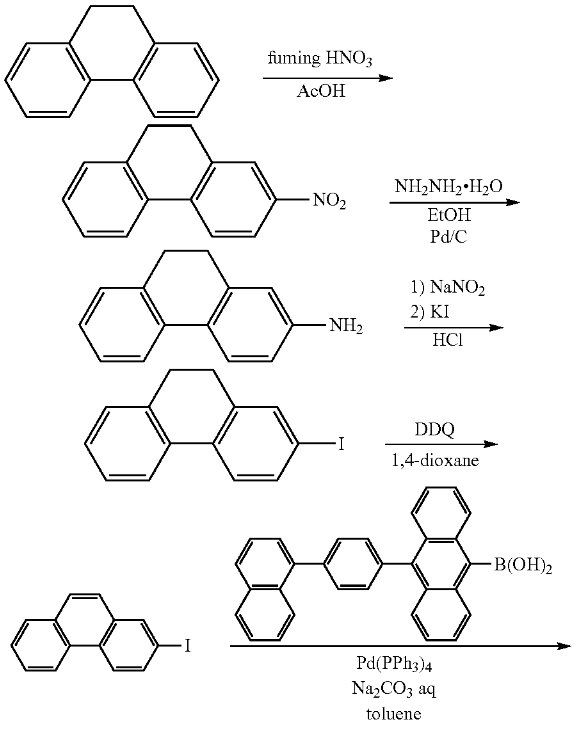

2-nitro-9,10-dihydrophenanthrene, 2-amino-9,10-dihydrophenanthrene, 2-iodo-9,10-dihydrophenanthrene, and 2-iodophenanthrene were synthesized in substantially the same manner as in Synthesis Example 1.

3.04 g of 2-iodophenanthrene, 4.66 g of 10-[4-(1-naphthyl)phenyl]anthracene-9-boronic acid, 0.231 g of tetrakis (triphenylphosphine)palladium(0), 40 mL of toluene, and 20 mL of a 2 M aqueous sodium carbonate solution were mixed and stirred under reflux in an argon atmosphere for about 8 hours, followed by cooling to room temperature to precipitate crystals. The crystals were separated by filtration and repeatedly recrystallized from toluene and hexane to obtain 4.45 g of light yellow colored crystals, which were identified by mass spectroscopy to be the target compound having a molecular weight of about 556.22 and a m/e value of about 556.

Synthesis Example 4

Synthesis of Compound 2-1

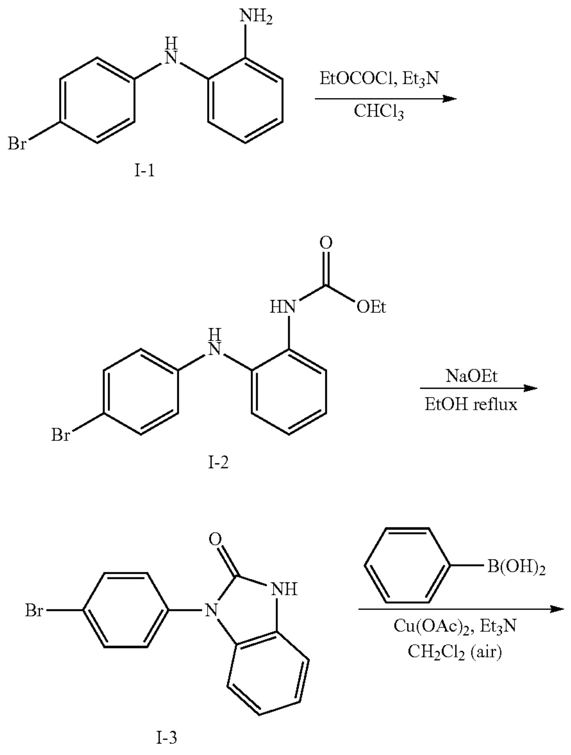

-continued

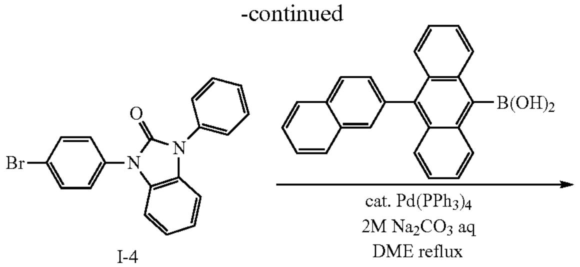

I-4

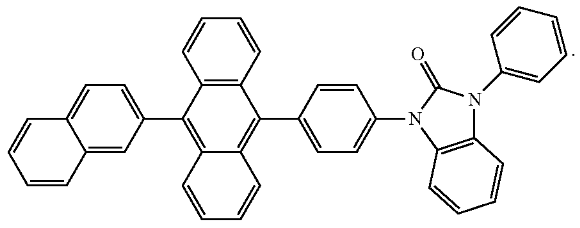

2-1

1) Synthesis of Intermediate I-2

Under an argon atmosphere, 6.3 g (62 mmol) of (4-bromophenyl)-(2-nitrophenyl)amine (Intermediate I-1), 100 mL of chloroform, and 17.3 mL (124 mmol) of triethylamine were mixed and cooled down to about 0° C. 11.8 mL (124 mmol) of ethyl chloroformate was added dropwise thereto, and the reaction was stirred at room temperature for about 2 hours. The resulting reaction solution was diluted with dichloromethane, and the resulting organic phase was collected, washed with a saturated saline solution, dried using magnesium sulfate, filtered, and then concentrated to obtain a solid. This solid was washed with hexane and dried under reduced pressure to obtain 18.5 g of Intermediate I-2 (Yield: 91%) as white solid.

2) Synthesis of Intermediate I-3

Under an argon atmosphere, 18.5 g (55 mmol) of Intermediate I-2 was added to 36.6 g (537 mmol) of sodium ethoxide and 2.6 L of dehydrated ethanol at room temperature, and heated under reflux for about 3.5 hours. The resulting reaction solution was cooled, the solvent was removed by vacuum distillation, water was added thereto, and the solution was neutralized with 2N HCl. The resulting solid was filtered, washed with water, and then dissolved in ethyl acetate and dichloromethane, followed by drying with sodium sulfate and removing the solvent by vacuum distillation. The resulting solid was washed with hexane and dried under reduced pressure to obtain 14.9 g of Intermediate I-3 (Yield: 90%) as light brown colored solid.

3) Synthesis of Intermediate I-4

6.3 g (52 mmol) of phenylboronic acid was slowly added to 3.0 g (10 mmol) of Intermediate I-3, 4.3 mL (31 mmol) of triethylamine, 5.7 g (31 mmol) of acetic acid copper (II), and 90 mL of dichloromethane at room temperature under atmospheric conditions, and stirred for about 12 hours. The solvent was removed by vacuum distillation, ethyl acetate and a 10% aqueous potassium carbonate solution were added thereto, and the reaction solution was stirred at room temperature for about 1 hour. The resulting reaction solution was then filtered using Celite to isolate the organic phase, the organic phase was washed with water and with a saturated saline solution, the organic phase was dried using sodium sulfate, filtered, and the solvent was removed by vacuum distillation. The resulting residue was purified by silica gel column chromatography (using ethyl acetate/toluene) to obtain a solid. The solid was washed using hexane and dried under reduced pressure to obtain 3.8 g of a white solid (Yield: 100%), which was then identified as Intermediate I-4 by field desorption mass spectrometry (FD-MS).

4) Synthesis of Compound 2-1

2.1 g (5.8 mmol) of Intermediate I-4 was dissolved in 30 mL of 1,2-dimethoxyethane, and then 2.2 g (6.4 mmol) of 10-(naphthalene-2-yl)anthracene-9-boronic acid, 0.3 g (2.9 mmol) of tetrakis(triphenylphosphine)palladium(0), and 15 mL of 2 M aqueous sodium carbonate solution were added thereto and heated under reflux for about 5.5 hours. The reaction was terminated, water was added thereto, and the reaction was filtered to obtain a solid. The solid was washed with water and dried under vacuum. The resulting crude product was purified by silica gel column chromatography (using ethyl acetate/toluene/hexane). The resulting solid was washed using hexane and dried under reduced pressure to obtain 3.2 g of a light yellow colored solid (Yield: 94%), which was identified as Compound 2-1 by FD-MS.

Synthesis Example 5

Synthesis of Compound 2-4

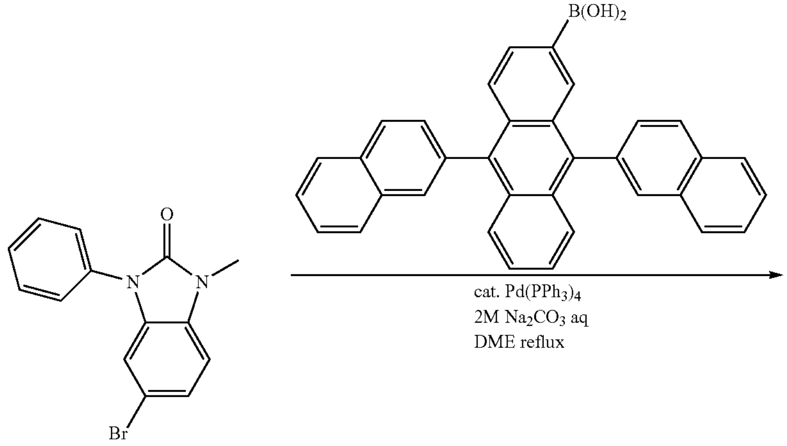

I-5

-continued
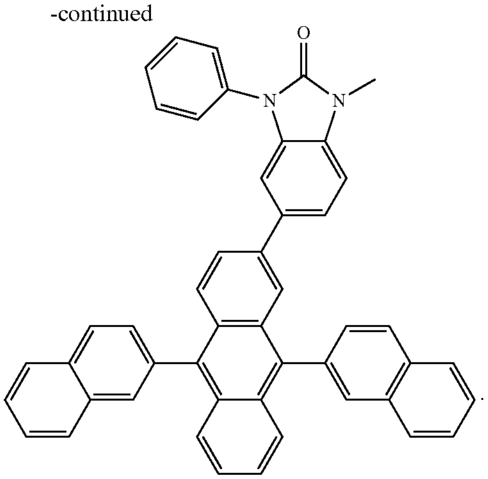
2-4
Compound 2-4 was synthesized in substantially the same manner as in Synthesis Example 4, except that Intermediate I-5, instead of Intermediate I-4, was used. Compound 2-4 was identified by FD-MS.
Synthesis Example 6
Synthesis of Compound 2-6
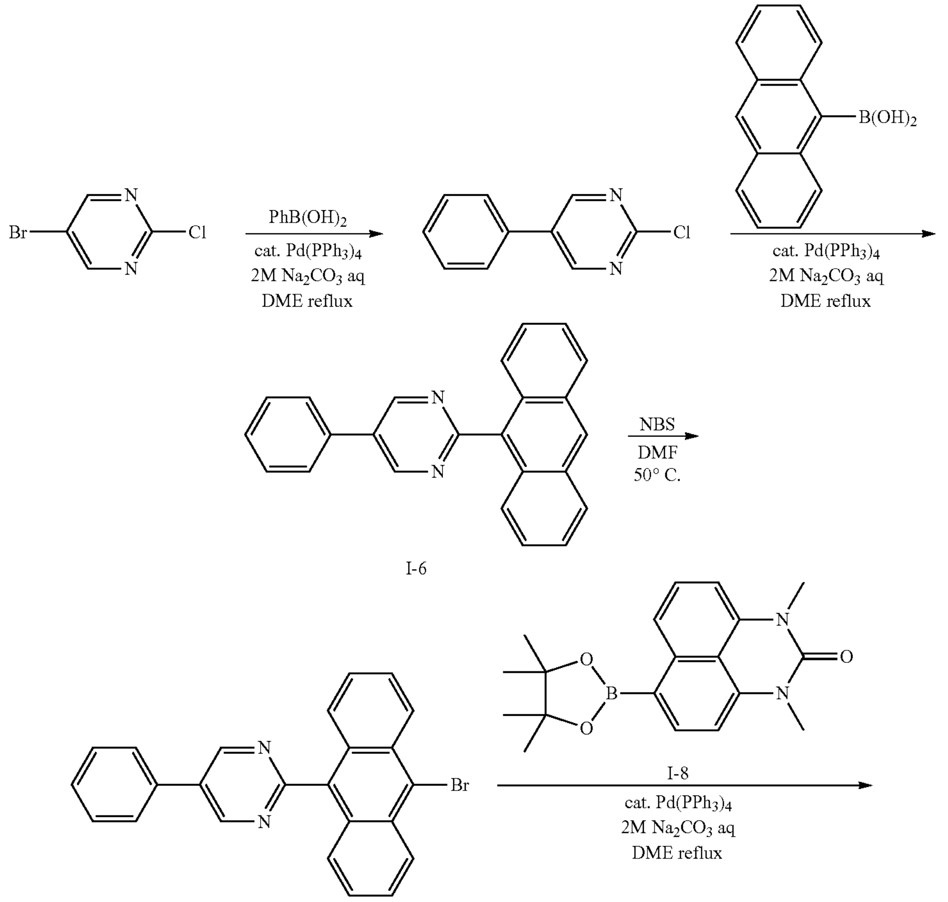
I-7

-continued

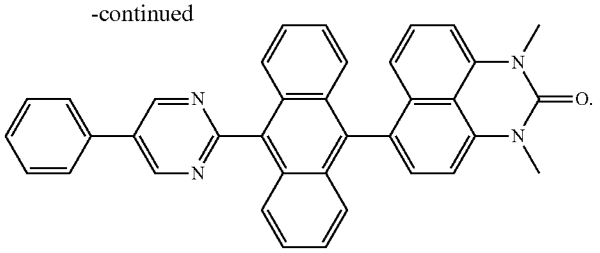

2-6

1) Synthesis of Intermediate I-6

14 g of 5-phenyl-2-chloropyrimidine (Yield: 77%) was obtained in substantially the same manner as in the synthesis of Compound 2-1 in Synthesis Example 4, except that 18.1 g (94 mmol) of 5-bromo-2-chloropyrimidine was used instead of Intermediate I-1, and 11.6 g (95 mmol) of dihydroxyphenylborane was used instead of 11.6 g (95 mmol) of 10-(naphthalene-2-yl)anthracene-9-boronic acid.

Intermediate I-6 was obtained in substantially the same manner as in the synthesis of Compound 2-1 in Synthesis Example 4, except that 5-phenyl-2-chloropyrimidine was used instead of Intermediate I-4, and 9-anthracene boronic acid was used instead of 10-(naphthalene-2-yl)anthracene-9-boronic acid.

2) Synthesis of Intermediate I-7

Under an argon atmosphere, 4.8 g (14 mmol) of Intermediate I-6 was dissolved in 95 mL of anhydrous dimethylformamide at about 40° C., and 2.7 g (15 mmol) of N-bromosuccinimide was then added thereto and stirred at about 50° C. for about 2.5 hours. The reaction was terminated, water was added thereto, and the reaction solution was filtered to obtain a solid. The solid was washed with water, and dried under vacuum. The resulting crude product was purified by silica gel column chromatography (using ethyl acetate/hexane). The resulting solid was washed using hexane and methanol, and dried under vacuum to obtain 4.6 g of a white solid (Yield: 78%).

3) Synthesis of Compound 2-6

Compound 2-1 was obtained in substantially the same manner as in the synthesis of Compound 201 in Synthesis Example 4, except that Intermediate I-7 was used instead of Intermediate I-4, and Intermediate I-8 was used instead of 10-(naphthalene-2-yl)anthracene-9-boronic acid. Compound 2-1 was identified by FD-MS.

Synthesis Example 7

Synthesis of Compound 2-13

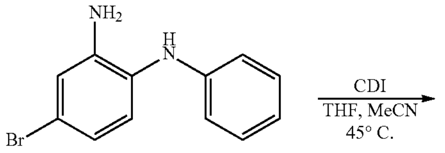

I-9

-continued

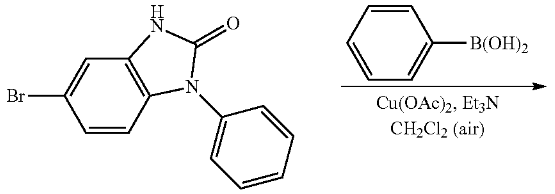

I-10

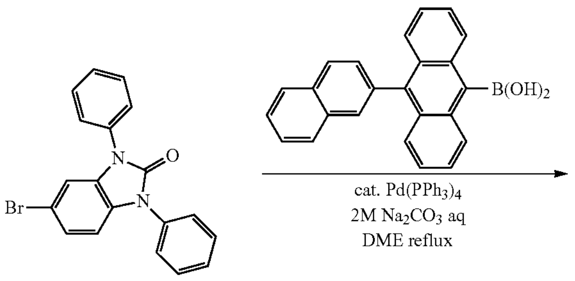

I-11

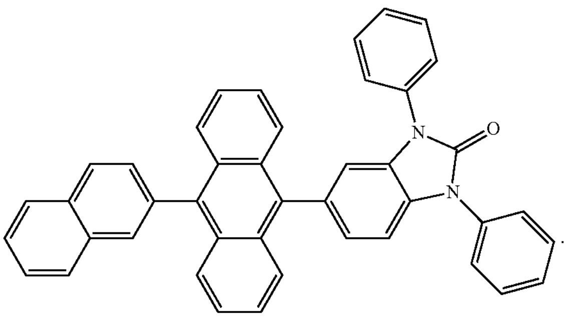

2-13

1) Synthesis of Intermediate I-10

Under an argon atmosphere, 200 mL of dehydrated THF was added to 22.0 g (35 mmol) of Intermediate I-9, and a solution of 10.4 g (69 mmol) of 1,1'-carbonyldiimidazole in dehydrated acetonitrile (150 mL) was added dropwise thereto at about 45° C. over 1.5 hours and stirred at about 45° C. for about 18 hours, followed by cooling to room temperature to precipitate a solid, followed by filtration to collect the solid, washing with methanol, and drying under vacuum to obtain 17.5 g of Intermediate I-10 (Yield: 97%).

2) Synthesis of Intermediate I-11

6.3 g (52 mmol) of phenylboronic acid was slowly added to 3.0 g (10 mmol) of Intermediate I-10, 4.3 mL (31 mmol) of triethylamine, 5.7 g (31 mmol) of acetic acid copper (II), and 90 mL of dichloromethane at room temperature under atmospheric conditions and stirred for about 12 hours, followed by removing the solvent by vacuum distillation, adding ethyl acetate and a 10% aqueous potassium carbonate solution thereto, and stirring at room temperature for about 1 hour. The resulting reaction solution was then filtered using Celite to isolate the organic phase, followed by washing the organic phase with water and with a saturated saline solution, drying the organic phase using sodium sulfate, filtering, and removing the solvent by vacuum distillation. The resulting residue was purified by silica gel column chromatography (using ethyl acetate/toluene) to obtain a solid. The solid was washed using hexane and dried under reduced pressure to obtain 3.8 g of a white solid (Yield: 100%), which was then identified as Intermediate I-11 by FD-MS.

3) Synthesis of Compound 2-13

Compound 2-13 was obtained in substantially the same manner as in the synthesis of Compound 2-1 in Synthesis Example 4, except that Intermediate I-11 was used instead of Intermediate I-4. Compound 2-13 was identified by FD-MS.

Example 1

A glass substrate (having a structure of ITO(70 Å)/Ag(1,000 Å)/ITO(70 Å), available from Corning Inc.) was cut to a size of 50 mm×50 mm×0.7 mm and then sonicated in isopropyl alcohol and deionized water each for 30 minutes, and then cleaned by exposure to ozone for about 10 minutes. The resulting glass substrate with an ITO anode was mounted into a vacuum deposition device.

HT3 was vacuum-deposited on the ITO anode of the glass substrate to form a hole transport layer (HTL) having a thickness of 1,400 Å, and Compound HT3 was then vacuum-deposited on the HIL to form a hole transport layer (HTL) having a thickness of about 300 Å.

Compound 1-1 (as a host) and Compound FD9 (as a dopant) were co-deposited on the HTL in a weight ratio of about 200:3 to form an emission layer (EML) having a thickness of about 200 Å.

Compound 1-1 was deposited on the EML to form an electron control layer having a thickness of about 50 Å, and then Compound 2-1 and LiQ were co-deposited on the electron control layer in a weight ratio of about 50:50 to form an electron transport layer (ETL) having a thickness of about 310 Å. LiF was then deposited on the ETL to form an electron injection layer (EIL) having a thickness of about 5 Å, and then Mg/Ag was vacuum-deposited on the EIL to form a second electrode (as the cathode) having a thickness of about 110 Å, thereby manufacturing an organic light-emitting device.

HT3

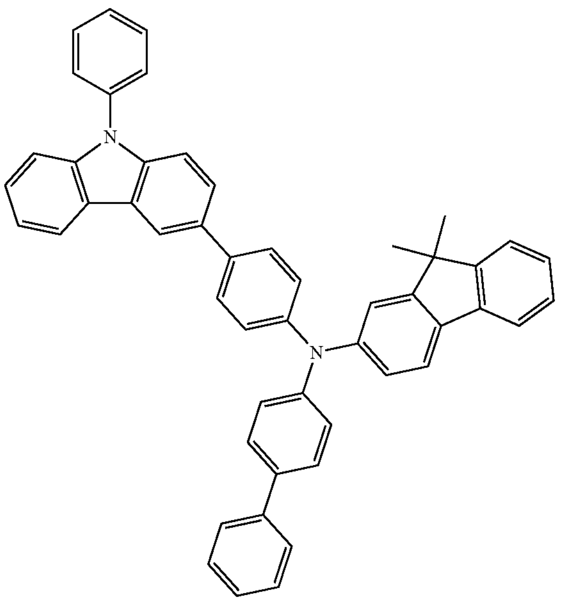

FD9

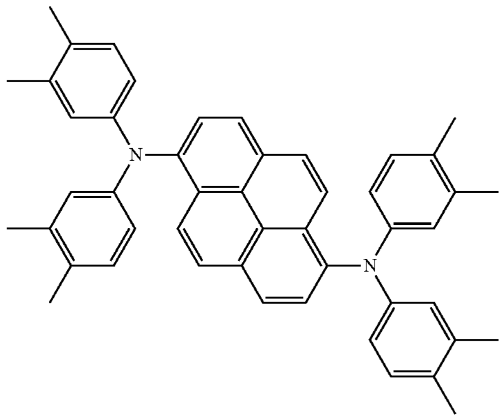

.

Examples 2 to 19 and Comparative Examples 1 to 7

Organic light-emitting devices were manufactured in substantially the same manner as in Example 1, except that the compounds listed in Table 1, instead of Compound 1-1, Compound 1-1, and Compound 3-1, were used to form the EML, the electron control layer, and the ETL.

Evaluation Example 1

Driving voltages, efficiencies, and lifetimes ($T_{95}$) of the organic light-emitting devices of Examples 1 to 19 and Comparative Examples 1 and 7 were evaluated using a Keithley Source-Measure Unit (SMU 236) and a PR650 (Spectroscan) Source Measurement Unit (available from Photo Research, Inc.). The results are shown in Table 1. The lifetime ($T_{95}$) was measured as the time taken until a measured initial luminance (assumed as 100%) of the organic light-emitting device is reduced to 95%.

TABLE 1

| Example | EML (Host) | Electron control layer | ETL | Driving voltage (V) | Efficiency (cd/A) | Lifetime ($T_{95}$) (hr) (@ 600 cd/m$^2$) |
|---|---|---|---|---|---|---|
| Example 1 | Compound 1-1 | Compound 1-1 | Compound 2-1 | 3.3 | 6.1 | 222 |
| Example 2 | Compound 1-1 | Compound 1-1 | Compound 2-6 | 3.3 | 5.6 | 264 |
| Example 3 | Compound 1-1 | Compound 1-1 | Compound 2-13 | 3.3 | 5.8 | 321 |
| Example 4 | Compound 1-61 | Compound 1-61 | Compound 2-1 | 3.4 | 5.5 | 300 |
| Example 5 | Compound 1-61 | Compound 1-61 | Compound 2-6 | 3.4 | 5.8 | 201 |
| Example 6 | Compound 1-61 | Compound 1-61 | Compound 2-13 | 3.4 | 6.4 | 253 |
| Example 7 | Compound 1-75 | Compound 1-75 | Compound 2-1 | 3.2 | 6.0 | 279 |
| Example 8 | Compound 1-75 | Compound 1-75 | Compound 2-6 | 3.2 | 5.9 | 337 |
| Example 9 | Compound 1-75 | Compound 1-75 | Compound 2-13 | 3.2 | 6.6 | 315 |
| Example 10 | Compound 1-1 | Compound 2-1 | Compound 2-1 | 3.3 | 6.1 | 180 |
| Example 11 | Compound 1-61 | Compound 2-1 | Compound 2-1 | 3.3 | 5.6 | 162 |
| Example 12 | Compound 1-75 | Compound 2-1 | Compound 2-1 | 3.3 | 5.8 | 177 |
| Example 13 | Compound 1-1 | Compound 2-4 | Compound 2-4 | 3.4 | 6.8 | 156 |
| Example 14 | Compound 1-61 | Compound 2-4 | Compound 2-4 | 3.4 | 6.4 | 160 |
| Example 15 | Compound 1-75 | Compound 2-4 | Compound 2-4 | 3.4 | 6.4 | 167 |
| Example 16 | Compound 1-1 | Compound 2-13 | Compound 2-13 | 3.2 | 6.0 | 200 |
| Example 17 | Compound 1-61 | Compound 2-13 | Compound 2-13 | 3.2 | 5.9 | 210 |
| Example 18 | Compound 1-75 | Compound 2-13 | Compound 2-13 | 3.2 | 6.6 | 188 |
| Example 19 | Compound 1-1 | Compound 2-13 | Compound 2-1 | 3.2 | 6.8 | 147 |
| Comparative Example 1 | β-ADN | — | $Alq_3$ | 5.1 | 2.7 | 49 |
| Comparative Example 2 | β-ADN | — | Compound 2-1 | 4.5 | 3.3 | 70 |
| Comparative Example 3 | β-ADN | β-ADN | Compound 2-1 | 4.4 | 3.5 | 112 |
| Comparative Example 4 | Compound 1-1 | — | Compound 2-1 | 3.7 | 4.6 | 92 |
| Comparative Example 5 | Compound 1-1 | Compound 1-1 | $Alq_3$ | 3.5 | 4.3 | 130 |
| Comparative Example 6 | Compound 1-1 | Compound 1-61 | $Alq_3$ | 3.6 | 4.0 | 100 |
| Comparative Example 7 | β-ADN | Compound 2-1 | Compound 2-1 | 3.5 | 4.2 | 130 |

β-ADN

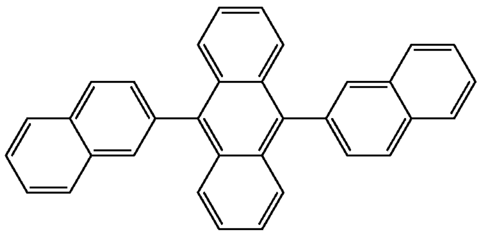

TABLE 1-continued

| Example | EML (Host) | Electron control layer | ETL | Driving voltage (V) | Efficiency (cd/A) | Lifetime ($T_{95}$) (hr) (@ 600 cd/m$^2$) |
|---|---|---|---|---|---|---|

$Alq_3$

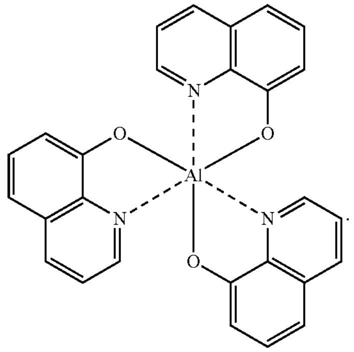

$Alq_3$

Referring to Table 1, the organic light-emitting devices of Examples 1 to 19 were found to have relatively lower driving voltages, relatively high efficiencies, and relatively long lifespans, compared to the organic light-emitting devices of Comparative Examples 1 to 7.

As described above, according to one or more embodiments, an organic light-emitting device (including a first compound of Formula 1 in an emission layer, a second compound of Formula 2 in an electron transport layer, and a third compound selected from the first compound of Formula 1 and the second compound of Formula 2) may have a high efficiency and an improved lifespan.

It should be understood that the example embodiments described herein should be considered in a descriptive sense only and not for purposes of limitation. Descriptions of features or aspects within each example embodiment should typically be considered as available for other similar features or aspects in other example embodiments.

As used herein, the terms "use", "using", and "used" may be considered synonymous with the terms "utilize", "utilizing", and "utilized", respectively. The use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical values.

While one or more example embodiments have been described with reference to the drawings, it will be understood by those of ordinary skill in the art that various changes in form and details may be made therein without departing from the spirit and scope as defined by the following claims and equivalents thereof.

What is claimed is:

1. An organic light-emitting device comprising:

a first electrode;

a second electrode facing the first electrode;

an emission layer between the first electrode and the second electrode, the emission layer including a first compound; and an electron transport region between the emission layer and the second electrode, the electron transport region comprising an electron transport layer including a second compound and an electron control layer including a third compound, wherein the electron control layer is between the emission layer and the electron transport layer, the first compound is selected from compounds represented by Formula 1, the second compound is selected from compounds represented by Formula 2, and the third compound is selected from the compounds represented by Formula 1 and the compounds represented by Formula 2:

Formula 1

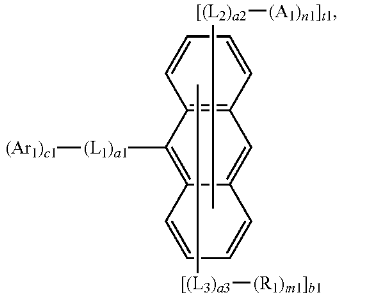

Formula 2

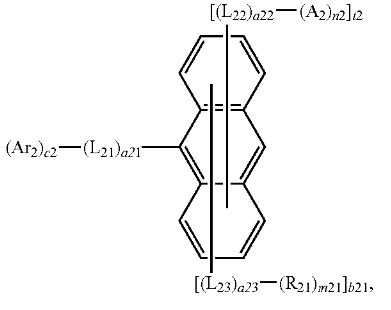

Formula 1-1(1)

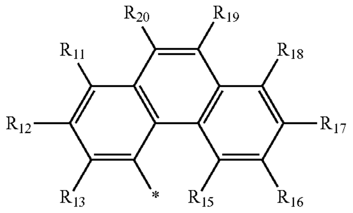

-continued

Formula 1-1(2)

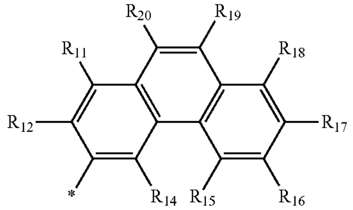

Formula 1-1(3)

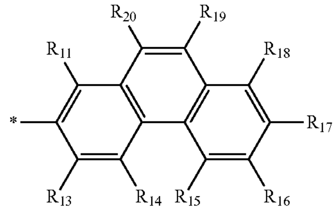

Formula 1-1(4)

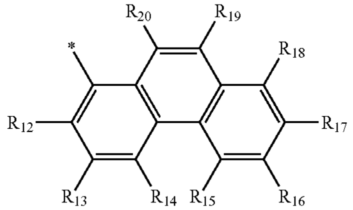

Formula 1-1(5)

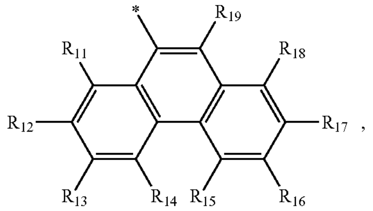

wherein, in Formulae 1, 1-1(1) to 1-1(5), and 2, $A_1$ is selected from groups represented by Formulae 1-1(1) to 1-1(5), n1 is 1, 2, or 3; and each $A_1$ moiety is independently selected when n 1 is 2 or greater, $A_2$ is selected from monovalent groups derived from compounds represented by Formulae 2-1-3 to 2-1-6, 2-1-8, 2-3-1, 2-3-2, 2-3-5, and 2-3-6:

Formula 2-1-3

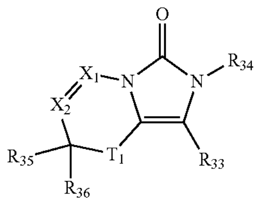

Formula 2-1-4

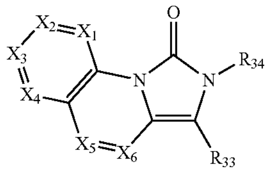

-continued

Formula 2-1-5

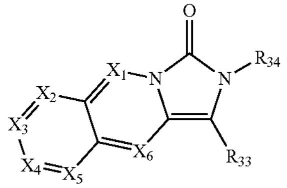

Formula 2-1-6

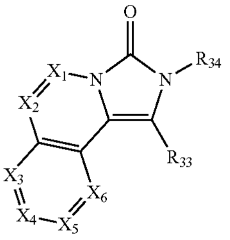

Formula 2-1-8

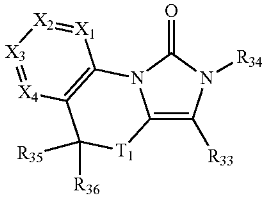

Formula 2-3-1

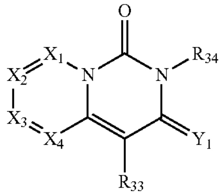

Formula 2-3-2

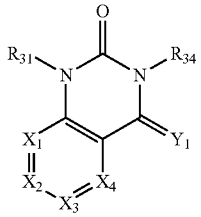

Formula 2-3-5

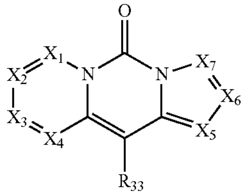

Formula 2-3-6

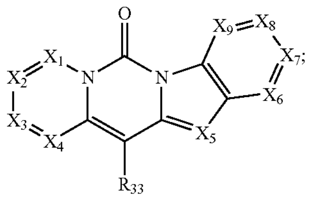

$T_1$ is selected from the group consisting of O and S;

$X_1$ is selected from the group consisting of N and $C(R_{51})$; $X_2$ is selected from the group consisting of N and $C(R_{52})$; $X_3$ is selected from the group consisting of N and $C(R_{53})$; $X_4$ is selected from the group consisting of N and $C(R_{54})$; $X_5$ is selected from the group consisting of N and $C(R_{55})$; $X_6$ is selected from the group consisting of N and $C(R_{56})$; $X_7$ is selected from the group consisting of N and $C(R_{57})$; $X_8$ is selected from the group consisting of N and $C(R_{58})$; $X_9$ is selected from the group consisting of N and $C(R_{59})$;

n2 is 1, 2 or 3; and each $A_2$ moiety is independently selected when n2 is 2 or greater, $L_1$ and $L_3$ are each independently selected from the group consisting of a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, a benzothiazolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, a benzothiazolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, $L_2$ is selected from the group consisting of a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, a benzothiazolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, a benzothiazolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, $L_{21}$ to $L_{23}$ are each independently selected from the group consisting of a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a2 is selected from 1, 2, and 3;

a1, a3, and a21 to a23 are each independently selected from 0, 1, 2, and 3; each $L_1$ moiety is independently selected when a1 is 2 or greater; each $L_2$ moiety is independently selected when a2 is 2 or greater; each $L_3$ moiety is independently selected when a3 is 2 or greater; each $L_{21}$ moiety is independently selected when a21 is 2 or greater; each $L_{22}$ moiety is independently selected when a22 is 2 or greater; and each $L_{23}$ moiety is independently selected when a23 is 2 or greater, $Ar_1$ is selected from the group consisting of a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group, and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, an imidazopyrimidinyl group, and —$Si(Q_{31})(Q_{32})(Q_{33})$, $Ar_2$ is selected from the group consisting of a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, c1 and c2 are each independently selected from 1, 2, and 3; each $Ar_1$ moiety is independently selected when c1 is 2 or greater; and each $Ar_2$ moiety is independently selected when c2 is 2 or greater, $Y_1$ is selected from the group consisting of $N(R_{41})$ and $C(R_{42})(R_{43})$, and $R_1$ is selected from the group consisting of hydrogen, deuterium, —F, —Cl, —Br, —I, a hydroxyl group, a cyano group, a nitro group, an amino group, an amidino group, a hydrazine group, a hydrazone group, a $C_1$-$C_{20}$ alkyl group, and a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group, and a dibenzocarbazolyl group, and a phenyl group, a biphenyl group, a terphenyl group, a naphthyl group, a fluorenyl group, a spiro-fluorenyl group, a benzofluorenyl group, a dibenzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group, and a dibenzocarbazolyl group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group, a dibenzocarbazolyl group, and —$Si(Q_{31})(Q_{32})(Q_{33})$, $R_{11}$ to $R_{20}$, $R_{21}$, $R_{31}$ to $R_{36}$, $R_{41}$ to $R_{43}$, and $R_{51}$ to $R_{59}$ are each independently selected from the group consisting of hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —$Si(Q_1)(Q_2)(Q_3)$, in Formulae 2-1-2 to 2-1-6, 2-1-8, and 2-1-3 to 2-1-6, at least two selected from $R_{31}$ to $R_{36}$ and $R_{51}$ to $R_{59}$ are optionally linked to each other to form a substituted or unsubstituted $C_5$-$C_{30}$ carbocyclic group, or a substituted or unsubstituted $C_2$-$C_{30}$ heterocyclic group;

m1 and m21 are each independently selected from 0, 1, 2, and 3; each $R_1$ moiety is independently selected when m 1 is 2 or greater; and each $R_{21}$ moiety is independently selected when m21 is 2 or greater, b1 and b21 are each independently an integer selected from 0 to 8, t1 and t2 are each independently selected from 1, 2, and 3, and at least one substituent of the substituted $C_5$-$C_{30}$ carbocyclic group, the substituted $C_2$-$C_{30}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, a substituted divalent non-aromatic condensed polycyclic group, a substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —B($Q_{14}$)($Q_{15}$), and —N($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —B($Q_{24}$)($Q_{25}$), and —N($Q_{26}$)($Q_{27}$), and —Si($Q_{31}$)($Q_{32}$)($Q_{33}$), —B($Q_{34}$)($Q_{35}$), and —N($Q_{36}$)($Q_{37}$), where $Q_1$ to $Q_3$, $Q_{11}$ to $Q_{17}$, $Q_{21}$ to $Q_{27}$ and $Q_{31}$ to $Q_{37}$ are each independently selected from the group consisting of hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting device of claim 1, wherein $L_1$, $L_3$ and $L_{21}$ to $L_{23}$ are each independently selected from groups represented by Formulae 3-1 to 3-18, and $L_2$ is selected from groups represented by Formulae 3-1 to 3-6, 3-8 to 3-14, 3-16, and 3-18:

Formula 3-1

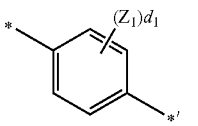

Formula 3-2

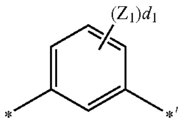

Formula 3-3

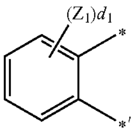

Formula 3-4

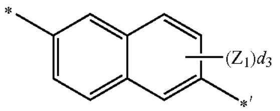

Formula 3-5

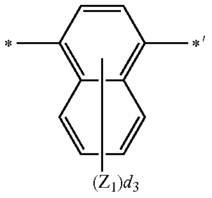

Formula 3-6

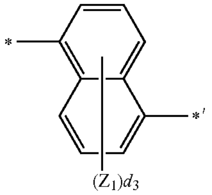

Formula 3-7

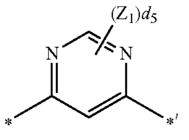

Formula 3-8

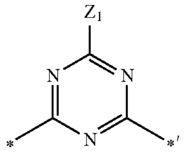

Formula 3-9

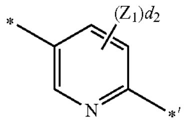

Formula 3-10

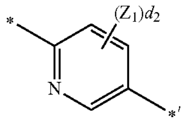

Formula 3-11

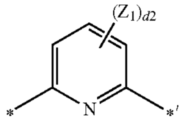

Formula 3-12

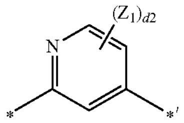

Formula 3-13

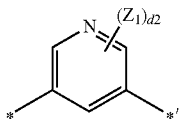

Formula 3-14

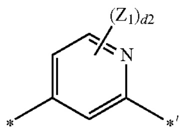

Formula 3-15

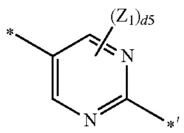

Formula 3-16

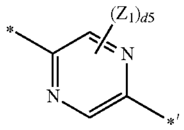

Formula 3-17

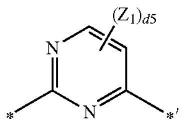

Formula 3-18

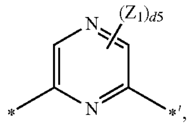

wherein, in Formulae 3-1 to 3-18, $Z_1$ is selected from the group consisting of hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

d1 is an integer selected from 1 to 4;

d2 is an integer selected from 1 to 3;

d3 is an integer selected from 1 to 6;

d5 is an integer selected from 1 and 2; and

* and *' are each a binding site with an adjacent atom.

3. The organic light-emitting device of claim 1, wherein $L_1$, $L_3$ and $L_{21}$ to $L_{23}$ are each independently selected from groups represented by Formulae 4-1 to 4-15, and $L_2$ is selected from groups represented by Formulae 4-1 to 4-12 and 4-15:

Formula 4-1

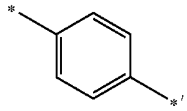

Formula 4-2

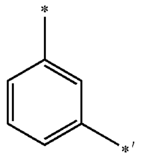

Formula 4-3

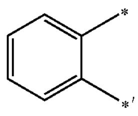

Formula 4-4

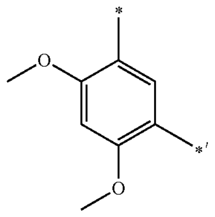

-continued

Formula 4-5

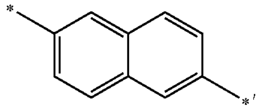

Formula 4-6

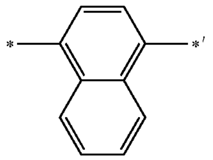

Formula 4-7

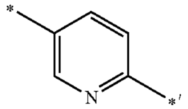

Formula 4-8

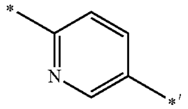

Formula 4-9

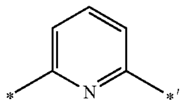

Formula 4-10

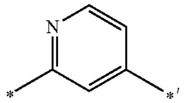

Formula 4-11

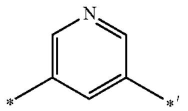

Formula 4-12

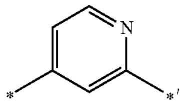

Formula 4-13

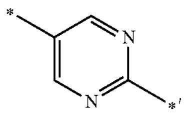

Formula 4-14

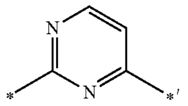

Formula 4-15

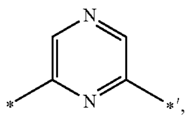

wherein, in Formulae 4-1 to 4-15, * and *' are each a binding site with an adjacent atom.

4. The organic light-emitting device of claim 1, wherein $Ar_2$ is selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group, and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, an imidazopyrimidinyl group, and —$Si(Q_{31})(Q_{32})(Q_{33})$, where $Q_{31}$ to $Q_{33}$ are each independently selected from the group consisting of hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

5. The organic light-emitting device of claim 1, wherein $Ar_1$ and $Ar_2$ are each independently selected from groups represented by Formulae 5-1 to 5-7:

Formula 5-1

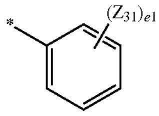

-continued

Formula 5-2

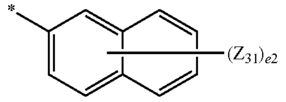

Formula 5-3

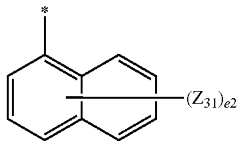

Formula 5-4

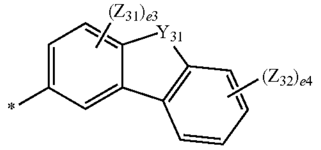

Formula 5-5

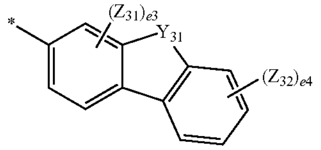

Formula 5-6

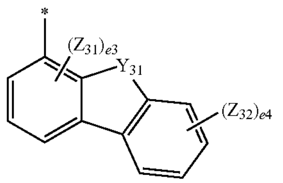

Formula 5-7

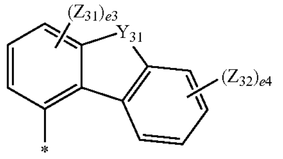

, wherein, in Formulae 5-1 to 5-7, $Y_{31}$ is selected from the group consisting of O, S, $C(Z_{33})(Z_{34})$, and $N(Z_{35})$;

$Z_{31}$ to $Z_{35}$ are each independently selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof and a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group, and —$Si(Q_{31})(Q_{32})(Q_{33})$, where $Q_{31}$ to $Q_{33}$ are each independently selected from the group consisting of hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group, e1 is an integer selected from 1 to 5;

e2 is an integer selected from 1 to 7;

e3 is an integer selected from 1 to 3;

e4 is an integer selected from 1 to 4; and

* is a binding site with an adjacent atom.

6. The organic light-emitting device of claim 1, wherein $Ar_1$ and $Ar_2$ are each independently selected from groups represented by Formulae 6-1 to 6-11:

Formula 6-1

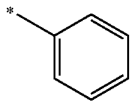

Formula 6-2

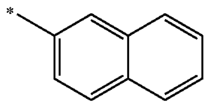

Formula 6-3

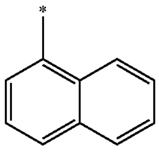

Formula 6-4

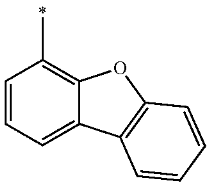

-continued

Formula 6-5

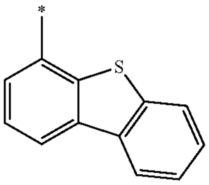

Formula 6-6

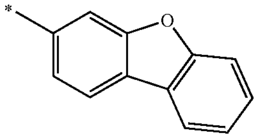

Formula 6-7

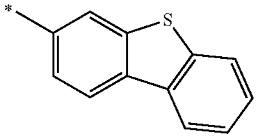

Formula 6-8

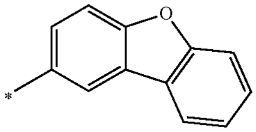

Formula 6-9

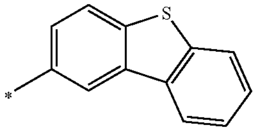

Formula 6-10

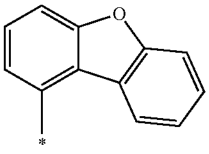

Formula 6-11

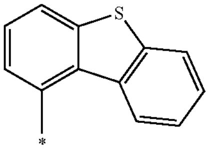

, wherein, in Formulae 6-1 to 6-11, * is a binding site with an adjacent atom.

7. The organic light-emitting device of claim 1, wherein $R_{11}$ to $R_{20}$, $R_{21}$, $R_{31}$ to $R_{34}$, and $R_{41}$ to $R_{43}$ are each independently selected from the group consisting of:

hydrogen, deuterium, —F, —Cl, —Br, —I, a hydroxyl group, a cyano group, a nitro group, an amino group, an amidino group, a hydrazine group, a hydrazone group, a $C_1$-$C_{20}$ alkyl group, and a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group, and a dibenzocarbazolyl group, and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group, and a dibenzocarbazolyl group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group, a dibenzocarbazolyl group, and —$Si(Q_{31})(Q_{32})(Q_{33})$, where $Q_{31}$ to $Q_{33}$ are each independently selected from the group consisting of hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

8. The organic light-emitting device of claim 1, wherein $R_1$, $R_{11}$ to $R_{20}$, $R_{21}$, $R_{31}$ to $R_{34}$, and $R_{41}$ to $R_{43}$ are each independently selected from the group consisting of hydrogen, deuterium, —F, —Cl, —Br, —I, a methyl group, an ethyl group, a propyl group, an iso-propyl group, a butyl group, an iso-butyl group, a sec-butyl group, a tert-butyl group, a methoxy group, an ethoxy group, an iso-propoxy group, a butoxy group, an iso-butoxy group, a sec-butoxy group, a tert-butoxy group, and groups represented by Formulae 7-1 to 7-15:

Formula 7-1

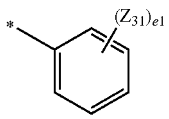

Formula 7-2

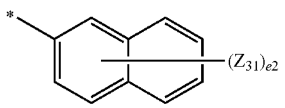

-continued

Formula 7-3

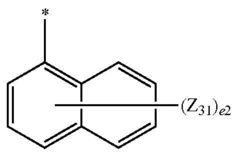

Formula 7-4

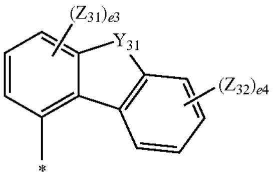

Formula 7-5

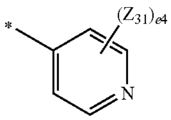

Formula 7-6

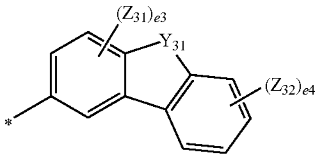

Formula 7-7

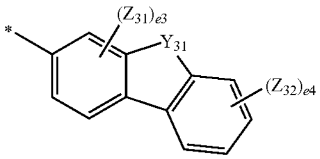

Formula 7-8

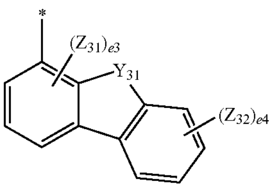

Formula 7-9

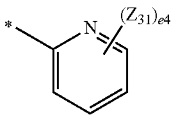

Formula 7-10

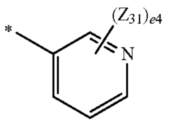

Formula 7-11

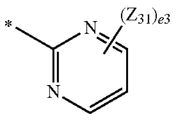

Formula 7-12

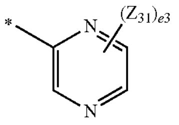

-continued

Formula 7-13

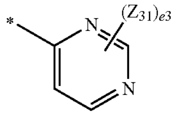

Formula 7-14

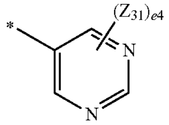

Formula 7-15

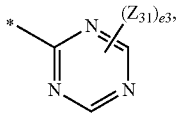

wherein, in Formulae 7-1 to 7-15, $Y_{31}$ is selected from the group consisting of O, S, $C(Z_{33})(Z_{34})$, and $N(Z_{35})$;

$Z_{31}$ to $Z_{35}$ are each independently selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof and a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, each substituted with at least one selected from the group consisting of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group, and $—Si(Q_{31})(Q_{32})(Q_{33})$, where $Q_{31}$ to $Q_{33}$ are each independently selected from the group consisting of hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group;

e1 is an integer selected from 1 to 5;

e2 is an integer selected from 1 to 7;

e3 is an integer selected from 1 to 3;

e4 is an integer selected from 1 to 4;

e5 is an integer selected from 1 and 2; and

* is a binding site with an adjacent atom.

9. The organic light-emitting device of claim 1, wherein $R_1$, $R_{11}$ to $R_{20}$, $R_{21}$, $R_{31}$ to $R_{34}$, and $R_{41}$ to $R_{43}$ are each independently selected from the group consisting of hydrogen, deuterium, —F, —Cl, —Br, —I, a methyl group, an ethyl group, a propyl group, an iso-propyl group, a butyl group, an iso-butyl group, a sec-butyl group, a tert-butyl group, a methoxy group, an ethoxy group, an iso-propoxy group, a butoxy group, an iso-butoxy group, a sec-butoxy group, a tert-butoxy group, and groups represented by Formulae 8-1 to 8-22:

Formula 8-1

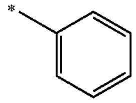

Formula 8-2

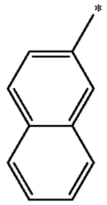

Formula 8-3

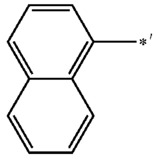

Formula 8-4

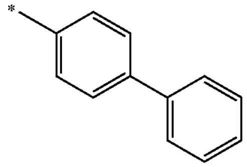

Formula 8-5

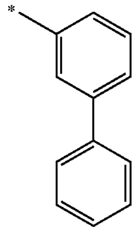

-continued

Formula 8-6

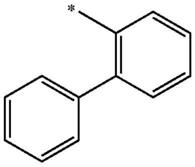

Formula 8-7

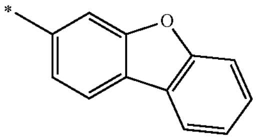

Formula 8-8

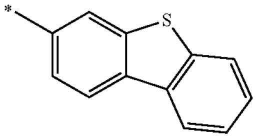

Formula 8-9

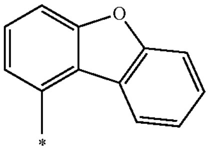

Formula 8-10

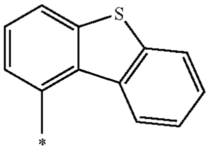

Formula 8-11

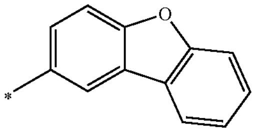

Formula 8-12

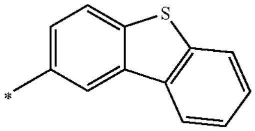

Formula 8-13

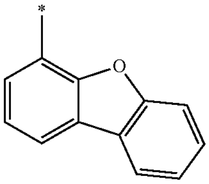

Formula 8-14

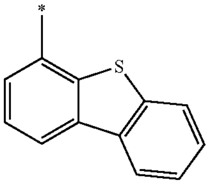

Formula 8-15

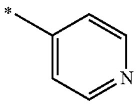

-continued

Formula 8-16

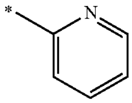

Formula 8-17

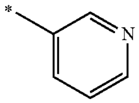

Formula 8-18

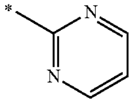

Formula 8-19

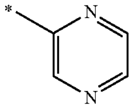

Formula 8-20

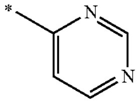

Formula 8-21

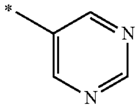

Formula 8-22

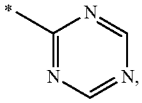

wherein, in Formulae 8-1 to 8-22, * is a binding site with an adjacent atom.

10. The organic light-emitting device of claim 1, wherein the first compound is a compound represented by Formula 11, the second compound is selected from compounds represented by Formulae 12-1 and 12-2, and the third compound is selected from compounds represented by Formulae 11, 12-1, and 12-2:

Formula 11

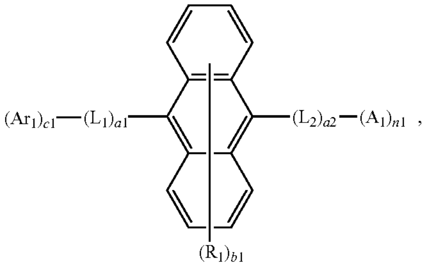

-continued

Formula 12-1

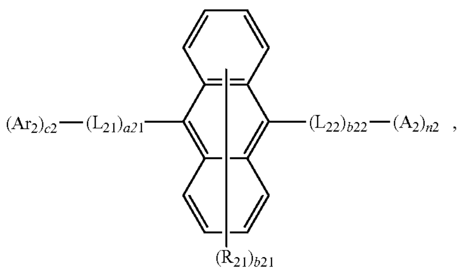

Formula 12-2

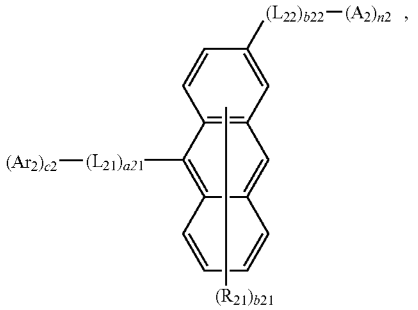

wherein, in Formulae 12-1 and 12-2, b22 is 0, 1, 2, or 3.

11. The organic light-emitting device of claim 1, wherein the first compound is selected from compounds represented by Formulae 11A to 11D, And the third compound is selected from compounds represented by Formulae 11A to 11D:

Formula 11A

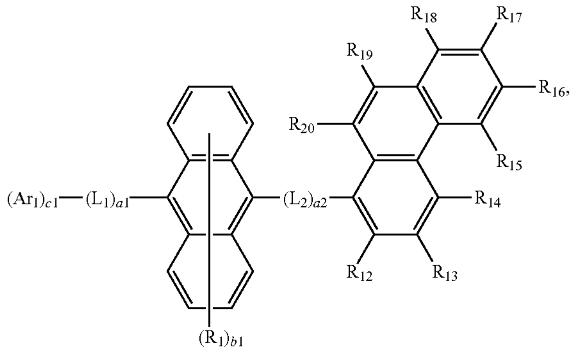

-continued

Formula 11B

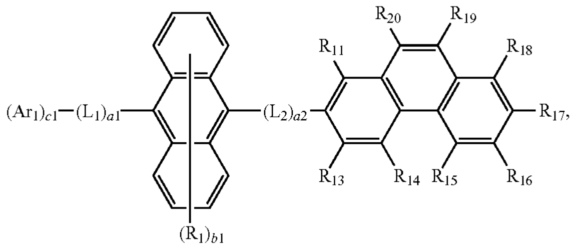

Formula 11C

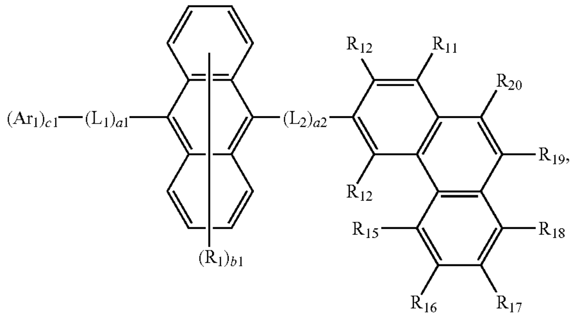

Formula 11D

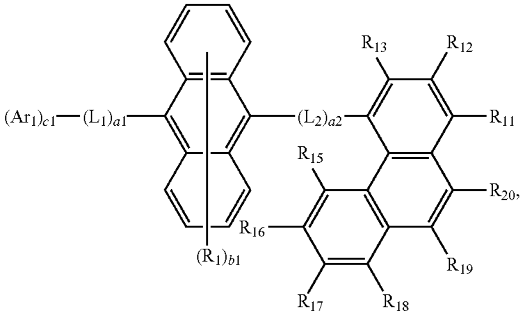

wherein, in Formulae 11A, 11B, and 11D, a2 is selected from 0, 1, 2, and 3, in Formula 11C, a2 is selected from 1, 2, and 3.

12. The organic light-emitting device of claim 1, wherein the first compound is selected from Compounds 1-1 to 1-60, and the third compound is selected from Compounds 1-1 to 1-60 and compounds represented by Formula 2:

1-1

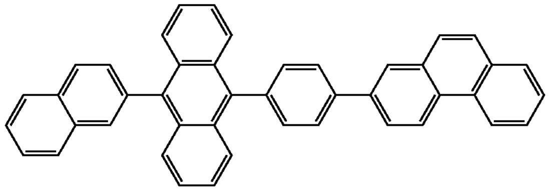

1-2

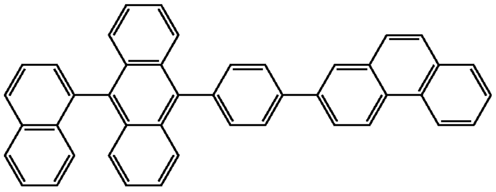

-continued
1-3
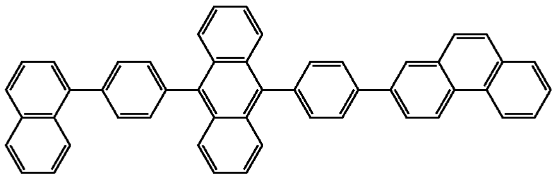
1-4
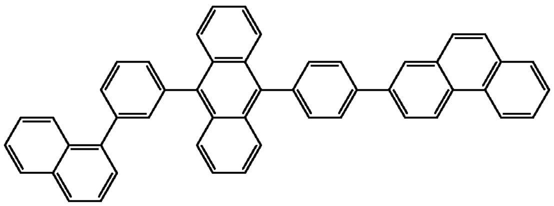
1-5
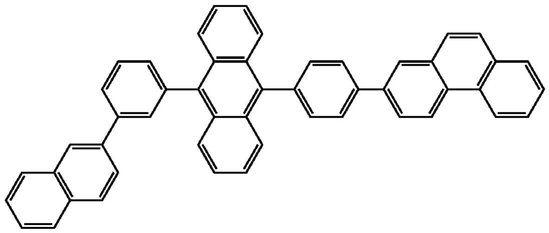
1-6
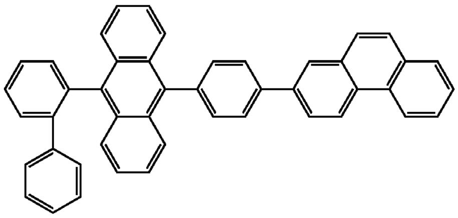
1-7
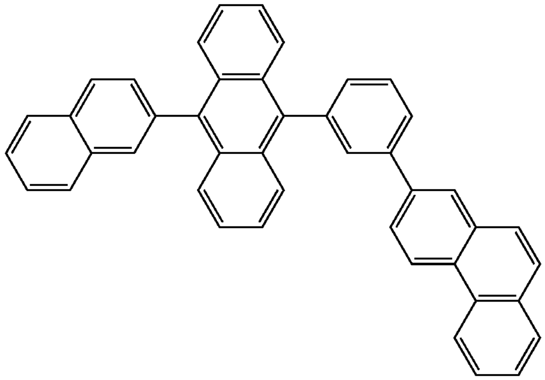
1-8
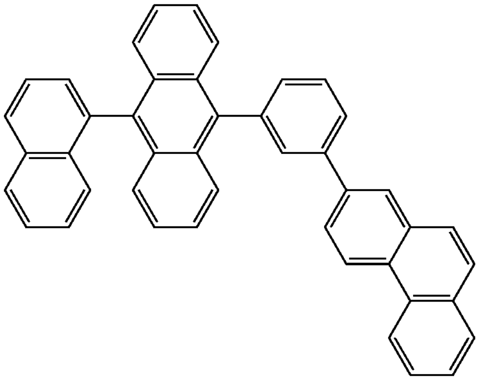
I-9
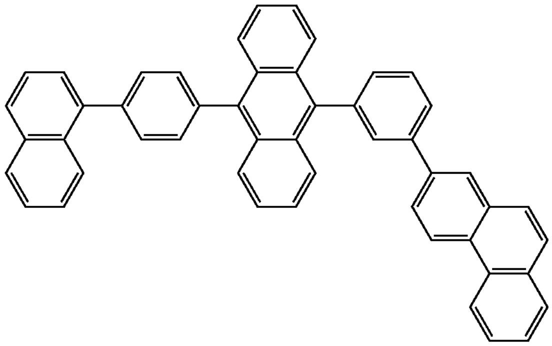
I-10
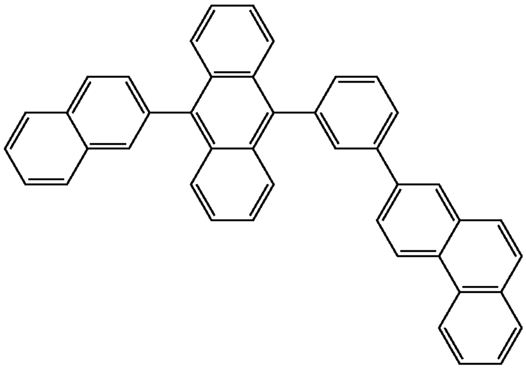
I-11
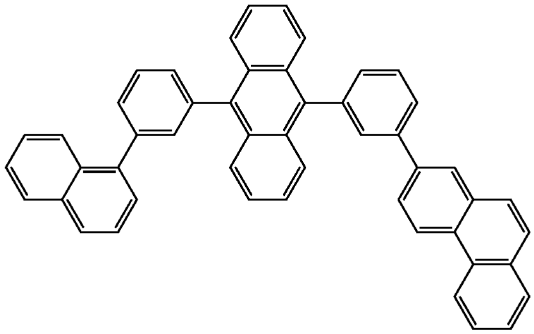
I-12
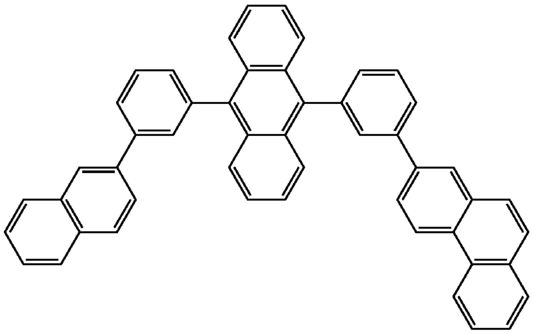

-continued
I-13
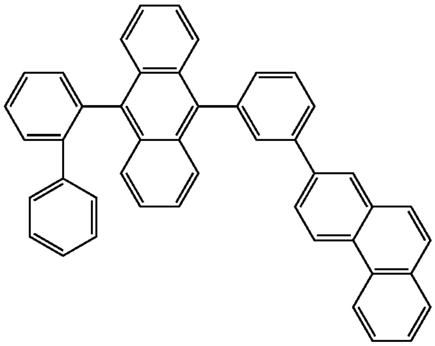
I-14
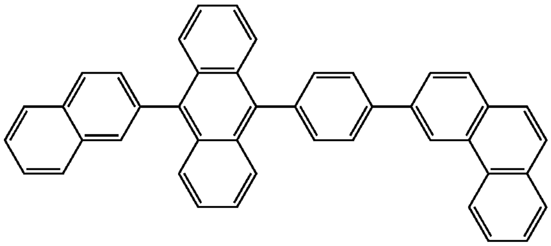
I-15
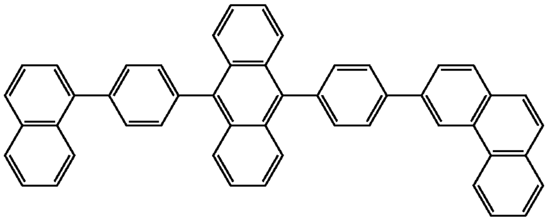
I-16
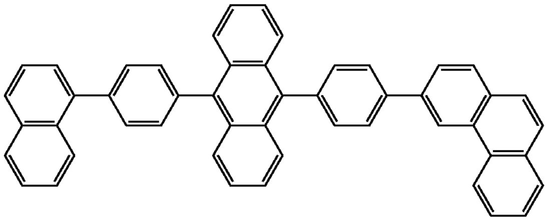
I-17
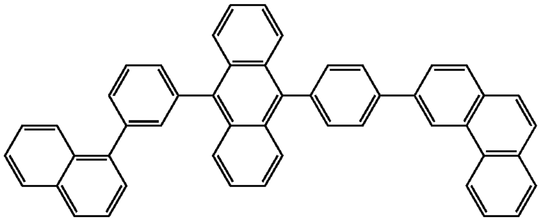
I-18
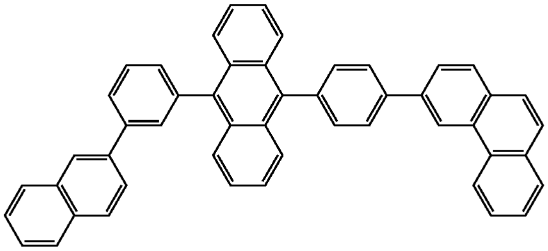
I-19
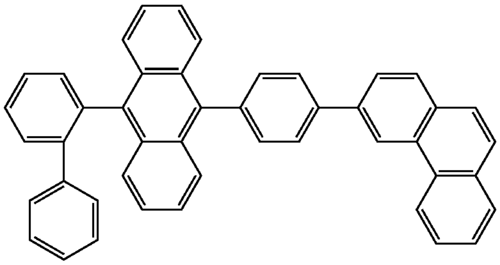
I-20
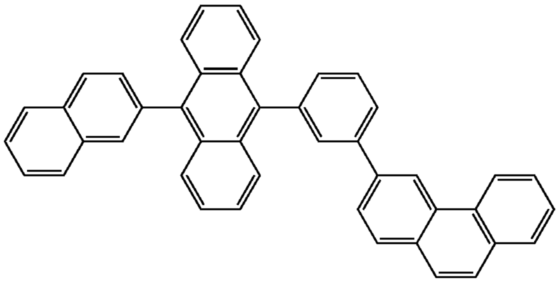
I-21
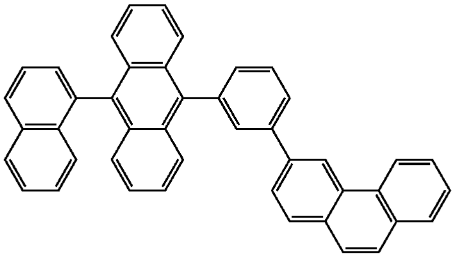
I-22
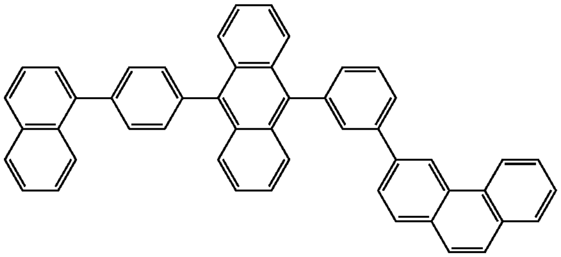

-continued
I-23
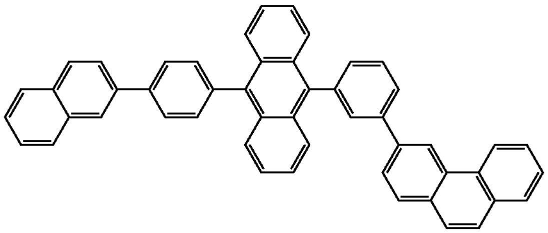
I-24
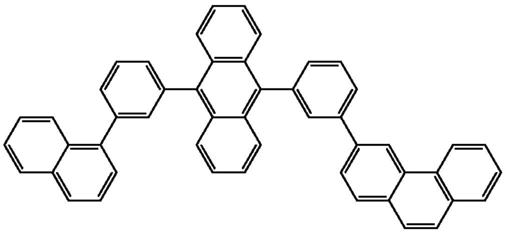
I-25
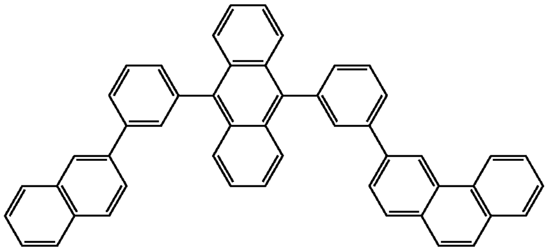
I-26
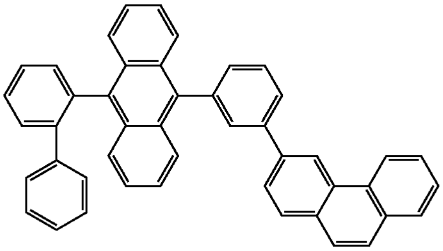
I-27
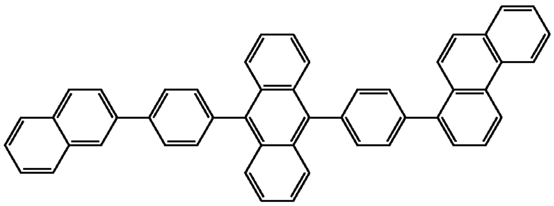
I-28
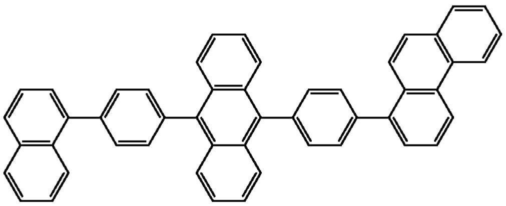
I-29
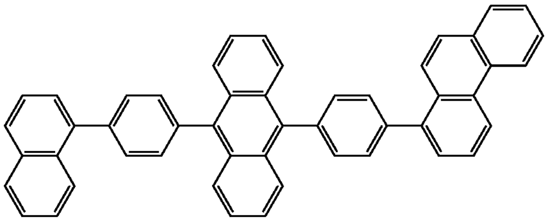
I-30
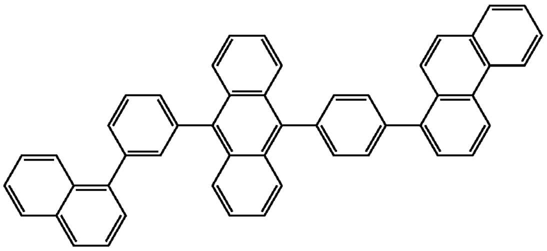
I-31
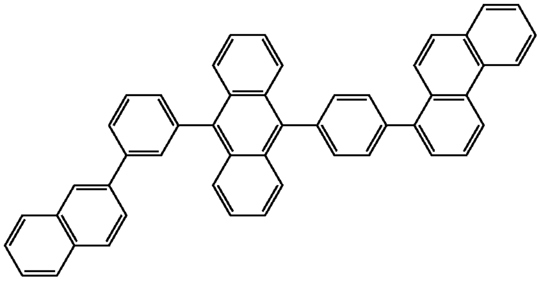
I-32
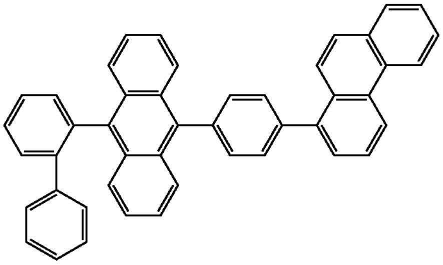
I-33
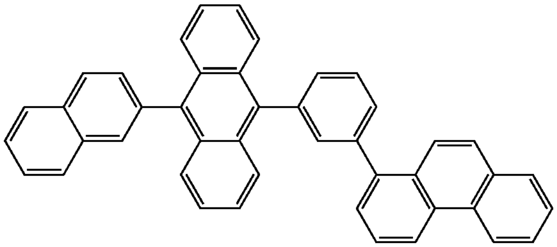
I-34
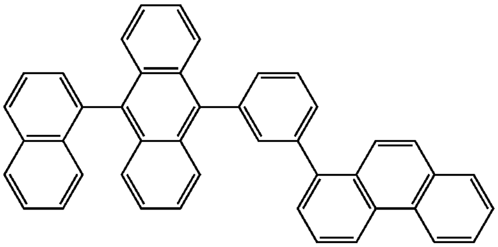

-continued
I-35
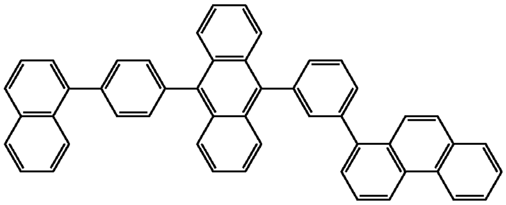
I-36
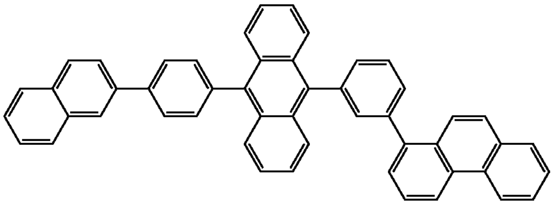
I-37
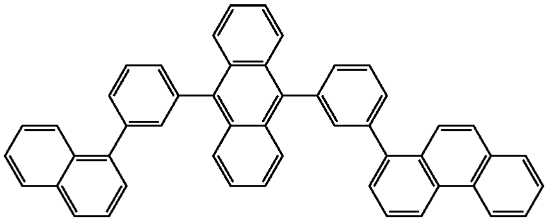
I-38
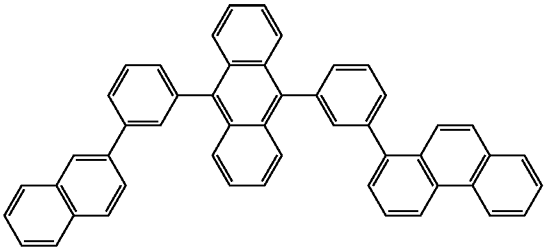
I-39
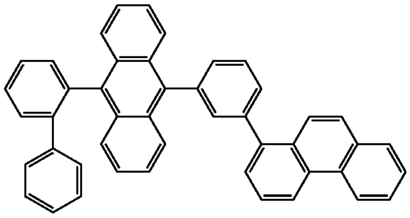
I-40
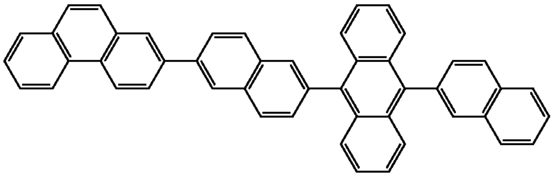
I-41
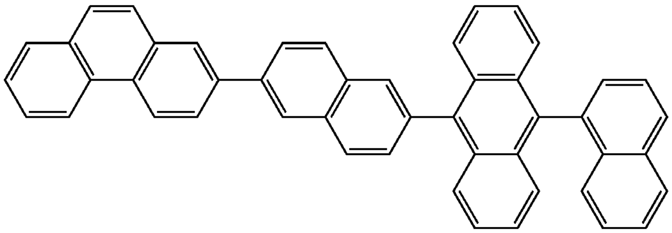
I-42
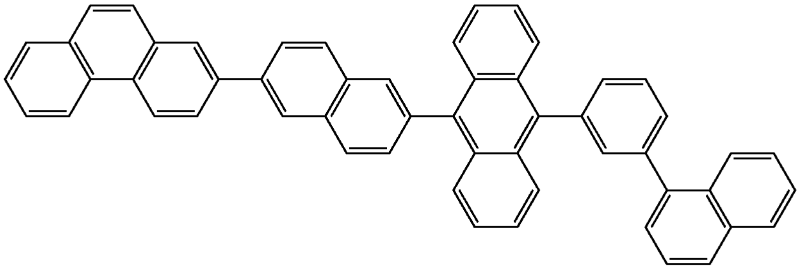
I-43
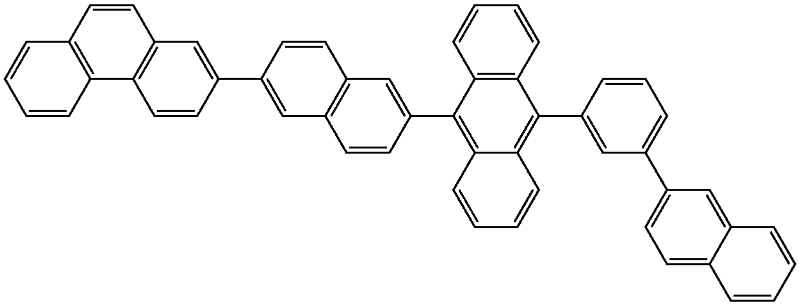

-continued
I-44
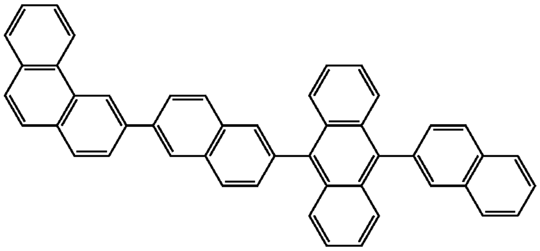
I-45
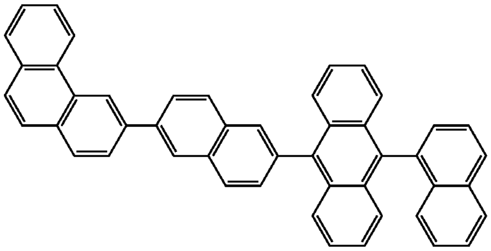
I-46
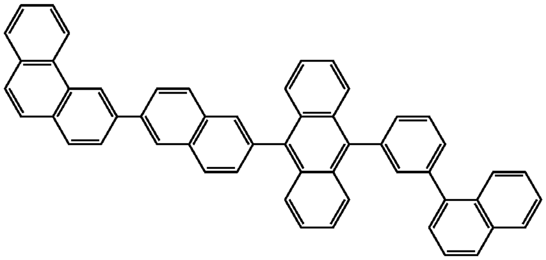
I-47
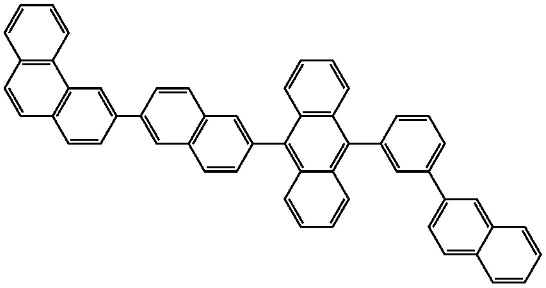
I-48
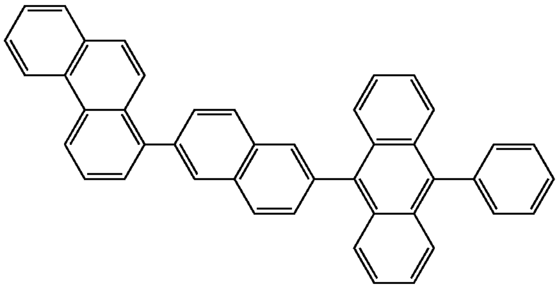
I-49
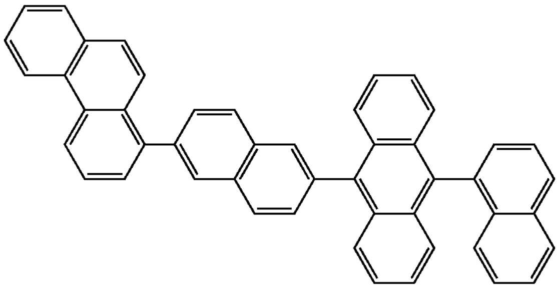
I-50
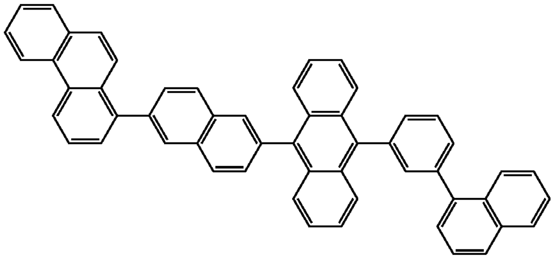
I-51
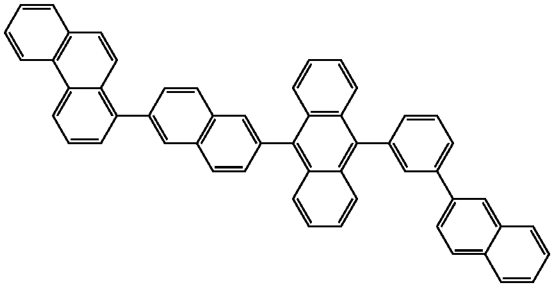
I-52
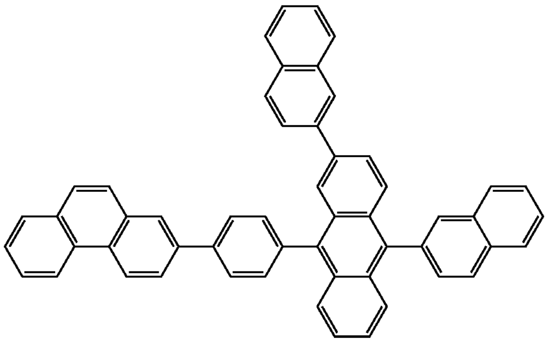
I-53
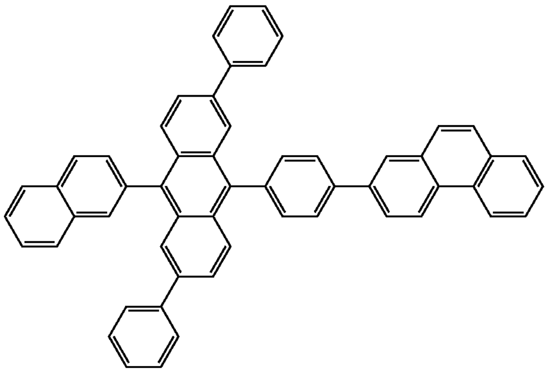

-continued

I-54

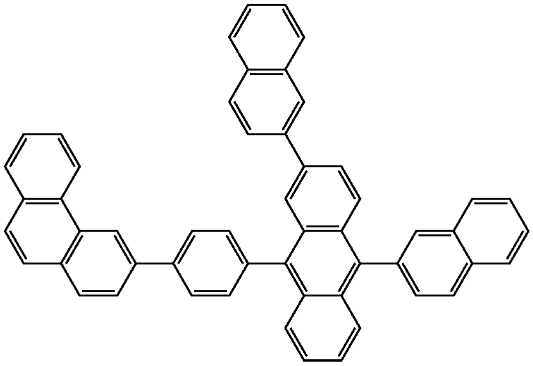

I-55

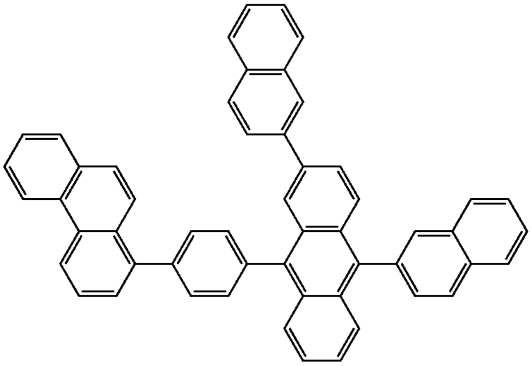

I-56

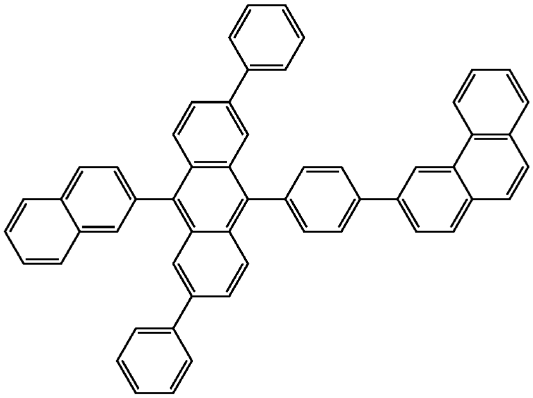

I-57

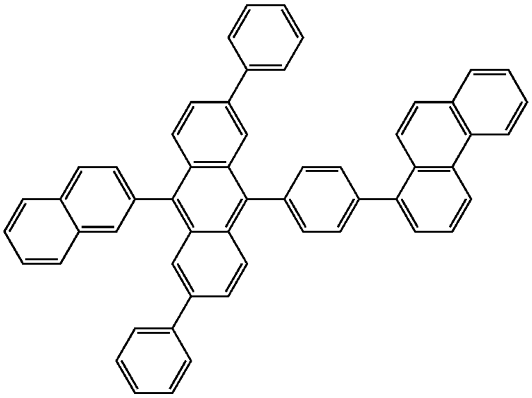

I-58

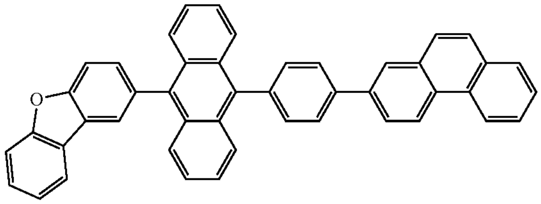

I-59

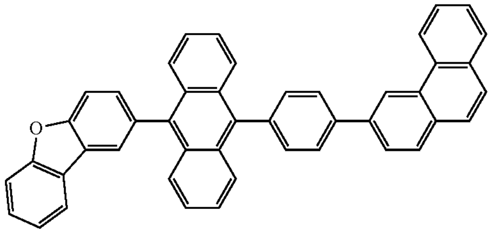

I-60

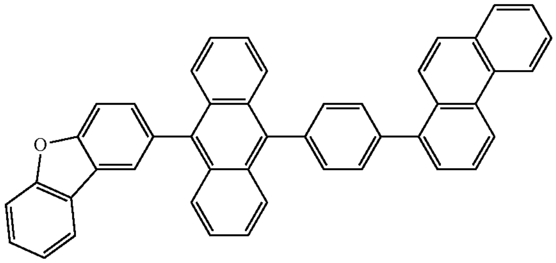

.

13. The organic light-emitting device of claim 1, wherein the first compound and the third compound are the same.

14. The organic light-emitting device of claim 1, wherein the second compound and the third compound are the same.

15. The organic light-emitting device of claim 1, wherein the electron transport layer further includes a Li complex.

16. The organic light-emitting device of claim 1, wherein the electron control layer and the emission layer directly contact each other, and the electron transport region further comprises an electron injection layer between the electron transport layer and the second electrode.

17. An organic light-emitting device comprising:

a first electrode;

a second electrode facing the first electrode;

an emission layer between the first electrode and the second electrode, the emission layer including a first compound; and an electron transport region between the emission layer and the second electrode, the electron transport region comprising an electron transport layer including a second compound and an electron control layer including a third compound, wherein the electron control layer is between the emission layer and the electron transport layer, the first and third compounds are simultaneously Compound 1-1 and the second compound is Compound 2-1, 2-6, or 2-13, or the second and third compounds are simultaneously Compound 2-1 and the first compound is Compound 1-1, 1-61, or 1-75:

1-1

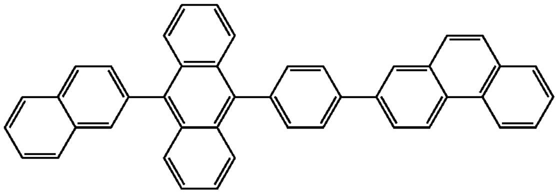

1-61

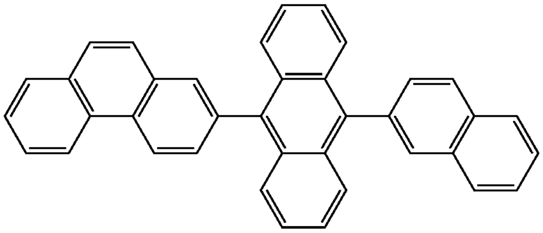

1-75

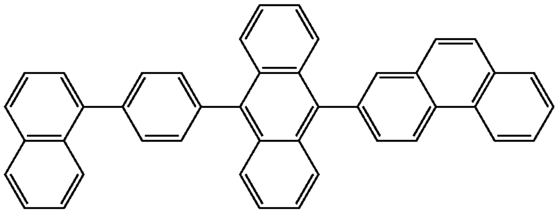

-continued 2-1

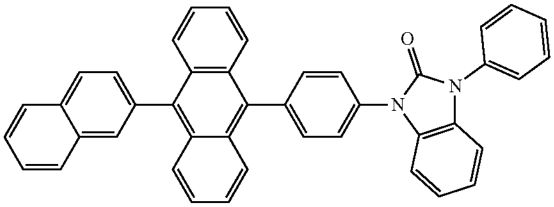

2-4

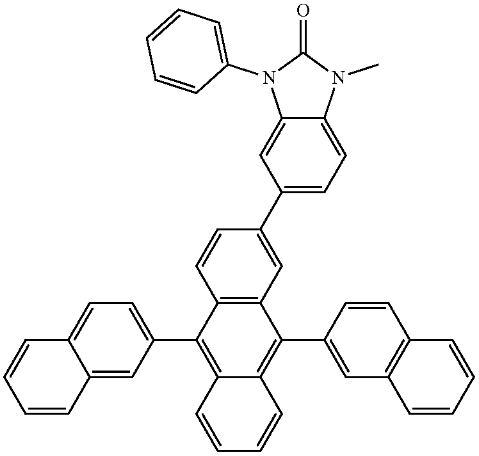

2-6

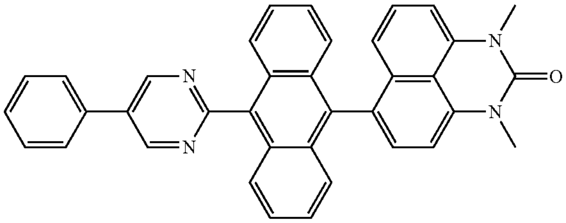

2-13

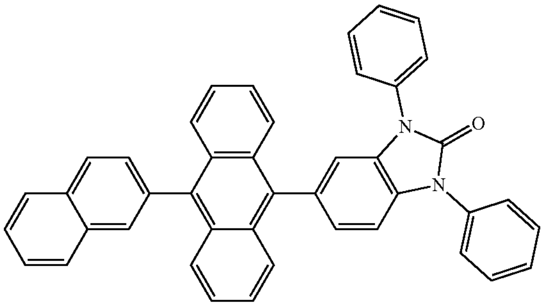

.

* * * * *